(12) United States Patent
Ganor et al.

(10) Patent No.: US 6,979,936 B1
(45) Date of Patent: Dec. 27, 2005

(54) PIEZOELECTRIC MOTORS AND MOTOR DRIVING CONFIGURATIONS

(75) Inventors: Ze'ev Ganor, Herzella (IL); Lior Shiv, Hilleroda (DK); Nir Karasikov, Haifa (IL); Alon Avital, Haifa (IL)

(73) Assignee: Nanomotion Ltd., Yokneam (IL)

( * ) Notice: Subject to any disclaimer, the term of this patent is extended or adjusted under 35 U.S.C. 154(b) by 0 days.

(21) Appl. No.: 10/129,256

(22) PCT Filed: Oct. 31, 2000

(86) PCT No.: PCT/IL00/00698

§ 371 (c)(1),
(2), (4) Date: Oct. 7, 2002

(87) PCT Pub. No.: WO01/33645

PCT Pub. Date: May 10, 2001

(30) Foreign Application Priority Data

Oct. 31, 1999 (WO) .................. PCT/IL99/00576
Jul. 6, 2000 (IL) ................... 137206

(51) Int. Cl.⁷ .................. H02N 2/00; H01L 41/08
(52) U.S. Cl. ........... 310/328; 323/323.01; 323/323.02; 323/367
(58) Field of Search ............ 310/323.01–323.03, 310/323.06, 323.09, 323.14, 328, 367

(56) References Cited

U.S. PATENT DOCUMENTS

| | | | |
|---|---|---|---|
| 2,485,722 A * | 10/1949 | Erwin | 310/360 |
| 3,076,903 A * | 2/1963 | Schwartz | 310/330 |
| 3,696,259 A * | 10/1972 | Mori et al. | 310/323.01 |
| 3,738,574 A | 6/1973 | Guntersdorfer et al. | 239/102.2 |
| 3,748,504 A | 7/1973 | Guntersdorfer et al. | 310/331 |
| 3,793,723 A | 2/1974 | Kuris et al. | 30/45 |
| 4,349,183 A * | 9/1982 | Wirt et al. | 267/160 |
| 4,914,816 A | 4/1990 | Fenn et al. | 30/45 |
| 5,007,169 A | 4/1991 | Motta | 30/45 |
| 5,135,312 A * | 8/1992 | Blake | 374/117 |
| 5,216,313 A * | 6/1993 | Ohinishi et al. | 310/323.16 |
| 5,299,354 A | 4/1994 | Metcalf et al. | 30/45 |
| 5,523,643 A * | 6/1996 | Fujimura et al. | 310/328 |
| 5,616,980 A | 4/1997 | Zumeris | 310/323.16 |
| 5,777,423 A | 7/1998 | Zumeris | 310/311.01 |
| 5,794,342 A | 8/1998 | Davey | 30/45 |
| 5,847,487 A * | 12/1998 | Maeno | 310/321 |
| 6,121,717 A | 9/2000 | Diefenbach et al. | 310/323.02 |
| 6,201,339 B1 * | 3/2001 | Tani et al. | 310/328 |

(Continued)

FOREIGN PATENT DOCUMENTS

DE         196 21 215         11/1997 ........... B26B 21/38

(Continued)

OTHER PUBLICATIONS

Patent Abstracts of Japan; vol. 013; No. 298 (E-784), Jul. 10, 1989 & JP 01 077486; Mar. 23, 1989.

*Primary Examiner*—Thomas M. Dougherty
(74) *Attorney, Agent, or Firm*—Fenster & Company

(57) ABSTRACT

A piezoelectric motor comprising: a layer of piezoelectric material having narrow edge surfaces and first and second large face surfaces, formed with at least three arms, each extending radially outward from a common central region and terminating in an end; and at least one electrode on the first face surface and at least one electrode on the second face surface.

51 Claims, 34 Drawing Sheets

U.S. PATENT DOCUMENTS 6,346,765 B1 * 2/2002 Kikuchi et al. ............. 310/367

FOREIGN PATENT DOCUMENTS

| | | | |
|---|---|---|---|
| DE | 197 57 139 | 6/1999 | ........... B06B 1/06 |
| EP | 0 521 713 | 1/1993 | ........... G03F 7/00 |
| EP | 0 691 692 | 1/1996 | ........... H01L 41/09 |
| EP | 0 924 778 | 6/1999 | ........... H01L 41/09 |
| WO | WO 99/31740 | 6/1999 | ........... H01L 41/09 |
| WO | WO 00/25369 | 5/2000 | ........... H01L 41/04 |
| WO | WO 00/74153 | 12/2000 | ........... H01L 41/09 |
| WO | WO 01/63679 | 8/2001 | ........... H01L 41/09 |

* cited by examiner

PIEZOELECTRIC MOTORS AND MOTOR DRIVING CONFIGURATIONS

RELATED APPLICATIONS

The present application is a U.S. national application of PCT/IL00/00698, filed Oct. 31, 2000.

FIELD OF THE INVENTION

The invention relates to piezoelectric motors and in particular to powering electric shavers with piezoelectric motors.

BACKGROUND OF THE INVENTION

The electric shaver invented by an American, Colonel Jacob Schick, in 1928 is one of the most ubiquitous personal hygiene and cosmetic accessories in today's world. It is a small hand held appliance generally comprising a plurality of closely spaced cutting blades having cutting edges for cutting facial or body hair. The blades are mounted or formed on at least one blade support structure, hereinafter referred to as a "blade head". A small electric motor is coupled to the at least one blade head and moves the at least one blade head to impart rapid rotary or linear oscillatory motion or non-oscillatory rotary motion to the cutting blades. The blade head is mounted in the shaver so that the cutting edges of the cutting blades are located behind a thin perforated guard plate, generally referred to in the art as a "foil". The foil is pressed to and moved back and forth along a region of skin to be shaved. Hairs on the region of skin poke through the perforations in the foil as it moves over the skin and are cut off by the cutting edges of the rapidly moving cutting blades.

Many companies, among them many international companies whose names are common household names are involved in the development, manufacture and marketing of electric shavers. There is constant ongoing effort by these companies to produce a better electric shaver that gives a better shave at a lower price.

SUMMARY OF THE INVENTION

An aspect of some embodiments of the present invention relates to providing an improved shaver in which cutting blades comprised in the shaver are moved by at least one piezoelectric motor.

The cutting blades are mounted on at least one blade head that is formed with or mechanically coupled to a surface, hereinafter referred to as a "coupling surface", to which a surface region, hereinafter referred to as a "motor coupling surface", of at least one piezoelectric motor is pressed. When the piezoelectric motor is turned on, vibrations excited in the motor coupling surface of the piezoelectric motor transmit motion to the coupling surface and thereby to the cutting blades. Optionally, the surface region of the piezoelectric motor is a surface of "friction" nub formed from a hard wear resistant material such as Alumina, stainless steel or a wear resistant high impact plastic such as PEEK (polyethyl ethyl ketone), that is attached to the piezoelectric vibrator. Optionally, the at least one piezoelectric motor is of a type or similar to a type described in U.S. Pat. No. 5,616,980 to Zumeris et al, or in PCT Application PCT/IL99/00288 entitled "Multilayer Piezoelectric Motor", the disclosures of which are incorporated herein by reference. Piezoelectric motors described in the referenced patents and PCT application comprise a relatively thin rectangular piezoelectric vibrator having large parallel face surfaces and narrow short and long edge surfaces. A surface region of a short edge of the vibrator or a surface of a friction nub on a short edge of the vibrator functions as a motor coupling surface. Electrodes on the face surfaces of the vibrator, or on face surfaces of layers of the vibrator for piezoelectric motors described in PCT/IL99/00288, are electrified to excite vibrations in the vibrator and thereby in the motor coupling surface. Generally, two orthogonal resonant vibration modes, a longitudinal vibration mode and a transverse vibration mode, are excited in the vibrator to provide vibrations in the motor coupling surface. The longitudinal and transverse vibration modes generate vibrations in the motor coupling surface that are respectively parallel to the long and short edges of the vibrator. In some piezoelectric motors of a type described in the referenced patent and application, a motor coupling surface is located on a long edge surface of the vibrator and/or more than one motor coupling surface is located on an edge surface or surfaces of the vibrator. The motors are mechanically simple, compact, robust motors that for a given power requirement, can generally be made smaller than conventional electric motors such as those used for electric shavers.

In some embodiments of the present invention, the efficiency of operation of the at least one piezoelectric motor is improved by energizing the at least one piezoelectric motor using methods and driving circuits described in PCT Application PCT/IL99/00520, entitled "Method and Apparatus For Driving Piezoelectric Motors". In some embodiments of the present invention, holes are made in the body of the piezoelectric vibrator and/or grooves are made in edge surfaces of the vibrator to optimize the overlap of the excitation curves of vibration modes that are excited to generate vibrations in the motor coupling surface. The optimization of the excitation curves improves the operating efficiency of the piezoelectric motor. The holes and/or grooves are located responsive to locations of nodes and antinodes of the resonant vibration modes.

According to an aspect of some embodiments of the present invention the at least one piezoelectric motor comprises an electrode configuration that improves the efficiency of operation of the piezoelectric motor. The electrode configuration comprises a large L shaped electrode on a face surface of the vibrator comprised in the motor that covers substantially three-quarters (three quadrants) of the area of the face surface. Both longitudinal and transverse resonant vibration modes of the vibrator are excited when the electrode is electrified. Because of the relatively large area of the L electrode, a large volume of the vibrator is excited when the electrode is electrified. As a result, energy is more efficiently coupled into vibration modes of the vibrator than is coupled into the vibration modes when the vibrator is excited using electrodes covering less area of the face surface than the L shaped electrode.

According to an aspect of some embodiments of the present invention, the at least one piezoelectric motor comprises an asymmetric friction nub mounted on an edge surface of its vibrator. The motor is electrified to excite a single resonant vibration mode of the vibrator. The excited vibration mode generates motion of the friction nub along a first direction. The asymmetry in the friction nub generates a torque in the body of the friction nub that generates a bending vibration mode in the body of the friction nub along a direction orthogonal to the first direction. Preferably, the frequency of the bending mode of the friction nub is close to the frequency of the single resonant vibration mode excited in the piezoelectric vibrator. The two motions combine to transmit motion to a body to which the piezoelectric motor is coupled.

The asymmetry in the friction nub will generally also generate torque on the body of the vibrator. In some embodiments of the present invention the asymmetry excites a vibration mode of the vibrator. In some embodiments of the present invention dimensions of the vibrator are chosen so that the torque does not excite a vibration mode in the vibrator.

In some embodiments of the present invention a friction nub is located so that its center of mass is displaced from an axis of symmetry of the vibrator of the piezoelectric motor. When the motor is operated, electrodes in the vibrator are electrified with an AC voltage to excite a first vibration mode of the vibrator that vibrates the friction nub and mass points in the piezoelectric vibrator along the axis of symmetry. Because of the displacement of the friction nub from the axis of symmetry, a second vibration mode of the vibrator is excited that moves the friction nub and mass points in the vibrator in a direction perpendicular to the axis of symmetry. The displacement of the friction nub in effect breaks the symmetry of the vibrator about the axis of symmetry and mechanically couples the second vibration mode of the vibrator to the first vibration mode of the vibrator. In accordance with another embodiment of the present invention the symmetry of the piezoelectric vibrator is broken by breaking the symmetry of the geometry of the vibrator, for example by mitering a corner of the vibrator.

If both the first and second vibration modes of the vibrator are excited by electrifying electrodes in the vibrator with an AC voltage, energy may be more efficiently coupled to the second vibration mode as a result of the breaking of the symmetry of the vibrator. In addition, the asymmetry will generally preferentially couple energy to particular relative phase of the second vibration mode with respect to the first vibration mode. For example the asymmetry might preferentially couple energy into transverse and longitudinal vibration modes when they are excited to generate clockwise elliptical motion in a friction nub rather than counterclockwise elliptical motion.

An aspect of some embodiments of the present invention relates to providing a shaver in which the at least one piezoelectric motor imparts rotary motion to the cutting blades.

In some embodiments of the present invention the shaver comprises at least one blade head, hereinafter referred to as a "rotary blade head", comprising an axis of rotation about which it is rotated and a hub to which cutting blades are connected. In some embodiments of the present invention, the cutting edge of each cutting blade extends from a point at or near the hub in a general radial direction away from the hub. Optionally, a segment of each cutting edge lies in or close to a same plane perpendicular to the axis of rotation.

In some embodiments of the present invention each blade head is coupled to a circular disc having an axis of rotation coincident with the axis of rotation of the blade head. An annular surface region of the disc substantially perpendicular to the axis of rotation functions as a coupling surface for the blade head. In some embodiments of the present invention the rotary blade head is coupled to or formed with a circularly cylindrical coupling surface having an axis of rotation coincident with the axis of rotation of the blade head. At least one piezoelectric motor is coupled to the blade head by resiliently pressing a motor coupling surface, such as, optionally, a surface of a friction nub, of the piezoelectric motor to the coupling surface of the blade head. Vibrations excited in the piezoelectric motor rotate the cylindrical coupling surface and thereby the blade head and the cutting blades attached thereto.

In some embodiments of the present invention, the at least one rotary blade head comprises a plurality of rotary blade heads having circularly cylindrical coupling surfaces. In some embodiments of the present invention, the axes of rotation of the rotary blade heads are parallel. The, intersection points of the axes of rotation with a plane perpendicular to the axes of rotation define a polygon, hereinafter referred to as a "configuration polygon". (Note that the polygon becomes degenerate and reduces to a straight line when there are only two rotary blade heads.)

In some embodiments of the present invention, at least one piezoelectric motor is mounted between each pair of adjacent rotary blade heads on the configuration polygon. Preferably, the at least one piezoelectric motor comprises two friction nubs and a different friction nub of the two friction nubs of the at least one piezoelectric motor contacts the cylindrical coupling surface of each of the two rotary blade head. Preferably, a line between the friction nubs is substantially parallel to a side of the configuration polygon. Each rotary blade head is thus coupled to at least two piezoelectric motors that lie along adjacent sides of the configuration polygon on opposite sides of the blade head. Preferably, a resilient force urges each coupling surface in a direction along the bisector of the angle formed by the two adjacent sides of the polygon on opposite sides of the coupling surface. Preferably all coupling surfaces are pressed with substantially a same magnitude force to all surface regions of piezoelectric motors that they contact. Optionally, the configuration polygon is a convex equilateral polygon. When this is the case, the resilient force operating on each coupling surface urges the coupling surface towards the center of the configuration polygon and all the resilient forces have a same magnitude. (Note, that when there are only two rotary blade heads, and the polygon degenerates to a straight line, each of the blade heads is coupled to a same at least one piezoelectric motor that is positioned between them.)

When a configuration polygon is a convex equilateral polygon, the polygon can be inscribed in a circle, hereinafter referred to as a "configuration circle". In the discussion below, for configurations of blade heads having a configuration circle, the configuration circle will be used in specifying features of the configuration.

In some embodiments of the present invention, each rotary blade head on the configuration polygon is coupled to its own at least one piezoelectric motor. In some embodiments of the present invention for which the blade heads define a configuration circle, the at least one piezoelectric motor that drives a blade head is positioned and oriented parallel to a radius of the configuration circle. (The radius intersects the rotation axis of the blade head.) A resilient force operating on the at least one piezoelectric motor urges the motor in a direction parallel to the radius to press a motor coupling surface of the motor to the cylindrical coupling surface of the rotary blade head. In some embodiments of the present invention a resilient force operates on the rotation axis of the blade head and urges the rotation axis towards the center of the configuration circle to press the coupling surface to the at least one piezoelectric motor.

An aspect of some embodiments of the present invention relate to providing an electric shaver in which the at least one piezoelectric motor imparts rotary motion to the cutting blades via a gear transmission. In some embodiments of the present invention, the gear transmission is a planetary gear transmission.

The cutting blades are preferably mounted to at least one rotary, blade head comprising a hub as described above. Each rotary blade head is preferably coupled to a gear that is a planet gear of the planetary transmission. The planet gears are preferably located inside and coupled to an annulus gear, which when rotated, rotates all the planetary gears and thereby the rotary blade heads. The at least one piezoelectric motor is coupled to and rotates the annulus gear.

In some embodiments of the present invention, a planetary transmission comprises a sun gear that is coupled to each of the planet gears of the rotary blade heads. In some planetary transmission configurations comprising a sun gear, the annulus gear is absent and the sun gear is coupled to at least one piezoelectric motor that turns the sun gear and thereby the planet gears. In some embodiments of the present invention the sun gear drives a rotary blade head.

An aspect of some embodiments of the present invention relates to providing a shaver comprising at least one rotary blade head that comprises cutting blades having cutting edges located on a surface of revolution. The surface of revolution has an axis substantially parallel to an axis of rotation about which the rotary blade head is rotated. The blade head is optionally coupled to a circularly cylindrical coupling surface having an axis of rotation coincident with the axis of rotation of the blade head. At least one piezoelectric motor turns the coupling surface and thereby the at least one rotary blade head.

An aspect of some embodiments of the present invention relate to providing a shaver comprising at least one piezoelectric motor that imparts oscillatory motion to cutting blades of the shaver. In some embodiments of the present invention the oscillatory motion is rotational. In some embodiments of the present invention the oscillatory motion is linear. The cutting blades are mounted to or formed on, an at least one "oscillatory blade head"

In some embodiments of the present invention, the at least one oscillatory blade head comprises a first arc surface and a second arc surface having a common axis of rotation. An arc surface is a cylindrical surface having a directrix that is an arc of a circle, which arc subtends less than $2\pi$ radians at the center of the circle. Cutting blades are formed or mounted on the first arc surface so that their cutting edges are substantially parallel to the common axis of rotation or have directions that make small angles with the axis of rotation. At least one piezoelectric motor is coupled to the second arc surface, which is a coupling surface of the oscillatory blade head. The at least one piezoelectric motor rotates the second arc surface, and thereby the first cylindrical surface and the cutting blades attached thereto, back and forth about the common axis of rotation.

In some embodiments of the present invention the shaver comprises an oscillatory blade head on which cutting blades are formed or mounted so that their cutting edges are positioned in a linear array that defines a linear array axis of motion. The blade head comprises a planar coupling surface. At least one piezoelectric motor is resiliently pressed to the coupling surface so as to oscillate the coupling surface, and thereby the cutting blades, back and forth parallel to the axis of motion.

An aspect of some embodiments of the present invention relate to providing a shaver in which oscillatory motion of cutting blades comprised in the shaver is generated by exciting a resonant vibration in a blade head to which the cutting blades are attached.

The structure of the blade head, hereinafter referred to as a "resonant blade head", and cutting blades is designed, using methods known in the art, so that the cutting blades have a resonant vibration mode at a desired resonant frequency. A force having a time dependent force component characterized by a frequency equal to or close to the resonant frequency is applied to the resonant blade head. The force component excites the resonant vibration of the cutting blades to generate desired motion in the cutting blades. In some embodiments of the present invention the cutting blades are mounted to a resonant blade head in a linear array. In some embodiments of the present invention the cutting blades are mounted to a blade head in a curved or circular array having an axis of rotation.

In some embodiments of the present invention the force is generated by a conventional electric motor. In some embodiments of the present invention a piezoelectric motor generates the force. However, while frequencies of oscillation of cutting blades in a shaver are usually in a range from 50 Hz to 250 Hz, frequencies of resonant vibrations of most piezoelectric motors range from tens to hundreds of thousands of Hz. In order to use a "high frequency" piezoelectric motor to efficiently drive a "low frequency" resonant blade head, forces characterized by the resonant frequency of the blade head have to be generated from forces provided by the piezoelectric motor.

An aspect of some embodiments of the present invention relates to providing a method for applying a force of appropriate frequency to a resonant blade head using a piezoelectric motor having a resonant frequency higher than the resonant frequency of the blade head. In accordance with an embodiment of the present invention, forces provided by the piezoelectric motor are modulated by a time dependent modulation function having a frequency equal to or near to the resonant frequency of the blade head. The modulation results in generating a time dependent force characterized by the resonant frequency of the blade head. In some embodiments of the present invention the modulation function is an harmonic function. In some embodiments of the present invention, the time dependent modulation function is generated by turning the piezoelectric motor on and off at a frequency equal to or near to the resonant frequency of the blade head.

An aspect of some embodiments of the present invention relates to providing a wet shaver that provides an improved shave, which is smoother than shaves provided by prior art wet shavers. Wet shavers are shavers comprising at least one razor blade having a cutting edge that is drawn by hand over a region of skin generally moistened with water and lathered with a lubricant, such as shaving cream, to remove hair from the skin. In an embodiment of the present invention, a wet shaver comprises a piezoelectric motor that is coupled to the at least one razor blade. The piezoelectric motor and circuits and wires that provide power to the piezoelectric motor are preferably waterproofed with an appropriate flexible coating of insulating material to prevent damage to the motor and shaver from moisture and to protect a user of the shaver from electric shock. In some embodiments of the present invention, the piezoelectric motor is mounted in a waterproof compartment. When the wet shaver is used, the piezoelectric motor generates high frequency oscillations in the cutting edge of the at least one razor. The oscillations move the cutting edge of the at least one razor perpendicular to itself back and forth along the direction in which the cutting edge is drawn over the skin. The oscillations cause the cutting edge of the at least one razor to move over the skin more smoothly than do cutting edges of razors in prior art wet shavers.

An aspect of an embodiment of the present invention relates to providing a "wet electric shaver" that is useable in the same manner that conventional electric shavers are used and that is also useable with water and shaving cream in the way that conventional wet shavers are used.

In embodiments of the present invention, such as for example any of the embodiments described above, the piezoelectric motor and its accessory components are waterproofed with an appropriate flexible sealant. The shaver can therefore be used as a "dry" electric shaver in the conventional manner or as a "wet" electric shaver with skin being shaved lubricated with water and/or a shaving cream. It should be noted that unlike conventional electric motors, piezoelectric motors, such as those described in U.S. Pat. No. 5,616,980 or PCT Application PCT/IL99/00288 and variants thereof, because of their relatively simple construction and small number of moving parts, are relatively easily waterproofed with a coating of a flexible insulating material. Such flexible insulating materials are well known in the art and suitable flexible insulating materials, for example Teflon and latex, which bond well to material of the piezoelectric motor are readily available. It should further be noted that materials suitable for forming friction nubs that efficiently transmit motion to a moveable body to which they are pressed when wet are available. Among these materials are, for example, Alumina and titanium.

An aspect of some embodiments of the present invention relates to providing a shaver in which a single piezoelectric motor drives a plurality of shafts to which rotary blade heads are coupled.

The piezoelectric motor, hereinafter referred to as a "star motor", comprises a plurality of arms, hereafter referred to as "driving arms" that extend outwardly along radial directions, "starfish like" from a common center. In some embodiments of the present invention, the motor comprises a planar layer of piezoelectric material bonded to a layer of non-piezoelectric material, which is, optionally, a metal. At least one electrode is located on the layer of the piezoelectric material on a side of the piezoelectric material, which is not bonded to the metal. An AC voltage difference applied between the at least one electrode and the metal layer generates longitudinal vibrations in each driving arm of the star motor. Because, the metal layer does not expand with application of an electric field to the metal, periodic expansion and contraction of the piezoelectric material in each driving arm caused by the longitudinal vibrations generate mechanical forces that bend the arm and excite a bending vibration mode of the arm. The combination of longitudinal and bending vibration modes of the driving arm causes a motor coupling surface, optionally a friction nub, on the arm to execute an elliptical vibration. The elliptical vibration of the motor coupling surface of each driving arm is coupled to rotate a shaft mounted with a rotary blade head. Star motors, in accordance with embodiments of the present invention may comprise different numbers of driving arms. In some embodiments of the present invention, a star motor comprises, by way of example, two three or four driving arms that are used to drive two, three or four shafts.

In some star motors in accordance with an embodiment of the present invention the piezoelectric layer in driving arms of the motor that is excited by an electric field is bonded to a piezoelectric layer of material to which an electric field is not applied. Mechanical stress between the excited piezoelectric layer and non-excited piezoelectric layer generate bending motions in driving arms of the motor.

In some embodiments of the present invention, vibrations in driving arms of a star motor that are useful for transmitting motion to a moveable element are not generated by mechanical forces between a layer of material in the driving arms. Instead, useful vibrations in the driving arms are excited by electrifying appropriate configurations of electrodes on surface regions of the driving arms.

In some embodiments of the present invention bending vibrations in driving arms of star motors are generated by asymmetries in mass distributions of the driving arms. When longitudinal vibrations are generated in the driving arms forces accelerating the asymmetric mass distribution generate torque that excites bending vibrations in the driving arms.

There is therefore provided in accordance with an embodiment of the present invention A piezoelectric motor comprising: a layer of piezoelectric material having narrow edge surfaces and first and second large face surfaces, formed with at least three arms, each extending radially outward from a common central region and terminating in an end; at least one electrode on the first face surface and at least one electrode on the second face surface.

Optionally each arm has a bilateral axis of symmetry that extends from the central region. Optionally, each of the arms of the piezoelectric layer is substantially rectangular. Optionally, each of the arms is substantially trapezoidal with its width decreasing with distance from the central region.

In some embodiments of the present invention the thickness of each piezoelectric arm decreases with distance from the central region. In some embodiments of the present invention junctions of an arm with the central region are curved.

In some embodiments of the present invention the piezoelectric motor comprises a thin plate having two large face surfaces and at least three arms, said plate being substantially similar in shape to the piezoelectric layer, wherein the first face surface of the piezoelectric layer is aligned with and bonded to one of the face surfaces of the plate. Optionally, the thin plate is formed from a non-piezoelectric material. Optionally, the material is non-conductive. Alternatively, the material is optionally a conductor.

In some embodiments of the present invention the at least one electrode on the first face surface of the piezoelectric layer comprises a single large electrode covering substantially the entire first surface.

In some embodiments of the present invention the at least one electrode on the second face surface of the piezoelectric layer comprises a single large electrode covering substantially the entire second surface. Optionally the piezoelectric motor comprises an AC voltage source connected to the single electrode that electrifies the single electrode with respect to the at least one electrode on the first surface, said at least one electrode on the first surface being configured such that when the single electrode is electrified, mass points in the corners of the end of each arm execute elliptical vibratory motion perpendicular to the plane of the arm.

In some embodiments of the present invention the at least one electrode on the second face surface comprises a single electrode on each arm that covers substantially all the area of the second surface on one side of the arm's axis of symmetry and substantially none of the area on the other side. Optionally, the single electrode on any one arm is homologous with the single electrode on any of the other arms. Optionally, the electrodes on the second face surface are electrically connected.

In some embodiments of the present invention the at least one electrode on the second face surface comprises first and second separate electrodes on each arm that are located on opposite sides of the arm's bilateral axis of symmetry and together cover substantially all the area of the second surface in the region of the arm. Optionally, the first and second electrodes on any one arm are homologous respectively with the first and second electrodes on any of the other arms and all the first electrodes are connected to form a first set of electrodes and all the second electrodes are connected to form a second set of electrodes. Optionally, the piezoelectric motor comprises a source of voltage connected to the first and second sets of electrodes which electrifies the first and second electrodes with respect to the at least one electrode on the first surface with first and second AC voltages respectively that are 180° out of phase and wherein, the at least one electrode on the first surface is configured so that when the first and second sets of electrodes are electrified, mass points near opposite corners of the end of each arm execute same sense elliptical vibratory motion as seen from a point on the bilateral axis of symmetry of the arm.

In some embodiments of the present invention the at least one electrode on the second face surface of the piezoelectric layer comprises four electrodes on each arm that are arranged in a checkerboard pattern with each electrode located in a different quadrant of the second surface in the region of the arm. Optionally, diagonally opposite electrodes on each arm are electrically connected to form a first and a second pair of diagonally connected electrodes on each arm and wherein first and second pairs of diagonal electrodes on each arm are homologous respectively with the first and second diagonal pairs of electrodes on any of the other arms of the motor. Optionally, all the first diagonal pairs of electrodes are electrically connected to form a first set of diagonal electrodes and all the second pairs of diagonal electrodes are electrically connected to form a second set of diagonal electrodes.

In some embodiments of the present invention the piezoelectric motor comprises an AC voltage source connected to the electrodes which electrifies the first set of diagonal electrodes with respect to the at least one electrode on the first surface while the second set of diagonal electrodes is grounded or floating, and the at least one electrode on the first surface is configured so that when the AC voltage source electrifies the first set of electrodes, mass points in opposite corners of the end of each arm execute clockwise elliptical vibratory motion perpendicular to the plane of the motor as seen from a point on the bilateral axis of symmetry of the arm.

In some embodiments of the present invention the piezoelectric motor comprises an AC voltage source connected to the electrodes which electrifies the second set of diagonal electrodes with respect to the at least one electrode on the first surface while the first set of diagonal electrodes is grounded or floating, and the at least one electrode on the first surface is configured so that when the AC voltage source electrifies the second set of electrodes, mass points in opposite corners of the end of each arm execute counterclockwise elliptical vibratory motion perpendicular to the plane of the motor as seen from a point on the bilateral axis of symmetry of the arm.

In some embodiments of the present invention the piezoelectric motor comprises a mass element affixed to each arm on the first surface at a distance from the central region and wherein when longitudinal vibrations are excited in the arm the mass generates a torque that excites bending vibrations in the arm.

In some embodiments of the present invention the piezoelectric motor comprises an AC voltage source connected to the at least one electrode on the first surface and the at least one electrode on the second surface that electrifies the at least one electrode on the second surface with respect to the at least one electrode on the second surface and wherein the electrodes are configured so that when they are electrified by the voltage source, vibratory motion is excited in each of the arms.

There is further provided in accordance with an embodiment of the present invention a piezoelectric motor comprising: a thin plate formed from two layers of piezoelectric material bonded together, said plate having narrow edge surfaces and first and second large face surfaces, formed with at least three substantially rectangular arms, each having a bilateral axis of symmetry and extending radially outward from a common central region and terminating in an end; first and second electrodes covering substantially the entire area of the first and second surfaces respectively; and a medial electrode located between the piezoelectric layers having an area substantially equal to the area of the first electrode.

Optionally, the piezoelectric layers are mirror images of each other. Optionally, the piezoelectric motor comprises a source of AC voltage connected to the first, second and medial electrodes that electrifies the first and second electrodes with respect to the medial electrode with AC voltages having a same frequency and phase but different amplitudes.

Optionally, the piezoelectric layers have different thicknesses. Optionally, the piezoelectric motor comprises a source of AC voltage connected to the first, second and medial electrodes that electrifies the first and second electrodes with respect to the medial electrode with a same AC voltage.

In some embodiments of the present invention, the piezoelectric motor comprises a friction nub located on the edge surface of the end of each piezoelectric arm.

In some embodiments of the present invention, the piezoelectric motor comprises a single friction nub located on the second surface of the piezoelectric layer near a corner of the end of each piezoelectric arm.

In some embodiments of the present invention, the piezoelectric motor comprising a thin plate comprises on the surface of the thin plate that is not bonded to the piezoelectric layer a single friction nub located near a corner of the end of each arm of the plate.

In some embodiments of the present invention the piezoelectric motor comprises an extension for each arm formed from a non-piezoelectric material that is bonded to the end of the arm, which extension comprises a single friction nub located on a surface of the extension that is parallel to the plane of the arm and displaced from the bilateral axis of symmetry.

In some embodiments of the present invention the piezoelectric motor comprises two substantially identical friction nubs located on the second surface in opposite corners of the end of each piezoelectric arm and wherein a straight line connecting the friction nubs is substantially perpendicular to the bilateral axis of symmetry of the arm.

In some embodiments of the present invention the piezoelectric motor comprises, on the surface of the plate not bonded to the piezoelectric layer, two substantially identical friction nubs located near corners of the end of each arm of the plate and wherein a straight line connecting the friction nubs is substantially perpendicular to the bilateral axis of symmetry of the arm.

In some embodiments of the present invention, the piezoelectric motor comprises an extension for each arm formed from a non-piezoelectric material that is bonded to the end of the arm, which extension comprises a friction nub on each side of the bilateral axis of symmetry of the arm and wherein a straight line connecting the friction nubs is substantially perpendicular to the bilateral axis of symmetry.

In some embodiments of the present invention, the piezoelectric motor comprises a disk, having an axis of rotation perpendicular to surfaces thereof, mounted to the single friction nub of each arm, wherein the axis of rotation is perpendicular to the plane of the arm and the friction nub contacts a disk surface at a point on the disc surface for which a line from the point perpendicular to the axis of rotation is substantially perpendicular to the bilateral axis of the arm. Optionally the axis of rotation intersects the bilateral axis of symmetry of the arm.

In some embodiments of the present invention, the piezoelectric motor comprises a disk, having an axis of rotation perpendicular to surfaces thereof for each arm, wherein a surface of the disc is resiliently pressed to both friction nubs of the arm and the disc's axis of rotation is perpendicular to and passes through the arm's bilateral axis of symmetry and a the line connecting the friction nubs.

In some embodiments of the present invention, the piezoelectric motor has a rotational symmetry of order equal to the number of arms in the motor.

There is further provided, in accordance with an embodiment of the present invention, a piezoelectric motor comprising: a rectangular layer of piezoelectric material having short and long edges, a long axis of symmetry and first and second large face surfaces, at least one electrode on the first face surface and at least one electrode on the second face surface; a friction nub located near each corner of the piezoelectric layer adjacent to at least one same short edge of the layer wherein a straight line connecting the friction nubs is substantially perpendicular to the long axis of symmetry; and an AC voltage source connected to the electrodes that electrifies the at least one electrode on the first face surface with respect to the at least one electrode on the second face surface, said electrodes having a configuration such that when electrified, the friction nubs execute same sense elliptical vibratory motion as seen from a point on the long axis of symmetry.

Optionally, the piezoelectric motor comprises a disk, having an axis of rotation perpendicular to surfaces thereof, for each pair of friction nubs near a same short edge, wherein a surface of the disc is resiliently pressed to both friction nubs of the pair of friction and the disc's axis of rotation is perpendicular to and passes through the long axis of symmetry and a line connecting the friction nubs.

There is further provided, in accordance with an embodiment of the present invention, a compound piezoelectric motor comprising: first and second mirror image piezoelectric motors according to any of claims 33–40 having the axes of symmetry of their respective arms parallel and friction nubs facing each other; a disk, having an axis of rotation perpendicular to surfaces thereof positioned between each arm of the first piezoelectric motor and its mirror image arm in the second piezoelectric motor, wherein the disc's axis of rotation is perpendicular to the bilateral axes of symmetry of the mirror image arms and each of the friction nubs of the arms is in contact with one of the disk surfaces; and at least one elastic element that resiliently presses the first and second piezoelectric motors towards each other so that each of the friction nubs of the motors is resiliently pressed to the disc surface that it contacts.

There is further provided, in accordance with an embodiment of the present invention, a compound piezoelectric motor comprising: first and second mirror image piezoelectric motors according to claim 43 having their respective long axes of symmetry parallel and friction nubs facing each other; a disk, having an axis of rotation perpendicular to surfaces thereof which is positioned between each pair of friction nubs along a short edge of the first motor and the mirror image pair of friction nubs of the second motor, wherein the disk's axis of rotation is perpendicular to the long axes of symmetry of the mirror image motors and each of the friction nubs of the motors is in contact with one of the disk surfaces; and at least one elastic element that resiliently presses the first and second piezoelectric motors towards each other so that each of the friction nubs of the motors is resiliently pressed to the disk surface that it contacts.

In some embodiments of the present invention, each disc surface is formed with a thin circular ridge having a center located on the axis of revolution of the disk and wherein each of the friction nubs of the piezoelectric motor that contacts the surface contacts the ridge.

In some embodiments of the present invention, the discs are formed as gears and the motor comprises a gear mounted to the central region of the motor which meshes with all the discs.

In some embodiments of the present invention, each of the discs is formed with an edge surface and the motor comprises an additional disc having an edge surface which is mounted to the central region of the motor so that the edge surface of the additional disc is in frictional contact with the edge surface of each of the other discs.

In some embodiments of the present invention, each disk is mounted with a shaft having an axis of rotation coincident with the disc's axis of rotation.

In some embodiments of the present invention, the discs are mounted integrally to the body of the motor.

There is further provided, in accordance with an embodiment of the present invention, a shaver comprising a motor according to claim 51 wherein each shaft is mounted with a blade head having an axis of rotation coincident with the axis of the shaft and at least one cutting blade having a cutting edge for cutting hair that extends substantially radially away from the blade head's axis of rotation.

There is further provided in accordance with an embodiment of the present invention a shaver for cutting facial and body hair comprising: at least one blade head comprising at least one cutting blade having a cutting edge for cutting hair; a coupling surface coupled to the at least one blade head so that when the coupling surface moves, the blade head moves; at least one piezoelectric motor having a motor-coupling surface region resiliently pressed to the coupling surface; and a driving circuit that energizes the at least one piezoelectric motor and excites thereby vibrations in the motor-coupling surface of the piezoelectric motor that moves the coupling surface and thereby the blade head and at least one cutting blade.

In some embodiments of the present invention, the at least one blade head has an axis of rotation about which the blade head is rotatable and a hub having a center through which the axis of rotation passes, to which hub the at least one cutting blade is attached. Optionally, the cutting edge of each at least one cutting blade extends outward from the axis of rotation in a general radial direction and wherein a portion of the cutting edge of each cutting blade lies close to or in a same plane perpendicular to the axis of rotation.

Additionally or alternatively, the blade head is rigidly attached to a shaft having an axis of rotation coincident with the axis of rotation of the hub.

In some embodiments of the present invention the coupling surface is a surface region of a disc mounted to the shaft, which surface region is substantially perpendicular to the axis of rotation of the shaft.

In some embodiments of the present invention, the coupling surface is a circularly cylindrical coupling surface rigidly attached to the shaft and having an axis of rotation coincident with the axis of rotation of the shaft. Optionally, the coupling surface is a surface of the shaft. Alternatively, the coupling surface is a surface of a rim of a wheel rigidly mounted to the shaft.

In some embodiments of the present invention the at least one blade head comprises two blade heads having parallel axes of rotation wherein: the at least one piezoelectric motor is located between the shafts of the blade heads so that a different motor-coupling surface of the at least one piezoelectric motor contacts the coupling surface of each of the shafts; and including apparatus for generating at least one resilient force that presses the coupling surfaces of the shafts to the motor-coupling surfaces of the at least one piezoelectric motor.

In some embodiments of the present invention the at least one blade head comprises at least three blade heads having parallel axes of rotation that intersect a common plane perpendicular to the axes at points that are vertices of an equilateral polygon and comprising: at least one piezoelectric motor located between each pair of adjacent shafts so that a different motor-coupling surface of the at least one piezoelectric motor contacts the coupling surface of each of the shafts between which the at least one piezoelectric motor is positioned; and apparatus for applying at least one resilient force so that all coupling surfaces of the shafts are resiliently pressed to motor-coupling surfaces of piezoelectric motors that they contact.

Preferably, all coupling surfaces are pressed to each of the motor-coupling surfaces of piezoelectric motors that they contact with a substantially same magnitude force. Alternatively or additionally the polygon is convex.

In some embodiments of the present invention the apparatus for applying a resilient force comprises: a bearing surface associated with each shaft; and an elastic element coupling each bearing surface to an adjacent bearing surface associated with each of two shafts adjacent to the shaft with which the bearing surface is associated, which elastic element operates on the bearing surface to produce a same magnitude force in directions from the bearing surface to each of the adjacent bearing surfaces. Preferably, the bearing surface associated with each shaft is rotatable about the shaft.

Additionally or alternatively each bearing surface comprises a grooved edge surface perpendicular to the axis of rotation of the shaft with which the bearing surface is associated. In some embodiments of the present invention the elastic element is a spring. In some embodiments of the present invention the elastic element comprises a stretched elastic band that passes through each groove.

Additionally or alternatively when each of the at least one piezoelectric motor located between a pair of blade heads is energized each rotates the coupling surfaces of the blade heads it contacts with a non-oscillatory rotary motion in either a same clockwise or counterclockwise direction.

In some embodiments of the present invention the at least one blade head has an axis of rotation about which the at least one blade head is rotatable and the cutting edge of each of the at least one cutting blade lies substantially on a cylindrical surface that has an axis of rotation coincident with the axis of rotation of the blade head. Optionally, the at least one cutting blade comprises a plurality of cutting blades having cutting edges that lie substantially on a same cylindrical surface.

Alternatively or additionally, the coupling surface is a cylindrical surface rigidly attached to the at least one cutting blade, having an axis of rotation coincident with the axis of rotation of the blade head.

In some embodiments of the present invention, the directrices of the cylindrical coupling surface and the cylindrical surface on which the cutting edge of each of the at least one cutting blade lie are a same circle or concentric circles. Preferably, the at least one piezoelectric motor, when energized, rotates the coupling surface and thereby the at least one cutting blade with a non-oscillatory rotary motion about the axis of rotation.

In some embodiments of the present invention, the directrices of the cylindrical coupling surface and the cylindrical surface on which the cutting edge of each of the at least one cutting blade lie are arcs of the same or concentric circles.

In some embodiments of the present invention, the at least one piezoelectric motor when energized oscillates the coupling surface and thereby the at least one cutting blade with a rotary motion about the axis of rotation. In some embodiments of the present invention, the at least one cutting blade has a resonant vibration mode and the oscillatory motion that the at least one piezoelectric motor transmits to the coupling surface excites the resonant vibration mode.

In some embodiments of the present invention the coupling surface is a planar surface rigidly attached to the blade head. Preferably, the at least one piezoelectric motor oscillates the coupling surface, and thereby the blade head and at least one cutting blade, back and forth along a single direction. Optionally, the at least one cutting blade comprises a plurality of cutting blades mounted to the blade head in a linear array defined by an array axis parallel to the direction along which the at least one piezoelectric motor oscillates the coupling surface. In some embodiments of the present invention, the at least one cutting blade has a resonant vibration mode and the oscillations of the blade head generated by the at least one piezoelectric motor excites the resonant vibration mode of the at least one cutting blade.

In some embodiments of the present invention the at least one cutting blade has a resonant vibration mode. Optionally, the coupling surface is a planar surface rigidly attached to the blade head.

In some embodiments of the present invention, when the driving circuit energizes the piezoelectric motor, the motor-coupling surface of the piezoelectric motor that is pressed to the coupling surface vibrates substantially only in a direction perpendicular to the coupling surface. As a result, the motor-coupling surface impacts the coupling surface intermittently and excites thereby the resonant vibration mode of the at least one cutting blade.

In some embodiments of the present invention, the driving circuit energizes the at least one piezoelectric motor with a time varying voltage characterized by a frequency higher than the resonant frequency of the at least one cutting blade. The time varying voltage is optionally an harmonically varying voltage. Alternatively or additionally the driving circuit modulates the time varying voltage with a modulation function characterized by a frequency equal to or close to the resonant frequency. In some embodiments of the present invention the modulation function is a cyclical hat function. In some embodiments of the present invention the modulating function is an harmonic function.

In some embodiments of the present invention the at least one cutting blade comprises a plurality of cutting blades mounted to a surface in a linear array defined by an array axis. Preferably, the coupling surface is perpendicular to the array axis.

In some embodiments of the present invention the at least one cutting blade comprises a plurality of cutting blades mounted to a common shaft having an axis of rotation and the cutting edge of each cutting blade extends away from the axis of rotation in a general radial direction. Preferably, the coupling surface is rigidly attached to the shaft and is coplanar with the axis of rotation of the shaft.

In some embodiments of the present invention a first gear is mounted to the shaft and a coupling surface is coupled to the first gear via a second gear. Optionally, the at least one blade head comprises a plurality of blade heads. In some embodiments of the present invention, the first gear on the shaft of each blade head of the plurality of blade heads is a planet gear of a planetary gear transmission. Preferably, the planetary gear transmission comprises an annulus gear having an axis of rotation and the planet gears mesh with the annulus gear and rotate when the annulus gear rotates. The coupling surface is, optionally, a circularly cylindrical coupling surface rigidly attached to the annulus gear and has an axis of rotation coincident with the axis of rotation of the annulus gear.

In some embodiments of the present invention the at least one blade head comprises a plurality of blade heads and the axes of the respective shafts of the blade heads are parallel. In some embodiments of the present invention, the axes of rotation intersect a same circle. Alternatively or additionally, the at least one piezoelectric motor is situated between the center of the circle and each blade head. Preferably, the shaver comprises a resilient body located at the center of the circle that presses on a surface region of the at least one piezoelectric motor that lies between the center of the circle and each of the plurality of blade heads and presses thereby the motor-coupling surface of the at least one piezoelectric motor resiliently to the coupling surface that it contacts.

There is further provided in accordance with an embodiment of the present invention a wet shaver for shaving hair on a region of skin lubricated with water comprising: a razor blade having a straight cutting edge that is designed to be drawn over the region of skin in a direction perpendicular to the straight edge to shave the skin; a coupling surface coupled to the razor blade such that when the coupling surface moves, the razor blade moves; at least one piezoelectric motor having a motor-coupling surface resiliently pressed to the coupling surface; and a driving circuit that energizes the at least one piezoelectric motor and excites thereby vibrations in the motor-coupling surface of the piezoelectric motor that moves the coupling surface and thereby the razor blade head and cutting edge.

In some embodiments of the present invention vibrations in the motor-coupling surface of the piezoelectric motor generate oscillatory rotary motion of the razor blade about an axis of rotation parallel to the cutting edge. In some embodiments of the present invention, the wet shaver comprises a mounting plate to which the razor blade is mounted and wherein the coupling surface is a surface of the mounting plate. Preferably, the mounting plate is attached to a handle by a hinge having an axis of rotation parallel to the cutting edge and the razor blade rotates about the axis of rotation. Preferably, the motor-coupling surface of the piezoelectric motor that presses against the coupling surface vibrates substantially only in directions perpendicular to the coupling surface when the driving circuit energizes the piezoelectric motor.

In some embodiments of the present invention the motor-coupling surface of the at least one piezoelectric motor is a surface region of a tip of a conical nub bonded to a surface of the piezoelectric motor.

In some embodiments of the present invention vibrations in the motor-coupling surface of the piezoelectric motor generate oscillatory linear motion of the razor blade and thereby the cutting edge, back and forth parallel to the cutting edge. Optionally, the coupling surface is a planar surface parallel to the cutting edge that is rigidly attached to the razor blade. Preferably, the vibrations in the motor-coupling surface of the at least one piezoelectric motor are alternating clockwise and counterclockwise elliptical vibrations.

In some embodiments of the present invention, the motor-coupling surface of the at least one piezoelectric motor is a surface region of a friction nub bonded to a surface of the piezoelectric motor.

In some embodiments of the present invention, the piezoelectric motor vibrates the cutting edge of the razor blade with a frequency greater than 5,000 Hz. In some embodiments of the present invention, the piezoelectric motor vibrates the cutting edge of the razor blade with a frequency greater than 10,000 Hz. In some embodiments of the present invention, the piezoelectric motor vibrates the cutting edge of the razor blade with a frequency greater than 20,000 Hz.

In some embodiments of the present invention, the at least one piezoelectric motor is waterproofed with a coating of a flexible insulating material.

There is further provided in accordance with an embodiment of the present invention a piezoelectric motor comprising: a piezoelectric vibrator having electrodes connected to conducting leads; and a flexible insulating coating that covers the vibrator, the electrodes and the leads.

In some embodiments of the present invention the piezoelectric motor comprises a nub mounted on a surface of the vibrator that is pressed to a body that the motor moves. Optionally, the nub is a replaceable nub mountable to the vibrator after the vibrator is covered with the insulating coating.

In some embodiments of the present invention the insulating coating is a coating of Teflon. In some embodiments of the present invention the coating is a coating of latex.

There is further provided, in accordance with an embodiment of the present invention, a piezoelectric motor for transmitting motion to a body in only one direction comprising: a relatively thin rectangular piezoelectric vibrator formed from at least one thin rectangular layer of piezoelectric material having first and second relatively large planar face surfaces and short and long narrow edge surfaces; a first electrode covering areas of three quadrants of a first face surface and substantially no area of a fourth quadrant of the face surface of at least one piezoelectric layer of the at least one piezoelectric layer, and a second electrode on the second face surface of the at least one piezoelectric layer having the first electrode, the second electrode having a surface region opposite the first electrode.

In some embodiments of the present invention, the piezoelectric motor comprises a third electrode covering an area of the fourth quadrant of the first face surface. In some embodiments of the present invention, the first electrode covers substantially all the three quadrants. In some embodiments of the present invention, the first electrode is L shaped. In some embodiments of the present invention, the third electrode covers substantially all of the area of the fourth quadrant. In some embodiments of the present invention, the at least one layer comprises a plurality of layers stacked with the long edges of all layers parallel.

There is further provided, in accordance with an embodiment of the present invention a piezoelectric motor comprising: a piezoelectric vibrator having an axis of symmetry and a first vibration mode, which when excited generates oscillatory motion of mass points in the vibrator parallel to the axis of symmetry; and at least one friction nub having a center of mass displaced from the axis of symmetry, as a result of which displacement, when the vibration mode is excited, torque is generated on the vibrator that excites a second vibration mode of the vibrator.

In some embodiments of the present invention, the friction nub is located on a narrow edge surface of the piezoelectric motor. Additionally or alternatively, the first and second vibration modes combine to move the friction nub with an elliptical vibratory motion.

In some embodiments of the present invention, the piezoelectric vibrator comprises a relatively thin rectangular plate of piezoelectric material having first and second relatively large planar face surfaces and short and long narrow edge surfaces and the axis of symmetry is a line that passes through the center of the vibrator parallel to the long edges of the vibrator. In some embodiments of the present invention, the rectangular plate is formed from a plurality of layers of material comprising at least one layer of piezoelectric material.

Alternatively or additionally, the friction nub consists of a first portion having a center of mass that lies on the axis of symmetry which first portion is connected to a second portion having a center of mass displaced from the axis of symmetry. In some embodiments of the present invention, the friction nub is formed in the shape of an L and the first and second portions are first and second legs of the L. Preferably, the first and second legs are orthogonal. Preferably, the friction nub is situated on a short edge surface of the vibrator and the axis of symmetry passes through the center of mass of the first leg.

Preferably, the second leg extends in a direction that is substantially perpendicular to the planes of the face surfaces of the vibrator. Alternatively, the second leg extends in a direction that is substantially parallel to the planes of the face surfaces of the vibrator.

In some embodiments of the present invention, the piezoelectric motor comprises two friction nubs located on opposite short edge surfaces of the vibrator and the centers of mass of the two friction nubs are coplanar and displaced from the axis of symmetry in opposite directions by a same distance.

There is further provided in accordance with an embodiment of the present invention a piezoelectric motor comprising: a vibrator having a vibration mode, which vibration mode, when excited, generates oscillatory motion of mass points in the vibrator parallel to a first direction; and a friction nub for which vibrations of mass points of the vibrator parallel to the first direction generate an oscillatory force having an action line that does not intersect the center of mass of the friction nub which force generates torque on the body of the nub that excites a bending vibration mode of the friction nub.

In some embodiments of the present invention, the friction nub consists of a first portion having a center of mass through which the action line passes, which first portion is connected to a second portion having a center of mass displaced from the action line. Optionally, the friction nub is formed in the shape of an L and wherein the first and second portions are first and second legs of the L. Preferably the first and second legs are orthogonal.

In some embodiments of the present invention, the piezoelectric vibrator comprises a relatively thin rectangular plate of piezoelectric material having relatively large planar face surfaces, long edge surfaces and first and second short edge surfaces and the first direction is parallel to the long edges of the vibrator.

In some embodiments of the present invention, the friction nub is situated on a first short edge surface of the vibrator and the line of action passes through the center of mass of the first leg. Preferably, the second leg extends in a direction that is substantially perpendicular to the planes of the face surfaces of the vibrator. Preferably, the first leg extends in a direction that is substantially parallel to the planes of the face surfaces of the vibrator.

In some embodiments of the present invention, the piezoelectric vibrator comprises a second friction nub located on the second short edge surface of the vibrator and the second legs of the first and second friction nubs point in opposite directions with respect to the face surfaces of the vibrator.

There is further provided in accordance with an embodiment of the present invention, a piezoelectric motor comprising: a relatively thin rectangular piezoelectric vibrator formed from at least one thin rectangular layer of piezoelectric material having first and second relatively large planar face surfaces and short and long narrow edge surfaces; four electrodes on a first face surface of a piezoelectric layer of the at least one piezoelectric layer, each of which is located in a different quadrant of the first face surface of the layer; an electrode on the second face surface of the piezoelectric layer having a surface region opposite each of the electrodes on the first face surface; and a driving circuit that electrifies each electrode of two different first and second sets of three of the four electrodes on the first face surface with a same voltage to generate respectively clockwise and counterclockwise elliptical motion of mass points of the vibrator.

Preferably, each of the electrodes on the first face surface covers substantially all of the area of the quadrant in which it is located. Alternatively, or additionally the at least one layer comprises a plurality of layers.

There is further provided in accordance with an embodiment of the present invention a method for rotating a plurality of shafts having axes of rotation comprising: positioning the shafts with their axes of rotation parallel so that the axes intersect a common plane perpendicular to the shafts at points that are vertices of a polygon; providing each shaft with a circularly cylindrical coupling surface having an axis of rotation coincident with the axis of rotation of the shaft; positioning at least one piezoelectric motor between each pair of shafts that have axes at adjacent vertices of the polygon so that a different motor-coupling surface of the at least one piezoelectric motor contacts a coupling surface of each of the shafts between which the at least one piezoelectric motor is positioned; urging the axis of rotation of each shaft with a resilient force so that all coupling surfaces of the shafts are resiliently pressed to each of the motor-coupling surfaces of piezoelectric motors that they contact with a substantially same magnitude force; and energizing the piezoelectric motors so that their respective motor-coupling surfaces that contact coupling surfaces of the shafts vibrate and rotate thereby the shafts.

In some embodiments of the present invention, the polygon is equilateral. Additionally or alternatively, the polygon is convex.

In some embodiments of the present invention, urging the axis of rotation of each shaft with a resilient force comprises: mounting a bearing to each shaft, which bearing is rotatable about the shaft; and connecting each bearing to each of two adjacent bearings with an elastic element that operates on the bearing with a same magnitude force in directions from the bearing to each adjacent bearing along a direction parallel to the side of the polygon between the bearing and the adjacent bearing. In some embodiments of the present invention, each bearing comprises a grooved edge perpendicular to the axis of rotation of the shaft on which the bearing is mounted. Preferably, connecting each bearing comprises looping a same stretched elastic element through all the grooves.

In some embodiments of the present invention, urging the axis of rotation of each shaft with a resilient force comprises: forming a groove in a circularly cylindrical surface rigidly attached to each shaft, which cylindrical surface has an axis of rotation coincident with the axis of rotation of the shaft; and looping a same stretched elastic element through all the grooves.

There is further provided, in accordance with an embodiment of the present invention, a method for moving a body comprising: forming the body so that it has a resonant vibration mode characterized by a resonant frequency; coupling a piezoelectric motor to the body; and energizing the piezoelectric motor with a time varying voltage having a frequency component equal to or near to the resonant frequency of vibration of the body and transmitting thereby energy into the resonant vibration mode of the body.

In some embodiments of the present invention, energizing the piezoelectric motor comprises energizing the piezoelectric motor with a time varying voltage characterized by a frequency higher than the resonant frequency of the body and modulating the time varying voltage with a modulation function characterized by a frequency equal to or close to the resonant frequency. Optionally, the modulation function is a cyclical hat function. Alternatively the modulating function is, optionally, an harmonic function. Alternatively or additionally, the time varying voltage is an harmonically varying voltage.

There is further provided, in accordance with an embodiment of the present invention, a method of moving a body comprising: resiliently pressing a friction nub of a vibrator of a piezoelectric motor to the body, which vibrator has an axis of symmetry and wherein the friction nub has a center of mass displaced from the axis of symmetry; and energizing the piezoelectric motor to excite a vibration mode that generates oscillatory motion of mass points in the vibrator parallel to the axis of symmetry.

There is further provided, in accordance with an embodiment of the present invention, a method of moving a body comprising: resiliently pressing a friction nub of a vibrator of a piezoelectric motor having a vibration mode that generates torque in the friction nub; and energizing the piezoelectric motor to excite the vibration mode that generates the torque in the friction nub.

BRIEF DESCRIPTION OF FIGURES

The invention will be more clearly understood from the following description of embodiments thereof read with reference to the figures that are attached hereto. In the figures, identical structures, elements or parts that appear in more than one figure are generally labeled with the same numeral in all the figures in which they appear. Dimensions of components and features shown in the figures are chosen for convenience and clarity of presentation and are not necessarily shown to scale. The figures are listed below.

DETAILED DESCRIPTION OF EMBODIMENTS

Figure 1A:
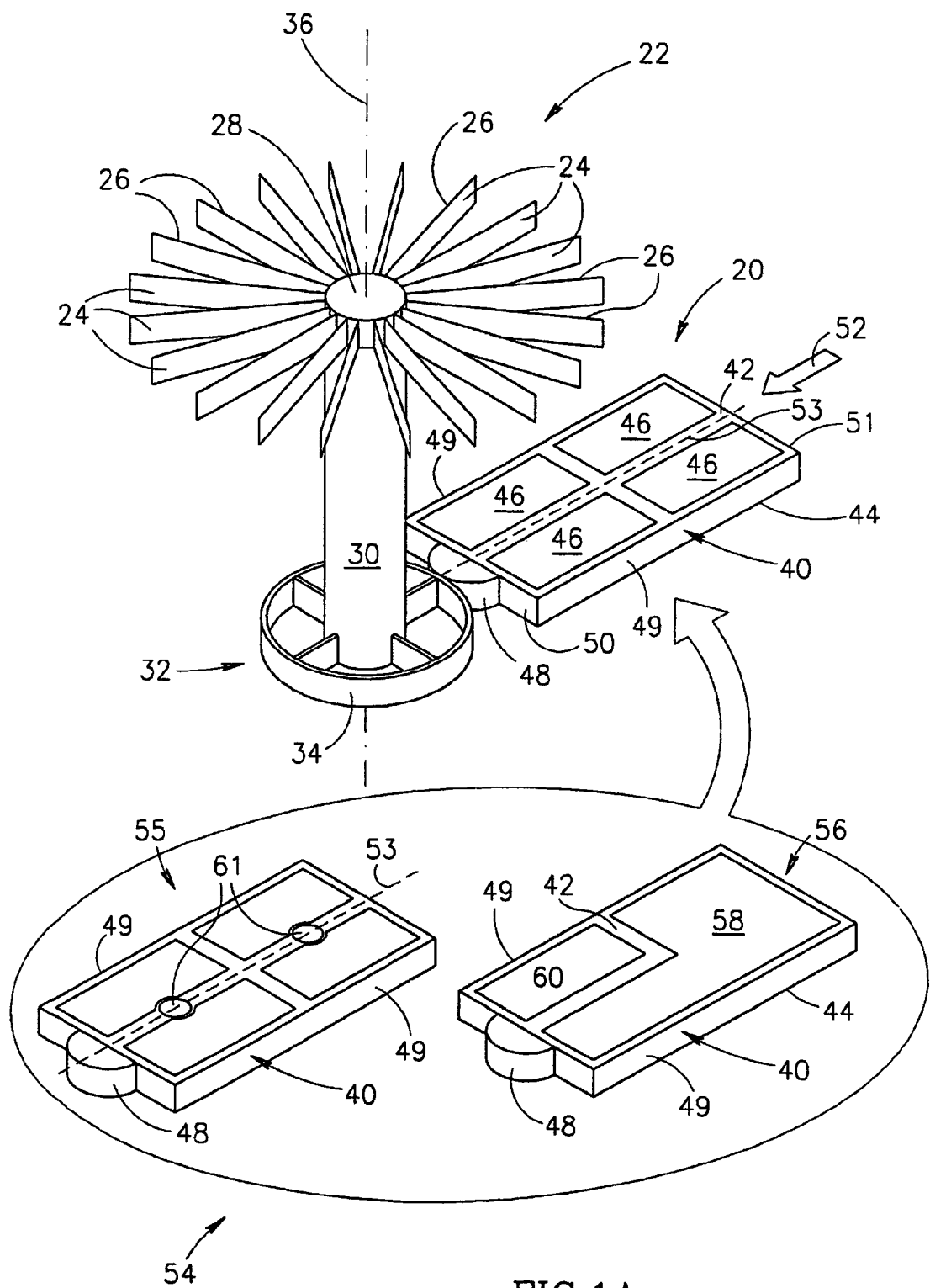
FIGS. 1A–1D schematically show a rotary blade head of a shaver coupled to at least one piezoelectric motor, in accordance with an embodiment of the present invention.

FIG. 1A schematically shows a piezoelectric motor 20 coupled to a rotary blade head 22 of a shaver. Rotary blade head 22 optionally comprises a plurality of cutting blades 24, having cutting edges 26, that are attached to a hub 28. Each of cutting edges 26 optionally extends from a point at or near to hub 28 in a general radial direction away from hub 28. Cutting edges 26 in FIG. 1A and figures that follow are shown as straight and extending radially from hub 28 by way of example and for convenience of presentation. Cutting edges 26, in accordance with embodiments of the present invention, may have shapes different from those shown and such different shapes can be advantageous. Cutting edges 26 may be formed in any of many shapes known in the art and may, for example, be straight and extend away from hub 28 in directions that are angled with respect to radial directions or they may be curved.

Rotary blade head 22 is mounted in the shaver so that cutting edges 26 of cutting blades 24 are positioned close to a perforated foil (not shown) of the shaver. A shaft 30 preferably connects rotary blade 22 to a "coupling" wheel 32 having a circularly cylindrical surface 34 which functions as a coupling surface for rotary blade head 22. Shaft 30, cylindrical surface 34 and rotary blade head 22 have a common axis of rotation indicated by a dashed line 36.

Piezoelectric motor 20 is optionally of a type described in U.S. Pat. No. 5,616,980 or PCT Application PCT/IL99/00288, referenced above, or variants thereof. By way of example, and for convenience of presentation, piezoelectric motor 20 in FIG. 1 and piezoelectric motors shown in the other figures are similar to types of piezoelectric motors shown in U.S. Pat. No. 5,616,980. Other piezoelectric motors known in the art may be substituted for the types shown.

Piezoelectric motor 20 optionally comprises a thin rectangular piezoelectric vibrator 40 having long edge surfaces 49, short edge surfaces 50 and 51 and a top planar "face" surface 42 and a bottom planar "face" surface 44. A long axis 53 of piezoelectric motor 20, shown as a dashed line, passes through the centers of short edge surfaces 50 and 51 parallel to long edges 49 of the piezoelectric motor. Top surface 42 optionally comprises four quadrant electrodes 46 that are located in a symmetric checkerboard pattern on top face surface 42. A single large electrode, not shown, is located on bottom surface 44. Piezoelectric motor 20 optionally comprises a friction nub 48 on short edge surface 50, preferably located at the center of the edge. A resilient force represented by a block arrow 52 is applied to piezoelectric motor 20 using methods known in the art to press friction nub 48 to coupling surface 34.

When the shaver is in use, an AC voltage difference from an appropriate driving circuit (not shown) is preferably applied between the large electrode and two quadrant electrodes 46 that are diagonally opposite each other. In some embodiments of the present invention the other two quadrant electrodes 46 may be either floating or grounded. Optionally, the driving circuit is similar to a type of driving circuit described in PCT Application PCT/IL99/00520, referenced above, and the diagonal electrodes that are not electrified with respect to the large electrode are either short circuited to the large electrode or connected to the large electrode via a capacitor. Electrifying electrodes 46 using the methods described in the PCT/IL99/00520 improves the efficiency and quality of operation of piezoelectric motor 20.

It should be noted that electrodes 46 may be electrified, in accordance with embodiments of the present invention, in other than the "diagonal" electrification configurations described above or using other driving circuits. Furthermore, voltage differences applied between electrodes 46 and the large electrode may, in accordance with embodiments of the present invention, have other than AC harmonic waveforms. For example, the waveforms may be pulsed triangular waveforms and/or unipolar waveforms and three electrodes 46 may be electrified simultaneously to generate appropriate vibrations in piezoelectric motor 20. Different electrode electrification configurations and voltage waveforms are described in U.S. Pat. No. 5,616,980 referenced above.

The applied AC voltage excites longitudinal and transverse vibration modes in vibrator 40 that generate elliptical motion of friction nub 48, which elliptical motion rotates coupling surface 34 and thereby cutting blades 24 rapidly about axis of rotation 36. The radius of coupling surface 34 is determined so that, at a linear velocity at which friction nub 48 moves relative to coupling surface 34, rotary blade head 22 rotates with a desired angular velocity. The foil (not shown) of the shaver behind which cutting blades 24 are located is pressed to and moved over a region of skin to be shaved. Hairs that poke through perforations in the foil are cut off by the rapidly moving cutting blades 24.

Quadrant electrodes 46 in the configuration shown in FIG. 1 can be electrified using any of the electrification schemes noted above to generate both clockwise and counter clockwise elliptical vibrations in piezoelectric motor 20, which rotate coupling wheel 32 and cutting blades 24 respectively counterclockwise and clockwise. In the case where diagonal electrode pairs are used to generate the elliptical vibrations, the direction of the elliptical motion depends upon which two diagonally opposite electrodes 34 are electrified. In general however, it is sufficient and desirable for the purposes of shaving to rotate cutting blades 24 in one direction only.

Therefore, in some embodiments of the present invention, piezoelectric motor 20 has an electrode configuration that enables generating elliptical motion in friction nub 48 in one direction only. Inset 54 in FIG. 1 shows a piezoelectric motor 56 similar to piezoelectric motor 20 that has an electrode configuration that enables excitation of elliptical motion in friction nub 48 in only one direction. In piezoelectric motor 56 top planar face surface 42 has a three-quarter electrode 58 and a quadrant electrode 60 instead of four quadrant electrodes 46. As in piezoelectric motor 20, piezoelectric motor 56 has a large electrode (not shown) on bottom planar face surface 44. When operating piezoelectric motor 56, an AC voltage is applied between three-quarter electrode 58 and the large electrode. Quadrant electrode 60 may be floating, grounded or connected to the large electrode. Voltage applied between three-quarter electrode 58 and the large electrode generates only counter clockwise elliptical vibrations in friction nub 48. Quadrant electrode 60 is used only during manufacture of piezoelectric motor 56 to set the polarization of piezoelectric motor 56. A three-quarter electrode 58, in accordance with an embodiment of the present invention, can be formed on piezoelectric motor 56 with quadrant electrode 60 located in any one of the four quadrant positions of a quadrant electrode 46 shown on piezoelectric motor 20. When electrified, configurations of a three-quarter electrode 58 and a quadrant electrode 60 on a motor 56 that have their respective quadrant electrodes located along a same edge of planar face surface 42, excite elliptical vibrations in opposite directions.

In some embodiments of the present invention three-quarter electrode 58 may cover less than three-quarters of planar face surface 44 and may have a shape different from the L shape of electrode 58 shown in inset 54. Any electrode that covers substantially all of the area covered by the area covered by the legs of L shaped electrode 58 will excite elliptical vibrations in friction nub 48 in the same direction as electrode 58. Preferably, the area of the electrode is substantially larger than the area of two quadrant electrodes 46. In some embodiments of the present invention, electrode 58 is shaped to optimize correspondence between the shape of electrode 58 and an energy distribution of a vibration mode of the motor that electrode 58 is used to excite.

It should be noted of course that three quadrant electrodes 46 of piezoelectric motor 20 can be electrically connected and electrified to excite vibrations in piezoelectric motor 20 in the same way that three-quarter electrode 58 excites vibrations in piezoelectric motor 56. In some embodiments of the present invention three quadrant electrodes are connected by a switching circuit and different sets of three quadrant electrodes are electrified to generate clockwise and counterclockwise elliptical vibrations. The advantage of using three quadrant electrodes or a three-quarter electrode having a size larger than two quadrant electrodes to excite vibrations, is that the motor may provide more power for a same applied voltage than when only two quadrant electrodes are used to excite the vibrations.

(The excitation of vibrations in a piezoelectric motor similar to piezoelectric motor 20 by electrifying more than two quadrant electrodes is known in the art and is described for example in U.S. Pat. No. 5,616,980. However, in prior art electrification schemes in which more than two quadrant electrodes are electrified, at least one of the electrified quadrant electrodes is electrified with a voltage different from the others.)

An electrode configuration comprising a three-quarter electrode 58 and a quadrant electrode 60 has been shown in FIG. 1A for a piezoelectric motor comprising a vibrator formed as a single thin rectangular plate. Such an electrode configuration is also useable, in accordance with embodiments of the present invention, as an electrode configuration on at least one layer of a multilayer piezoelectric motor of a type, for example, described in PCT Application PCT/IL99/00288. Furthermore, whereas the three-quarter electrode 58 and quadrant electrode 60 configuration has been described with reference to piezoelectric motors shown in FIGS. 1A and 1B, such an electrode configuration is useable on a piezoelectric motor in all embodiments of the present invention in which blade heads are rotated in one direction.

In some embodiments of the present invention at least one hole is formed in vibrator 40 of piezoelectric motor 20 or 56. The at least one hole optimizes the amount by which excitation curves of longitudinal and transverse vibration modes in vibrator 40 that are used to generate elliptical motion of friction nub 48 overlap. The optimized overlap improves the efficiency of operation of piezoelectric motor.

Inset 54 schematically shows a piezoelectric motor 55 similar to piezoelectric motor 20 having holes 61 formed in vibrator 40 to improve the efficiency of operation of the piezoelectric motor. Piezoelectric motor 55 is assumed, by way of example, to operate by exciting a first longitudinal resonant vibration mode and a second transverse vibration mode of vibrator 40. Holes 61 are located along axis 53 at antinodes of the second transverse vibration mode. Whereas holes 61 are shown formed in piezoelectric motor 55, which has a "four quadrant" electrode configuration, holes 61 may of course be used with other electrode configurations, such as that shown for motor 56, that are used to simultaneously excite longitudinal and transverse vibration modes in a piezoelectric vibrator.

Figure 1B:
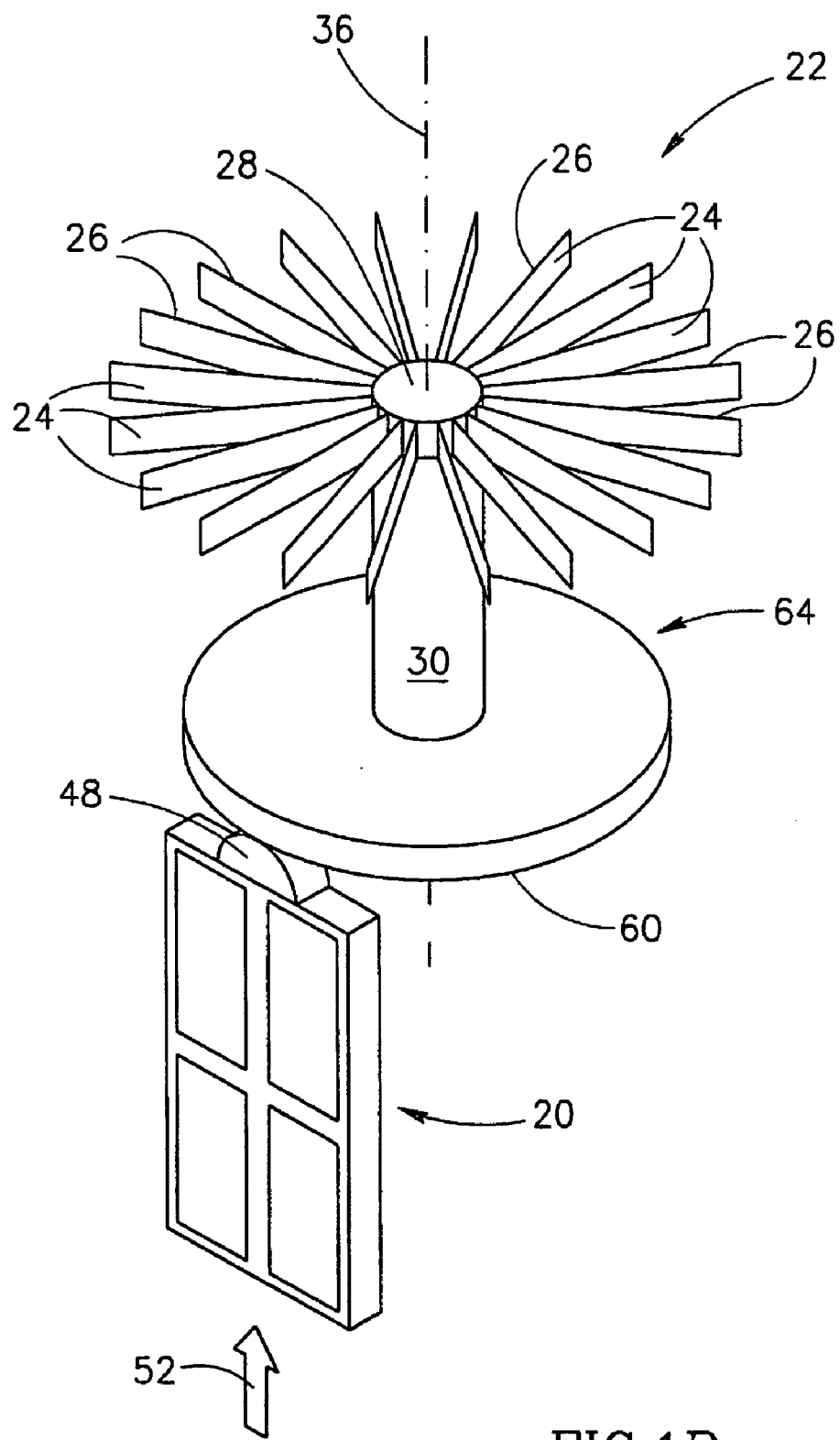

FIG. 1B schematically shows an alternate method of coupling at least one piezoelectric motor 20 to rotary blade head 22, in accordance with an embodiment of the present invention. In FIG. 1B a shaft 30 connects rotary blade head 22 to a "coupling" disc 64. A resilient force represented by block arrow 52 urges piezoelectric motor 20 in a direction so that friction nub 48 presses against a region of a bottom surface 66 of coupling disc 64. Vibrations of friction nub 48 exert a torque on coupling disc 64 that rotates the disc and rotary blade head 22. Whereas FIG. 1B shows a piezoelectric motor 20 coupled to coupling disc 64, any of the piezoelectric motors shown in FIG. 1A or appropriate variations thereof (such as multilayer piezoelectric motors described in PCT Application PCT/IL99/00288), or other motors known in the art may be similarly coupled to coupling disc 64.

Figure 1C:
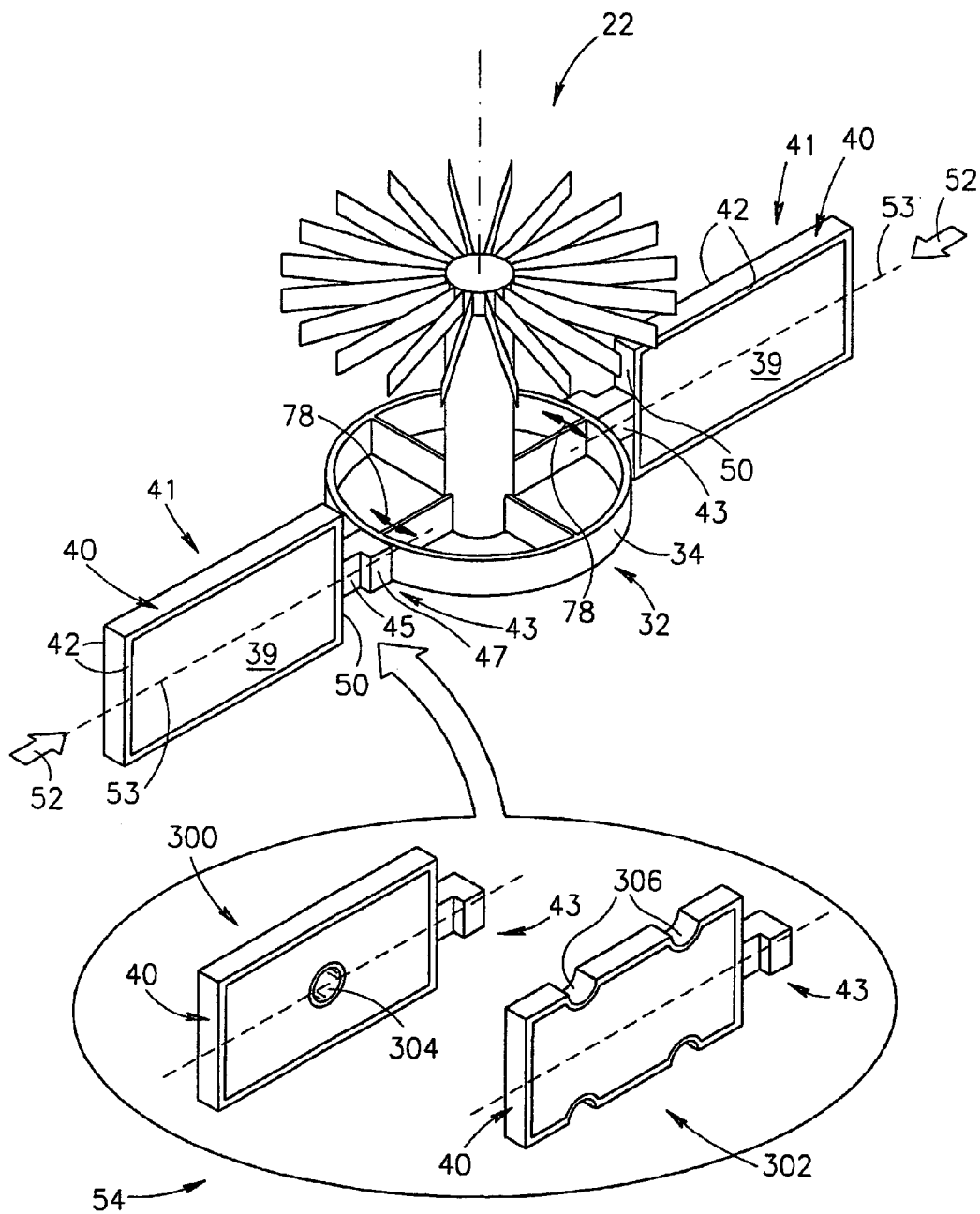

FIG. 1C schematically shows blade head 22 coupled to two piezoelectric motors 41 in accordance with an embodiment of the present invention. Each of piezoelectric motor 41 comprises a thin rectangular vibrator 40 having large planar face surfaces 42 and a long axis 53 shown with a dashed line. A friction nub 43 is, optionally, mounted to a short edge 50 of the piezoelectric vibrator so that the center of mass of the friction nub is offset from axis 53. Preferably, friction nub 43 is situated at the center of short edge 50 and the offset of its center of mass is caused by an asymmetric shape of friction nub 43 with respect to axis 53. In FIG. 1C friction nub 43 is L shaped and comprises a stem 45 that extends parallel to axis 53 and a head 47 that extends to one side of axis 53, preferably at right angles to axis 53. Head 47 generates an asymmetry in friction nub 43 with respect to axis 53 that shifts the center of mass of friction nub 43 away from axis 53 in a direction perpendicular to the planes of face surfaces 42 of vibrator 40. A resilient force 52 operates on piezoelectric motor 41 to press friction nub 43 to coupling surface 34 of coupling wheel 32.

Preferably a single large electrode 39 is located on each planar face surface 42 of piezoelectric vibrator 41. When electrodes 39 are electrified by an appropriate AC voltage, a resonant longitudinal vibration mode is excited in vibrator 40 that moves friction nub 43 back and forth parallel to axis 53. Because the center of mass of friction nub 43 is displaced from axis 53, accelerations caused by the reciprocating motion generate torque on friction nub 43. The torque excites a bending vibration mode in friction nub 43 that moves friction nub 43 back and forth in directions indicated by double arrowhead line 78 perpendicular to the planes of face surfaces 42. Preferably, the bending vibration mode of friction nub 43 has a frequency close to the frequency of the longitudinal vibration mode excited by the AC voltage. The longitudinal motion along axis 53 and the back and forth vibration excited by the asymmetry of friction nub 43 combine to cause a motor coupling surface of friction nub 43 to vibrate with an elliptical motion that rotates coupling wheel 32 and blade head 22.

Elliptical motion of a (symmetrical) friction nub on edge 50 can also be excited by positioning the friction nub on edge 50 so that its center of mass is displaced from axis 53. The displacement generates a torque on vibrator 40 that excites a transverse vibration mode in vibrator 40 perpendicular to axis 53. The longitudinal motion along axis 53 and the transverse vibration mode combine to cause the friction nub to vibrate with an elliptical motion parallel to the planes of face surfaces 42. The elliptical motion can be used to rotate coupling wheel 32 if piezoelectric motor 41 is rotated 90° about axis 53. Energy coupling to a particular direction of an elliptical motion of the friction nub may also be induced and/or enhanced by mitering a corner of the vibrator.

Piezoelectric motor 41 operates most efficiently when electrification of large electrodes 39 excites only a single desired longitudinal resonant vibration of piezoelectric vibrator 40. In some piezoelectric motors 41, in accordance with embodiments of the present invention, at least one hole is formed in the body of vibrator 40 and/or at least one groove is formed on a narrow edge surface of vibrator 40. The at least one hole and/or at least one groove is formed to remove or reduce overlap that the excitation curve of the desired longitudinal frequency may have with an excitation curve of another resonant vibration mode of the vibrator. By reducing such overlap, energy coupled to unwanted vibration modes of vibrator 40 is reduced and efficiency of operation of piezoelectric motor 41 is improved.

Inset 54 of FIG. 1C schematically shows piezoelectric motors 300 and 302 that are identical to piezoelectric motor 41 except for a hole 304 and grooves 306 formed in or on their respective vibrators 40. Piezoelectric motors 300 and 302 are assumed, by way of example, to operate by exciting a first longitudinal and second transverse vibration mode of vibrator 40. A hole 304 located on axis 53 at a node of the second transverse vibration mode of piezoelectric vibrator 300 diverges the excitation curves of the two resonant vibration modes. Hole 304 is preferably located at the center of vibrator 40, which is a nodal region of the second resonant vibration mode of vibrator 40. Grooves 306, optionally, in pairs located on opposite long edges of vibrator 40, also diverge the excitation curves of the resonant vibrations. The pattern of holes and grooves on piezoelectric motors 300 and 302 are by way of example and other patterns, in accordance with other embodiments of the present invention, are possible and can be advantageous.

Figure 1D:
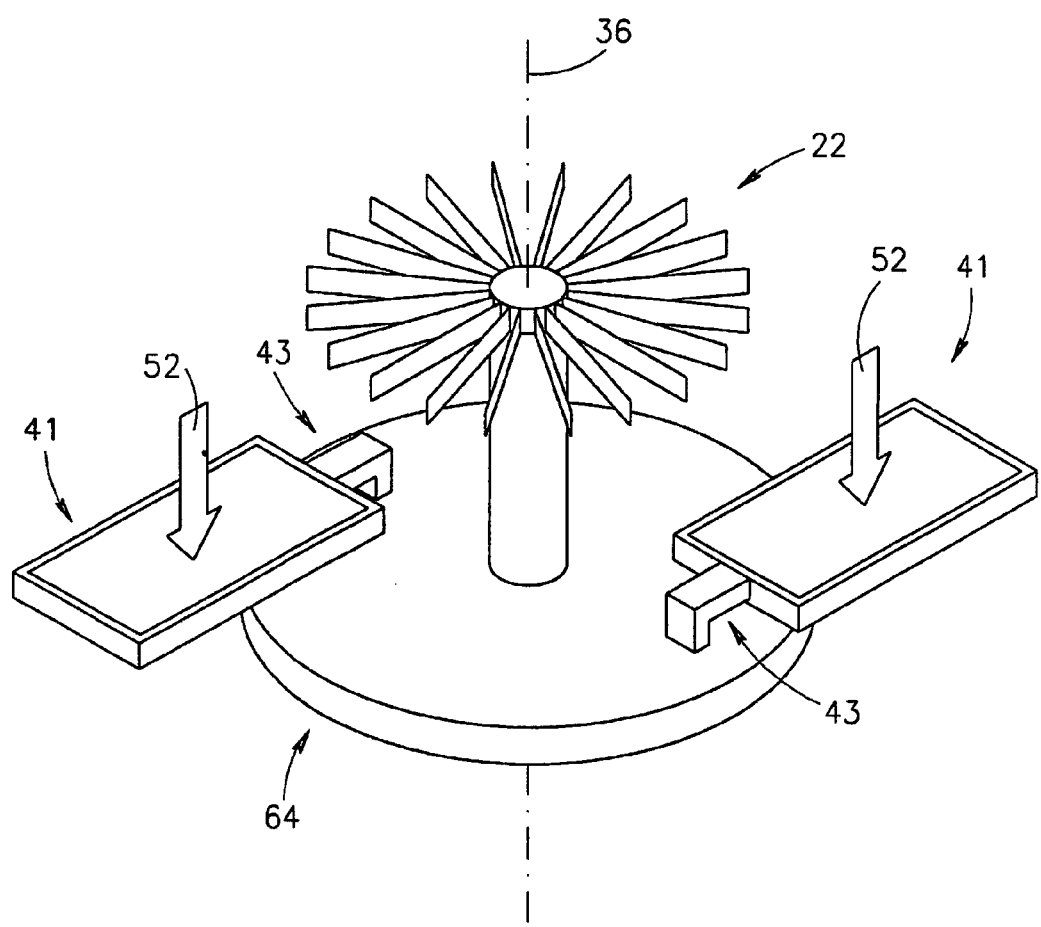

FIG. 1D schematically shows another method for coupling motors 41, or variations thereof, to a blade head 22. In FIG. 1D piezoelectric motors 41 are coupled to a surface region of a coupling disc 64. A force 52 generated using methods known in the art operates on each piezoelectric motor 41 to resilient press its friction nub 43 to the surface of coupling disc 64. The motion of friction nubs 43 is similar to the motion of friction nubs 43 shown in FIG. 1C and coupling disc 64 and blade head 22 are rotated around axis 36.

Figure 1E:
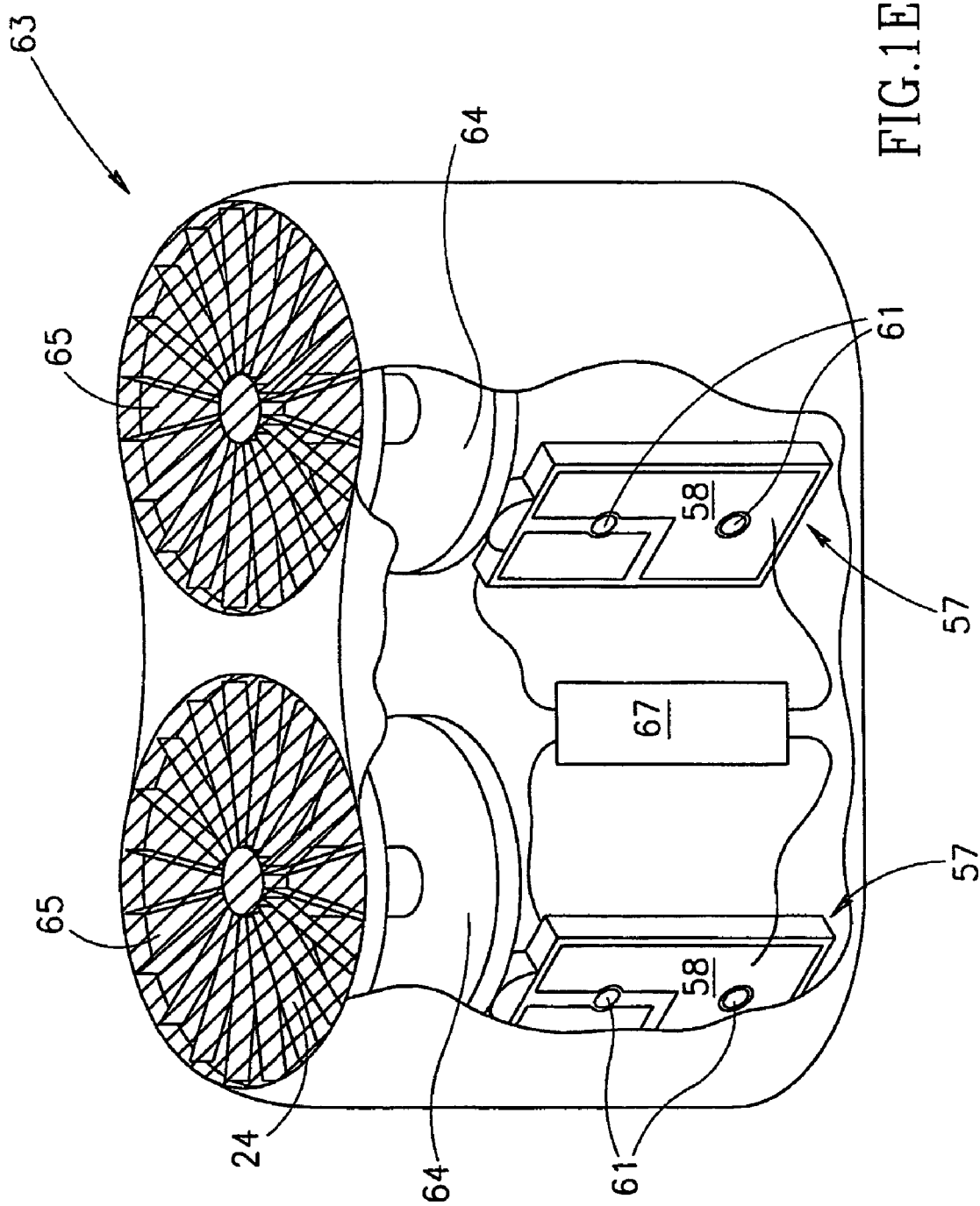
FIG. 1E schematically shows a partial cutaway view of a shaver comprising two rotary blade heads of a type shown in FIGS. 1A–1C, in accordance with an embodiment of the present invention.

FIG. 1E schematically shows a partial cutaway view of a shaver 63 comprising two rotary blade heads 22. Each rotary blade head 22 is mounted so that its cutting blades 24 rotate directly beneath a foil 65 of shaver 63. Cutting blades 24 are shown as seen through foils 65. In some embodiments of the present invention, each of rotary blade heads 22 is connected to a coupling disc 64, as shown in FIG. 1B, and is optionally driven by a piezoelectric motor 57 similar to piezoelectric motor 56 shown in inset 54 of FIG. 1A. Piezoelectric motor 57 is identical to piezoelectric motor 56 except for holes 61 that are formed in the body of the motor's vibrator to improve the efficiency of the motor and slight modifications to electrodes 58 and 60 required to accommodate the holes. A driving circuit 67 electrifies three-quarter electrodes 58 of both piezoelectric motors 57 comprised in shaver 63 to rotate blade heads 22.

FIGS. 2A–2E schematically show various configurations of rotary blade heads of a shaver (not shown) coupled to piezoelectric motors, in accordance with embodiments of the present invention.

Figure 2A:
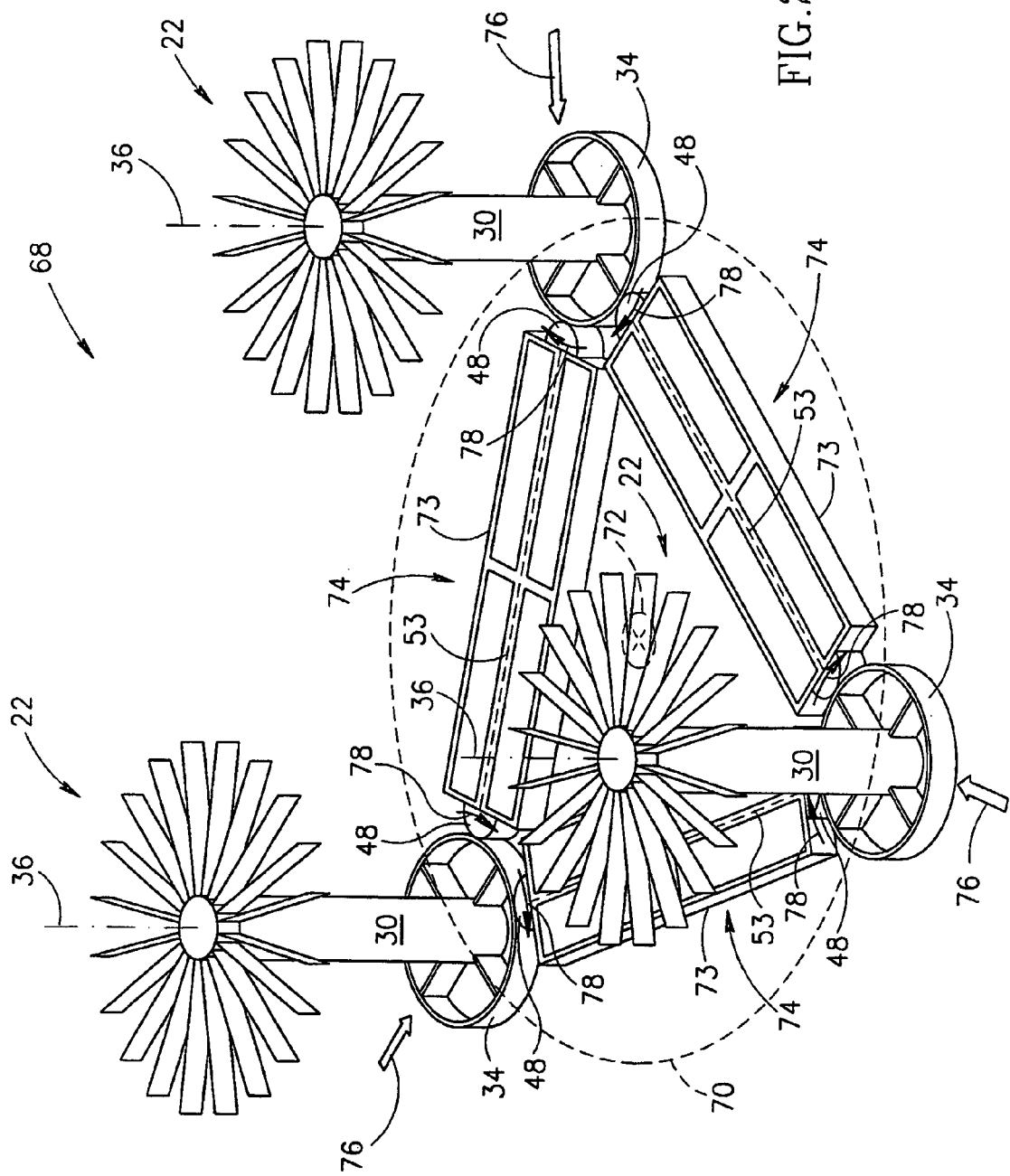
FIGS. 2A–2E schematically show various configurations of multiple rotary blade heads coupled to piezoelectric motors, in accordance with embodiments of the present invention.

FIG. 2A shows a rotary blade configuration 68 comprising three rotary blade heads 22. In some embodiments of the present invention rotary blade heads 22 are mounted in the shaver using methods known in the art so that their respective axes of rotation 36 are parallel and equidistant from each other. Points of intersection of the axes 36 with a common plane perpendicular to the axes therefore define vertices of an equilateral triangle, which is inscribed in a configuration circle 70 of blade heads 22. The equilateral triangle is a convex equilateral configuration polygon of blade heads 22. The center of configuration circle 70 is indicated by a circled cross hair 72.

A piezoelectric motor 74 is mounted between each pair of blade heads 22. Piezoelectric motors 74 are, optionally, similar to piezoelectric motors shown in FIGS. 1A–1E or variants thereof and each piezoelectric motor 74 comprises a relatively thin piezoelectric vibrator 73. However, each piezoelectric motor 74 comprises two friction nubs 48 instead of, as in piezoelectric motors shown in FIGS. 1A–1E, only one friction nub 48. Long axis 53 of each piezoelectric motor 74 is preferably coincident with a chord of configuration circle 70 and substantially intersects axes of rotation 36 of the two rotary blade heads 22 between which the piezoelectric motor is located. Each friction nub 48 of a piezoelectric motor 74 contacts a cylindrical coupling surface 34 of a different one of blade heads 22 between which the piezoelectric motor is mounted. A resilient force, represented by a block arrow 76, urges axis of rotation 36 of each blade head 22 towards center 72 of configuration circle 70.

Forces 76 are generated using methods known in the art and their magnitudes are substantially equal. Each coupling surface 34 is thereby resiliently pressed with a substantially same magnitude force to each of friction nubs 48 with which it is in contact. Preferably, each piezoelectric motor 74 is secured in place by structural elements that grasp the piezoelectric motor at nodal points of its vibrator 73. In some embodiments of the present invention long axis 53 is slightly displaced or rotated from the chord of the circle. The displacement generally tends to decrease wear of friction nubs 48 and may improve transfer of energy to blade heads 22.

In order to rotate a rotary blade head 22 both piezoelectric motors 74 that are coupled to coupling surface 34 of the rotary blade head must cooperate to rotate the coupling surface in the same clockwise or counterclockwise direction. In some embodiments of the present invention, this is accomplished by electrifying electrodes of piezoelectric motors 74 to excite a same vibration mode in all the motors. When a piezoelectric motor 74 is excited, its two friction nubs vibrate with elliptical motions in a same clockwise or counterclockwise direction. The phases of their respective vibrations are however 180° out of phase. As a result, each piezoelectric motor 74 rotates the two coupling surfaces 34 to which it is coupled in a same counterclockwise or clockwise direction respectively. Therefore, if all piezoelectric motor 74 are excited to vibrate with a same vibration mode, they all rotate the coupling surfaces to which they are coupled in a same direction.

Whereas all piezoelectric motors 74 are optionally excited to vibrate with a same vibration mode, in some embodiments of the present invention, vibration modes in piezoelectric motors 74 coupled to a same coupling surface 34 are out of phase with each other. As a result, each of piezoelectric motors 74 that is coupled to a same coupling surface 34 rotates the coupling surface at different times. Torque applied to the coupling surface 34 by the piezoelectric motors 74 is applied in more frequent impulses than in a case in which both piezoelectric motors 74 rotate the coupling surface simultaneously. Energy is transmitted from piezoelectric motors 74 to each coupling surface 34 and its rotary blade head 22 generally more smoothly than if vibration modes in piezoelectric motors 74 are in phase.

In FIG. 2A it is assumed that piezoelectric motors 74 are excited so that each of friction nubs 48 executes counterclockwise elliptical vibrations. The direction in which a friction nub 48 rotates a coupling surface 34 to which it is coupled is indicated by the direction of an arrow 78 that is located near the friction nub.

Figure 2B:
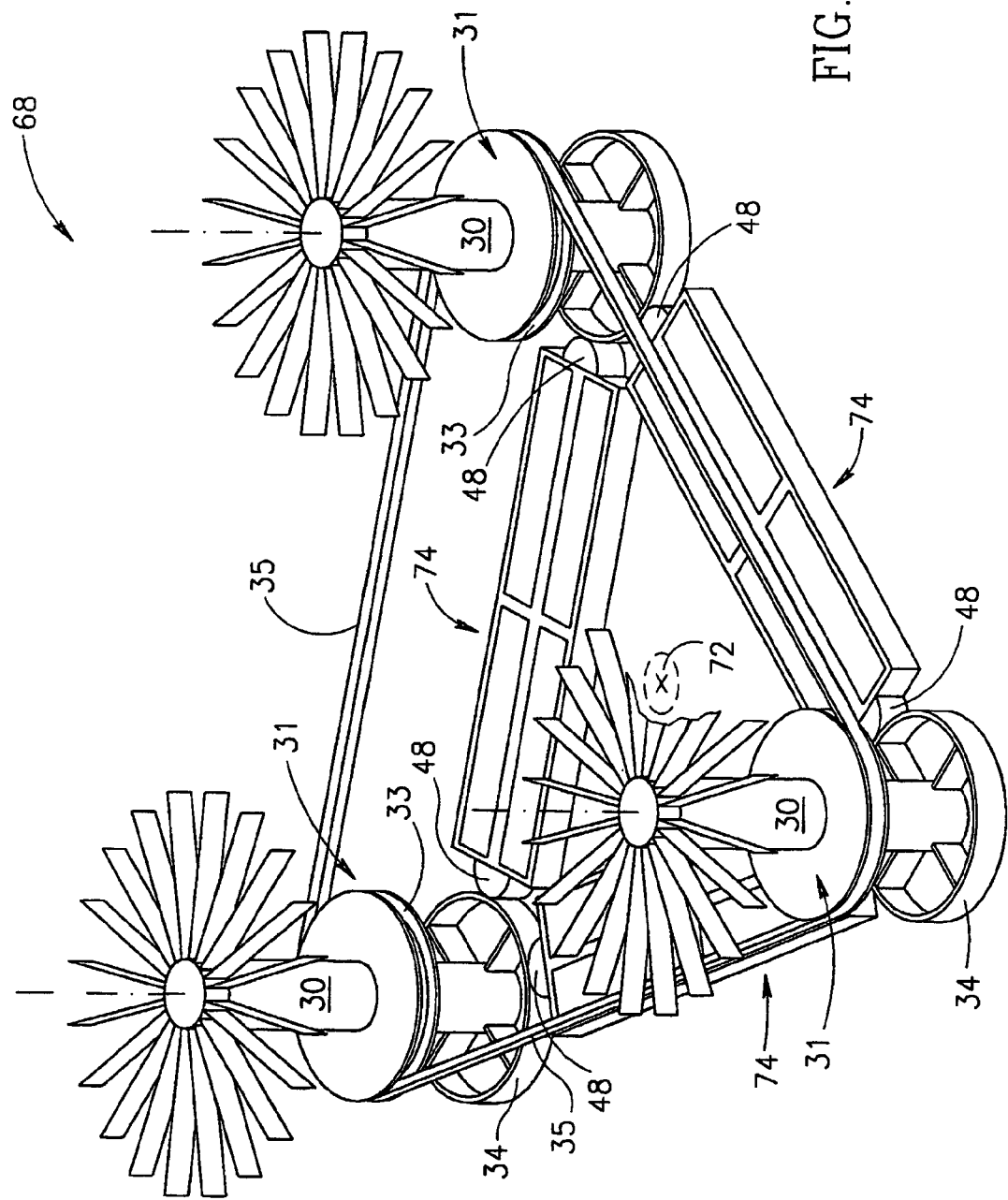

FIG. 2B shows configuration 68 shown in FIG. 2A comprising apparatus for generating forces 76 that press axes of rotation 36 towards center 72 of configuration circle 70, in accordance with an embodiment of the present invention. In FIG. 2B, each shaft 30 is mounted in the shaver using methods known in the art that enable the shaft to slide or bend in a radial direction towards center 72. Each shaft 30 is mounted with a bearing 31 that is freely rotatable about the shaft on which the bearing is mounted. In some embodiments of the present invention, each bearing 31 has a grooved rim 33. A band or "O-ring" 35 formed from an elastic material is preferably stretched taught and positioned in grooves 33 so as to loop around all bearings 31 and generate forces 76. Alternative methods of generating forces 76 will readily occur to persons of the art. For example each of bearings 31 can be constructed with a rim having eyeholes close to its perimeter. Forces 76 are generated by tensed springs connected between adjacent bearing rims using the eyeholes. In some embodiments of the present invention grooves are formed in each of the shafts or in a circularly cylindrical surface rigidly attached to each shaft. As in the case in which shafts 30 are fitted with grooved bearings a stretched O-ring or elastic band is positioned to loop around all the grooves to generate forces 76. When piezoelectric motors 74 rotate shafts 30 the O-ring or elastic band rotates with the shafts in much the same way that a fan belt rotates around pulley wheels to which it is coupled in a car. In some embodiments of the present invention shafts 30 are flexible and a spring action of each shaft 30 generates a force 76 that maintains a flexible pressure on each of friction nubs 48 with which the shaft's coupling surface 32 is in contact.

Figure 2C:
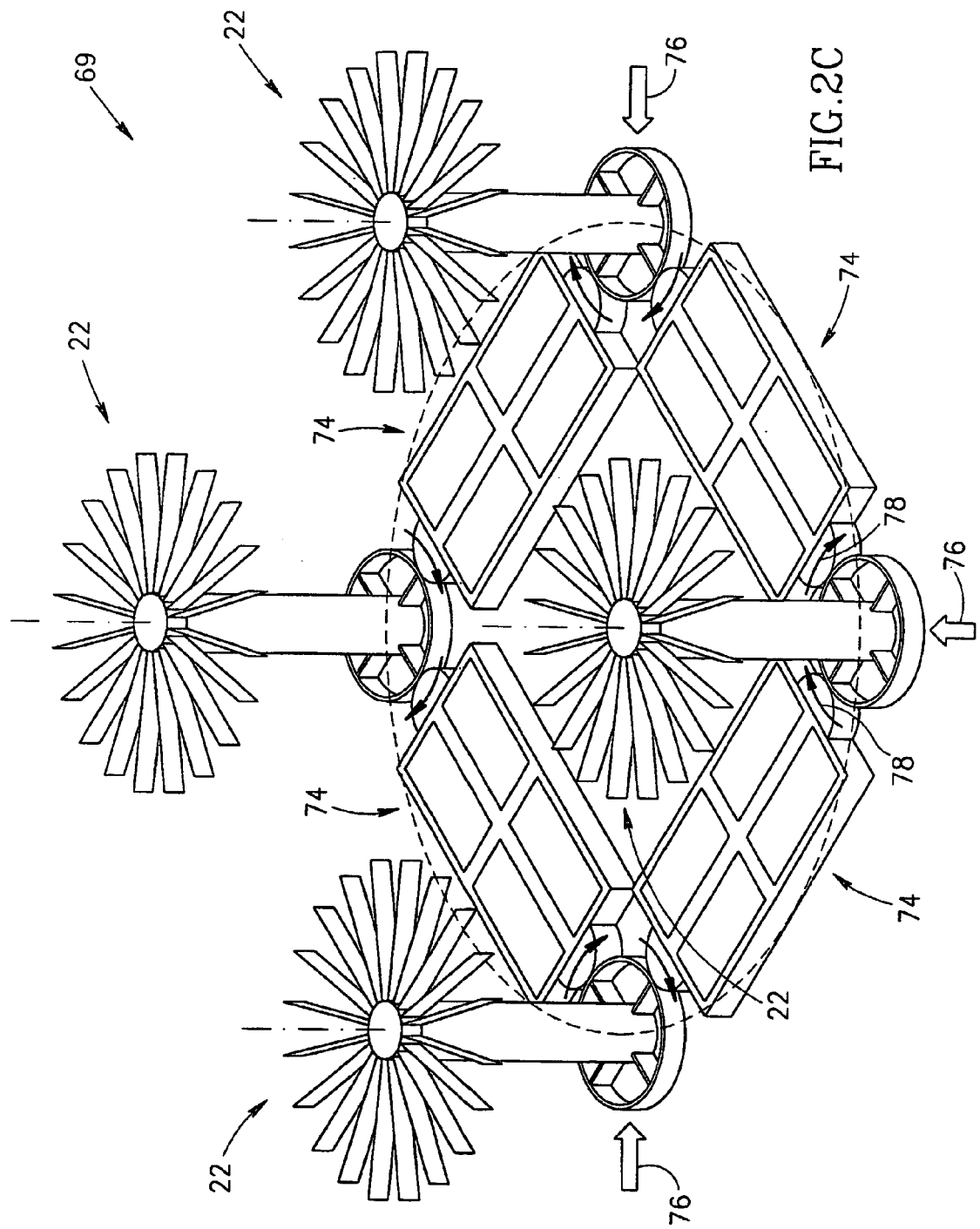
Figure 2D:
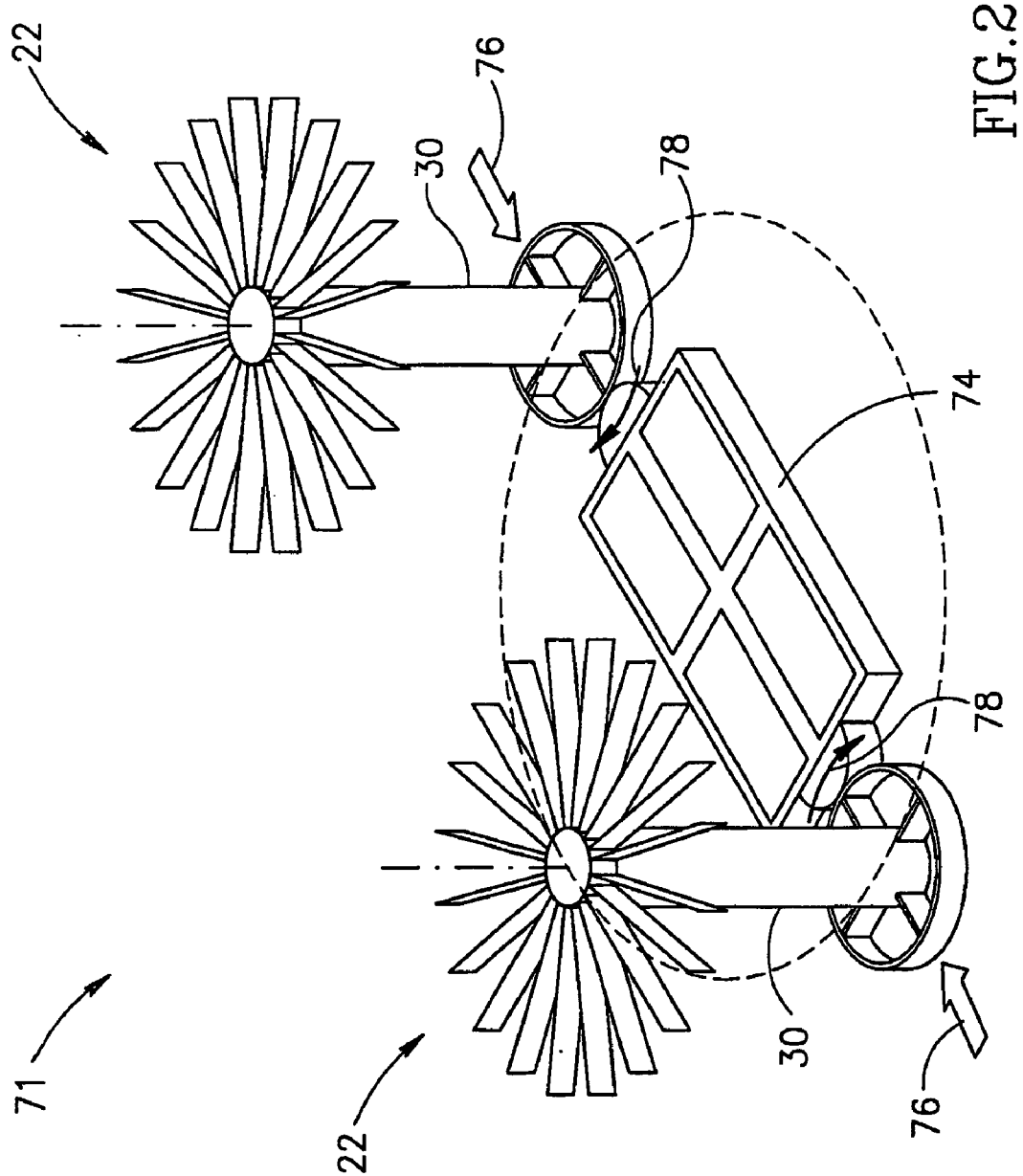

Whereas rotary blade configuration 68 comprises three rotary blade heads 22 and three piezoelectric motors 74, it is possible, in accordance with embodiments of the present invention, to have similar configurations with different numbers of rotary blade heads 22 and piezoelectric motors 74 and such configurations can be advantageous. Limited only by space, a configuration similar to configuration 68 can have any number of blade heads 22 interleaved with piezoelectric motors 74 on configuration circle 70. FIG. 2C shows a configuration 69 comprising four rotary blade heads 22 and FIG. 2D shows a configuration 71 comprising two rotary blade heads 22 interleaved with a single piezoelectric motor 74.

FIGS. 2A–2D schematically show symmetric configurations of blade heads 22 that have a convex equilateral polygon for a configuration polygon and thereby a configuration circle within which the configuration polygon is inscribed. Embodiments of the present invention are not limited to such highly symmetric configurations. Parallel axes of rotation 36 of a plurality of blade heads 22 can, in accordance with embodiments of the present invention, define vertices of a configuration polygon that is neither equilateral nor convex or that may be equilateral and not convex or convex and not equilateral.

Figure 2E:
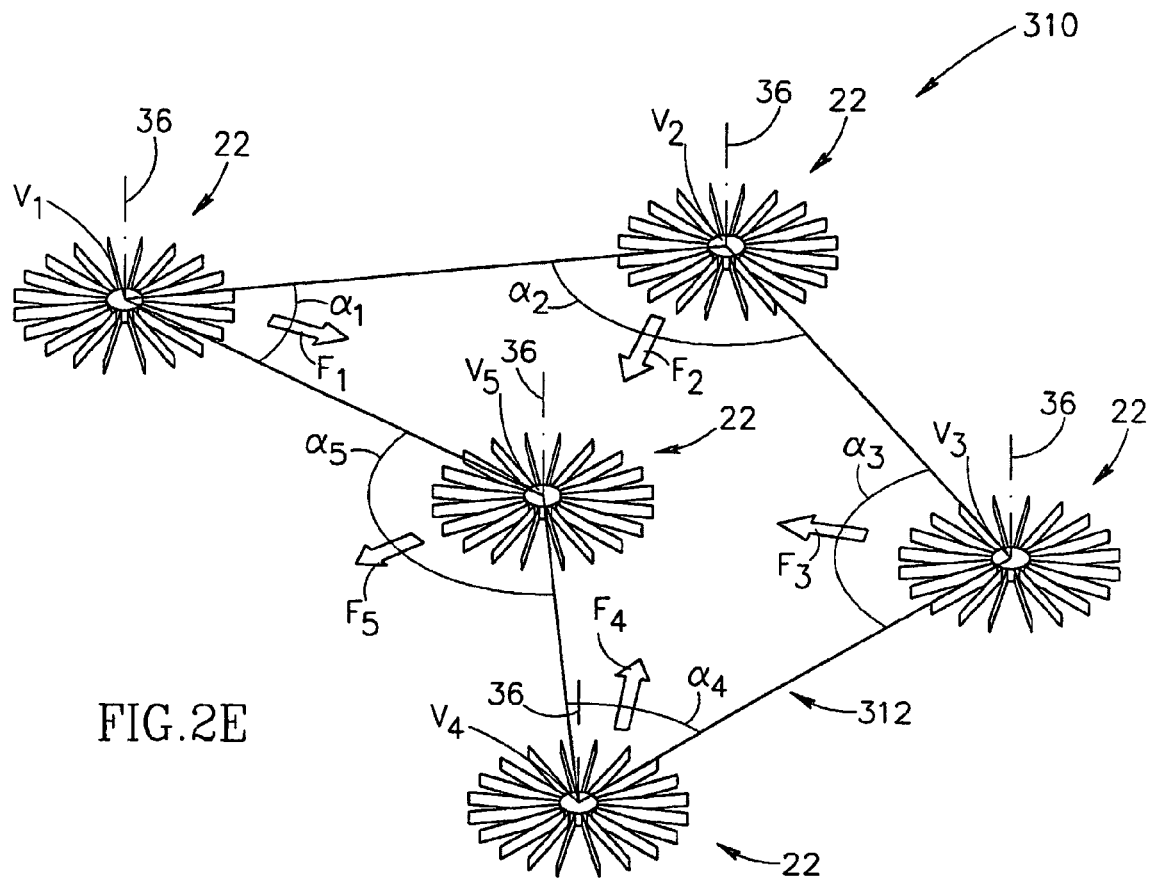

FIG. 2E schematically shows, by way of example a configuration 310 of five blade heads 22 having axes 36 that define a configuration polygon 312 having vertices labeled $V_1$–$V_5$. Polygon 312 is a non-convex equilateral pentagon. In FIG. 2E, besides polygon 312, for simplicity of presentation only blade heads 22 and their axes of rotation 36 are shown. As in FIGS. 2A–2D, at least one piezoelectric motor (not shown), optionally similar to piezoelectric motor 76 (FIGS. 2A–2D), is mounted between each pair of adjacent blade heads 22. Each of two friction nubs on the at least one piezoelectric motor contacts a coupling surface of each blade head between which the piezoelectric motor is mounted. Preferably, a force operates to urge each axis 36 in a direction of the bisector of the smaller of the two angles defined by sides of configuration polygon 312 that meet at the vertex of polygon 312 at which the axis is located. The smaller of the two angles defined by adjacent sides of polygon 312 that meet at vertices $V_1$–$V_5$ are labeled respectively $\alpha_1$–$\alpha_5$. The forces that operate on axes 36 at vertices $V_1$–$V_5$ are indicated by block arrows labeled $F_1$–$F_5$ respectively. For a given set of angles $\alpha_1$–$\alpha_5$, magnitudes of forces $F_1$–$F_5$ can be readily be determined so that there is a net zero force operating on each axis of rotation 36. The magnitudes so determined result in each friction nub (not shown) of the at least one piezoelectric motor mounted between pairs of adjacent blade heads 22 being pressed with a same force to its respective coupling surface.

Whereas FIGS. 2A–2D show only one piezoelectric motor 74 between two rotary blade heads 22 it is possible, in accordance with embodiments of the present invention, to have more than one piezoelectric motor between two blade heads 22. Two or more piezoelectric motors 78 can be stacked vertically between any two rotary blade heads 22 and coupling wheels 32 can be made wider, or more coupling wheels 32 can be added, to couple rotary blade heads 22 to the added piezoelectric motors. This may be advantageous for example when rotary blade heads 22 are closely spaced and more power is required to drive them than can be provided by a single relatively small piezoelectric motor positioned between adjacent rotary blade heads.

The method of coupling piezoelectric motors 74 to rotary blade heads 22 shown in FIGS. 2A–2D tends to be efficient at extracting energy from piezoelectric motors to drive rotary blade heads 22. The only structural elements that are in contact with vibrating surface regions of piezoelectric motors 74 are shafts 30 that the piezoelectric motors are intended to move. Structural elements that secure a piezoelectric motor 74 in place preferably contact the piezoelectric motor at nodal regions of the motor so that little energy is transmitted to them from the motor. As a result, each piezoelectric motor 74 transmits energy substantially only to shafts 30 to which it is coupled.

This is in contrast to prior art systems in which a resilient structural element that presses a piezoelectric motor to a body that it moves generally contacts a surface region of the piezoelectric motor that vibrates when the motor is energized. The structural element therefore absorbs energy from the piezoelectric motor when the motor is operating and reduces the efficiency with which the motor moves the body to which it is coupled.

In some embodiments of the present invention, blade heads 22 rotate in only one direction and motors 74 are formed with a three-quarter electrode and a single quadrant electrode instead of four quadrant electrodes as shown in FIGS. 2A–2D. The use of three-quarter electrodes for exciting vibration modes in piezoelectric motors 74 generally further improves the efficiency with which energy is transmitted to blade heads 22 using configurations and methods shown in FIGS. 2A–2D.

Figure 2F:
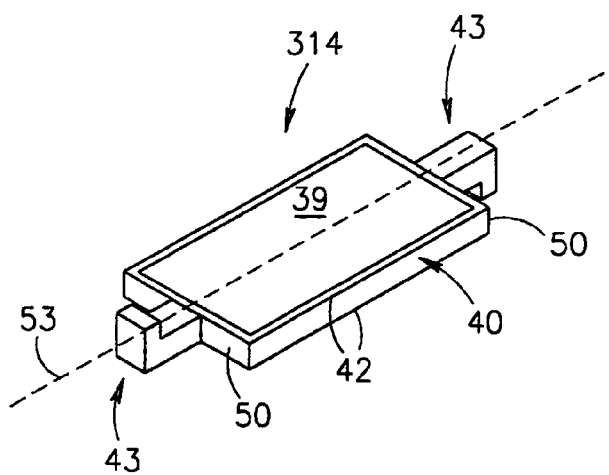
FIG. 2F schematically shows a piezoelectric motor useable to rotate rotary blade heads in configurations shown in FIGS. 2A–2E, in accordance with embodiments of the present invention.

In some embodiments of the present invention piezoelectric motors 76 are similar to a piezoelectric motor shown in FIGS. 1C and 1D that comprises an "asymmetric" friction nub 43, except that instead of comprising a single asymmetric friction nub the motor comprises two asymmetric friction nubs. FIG. 2F schematically shows a piezoelectric motor 314 similar to piezoelectric motors shown in FIGS. 1C and 1D. Piezoelectric motor 314 optionally comprises a relatively thin rectangular piezoelectric vibrator 40 having an axis 53 and optionally a single large electrode 39 on each of its planar face surfaces 42. In some embodiments of the present invention two asymmetric friction nubs 43 are mounted on opposite short edges 50 of vibrator 40. Asymmetric nubs 43 are preferably substantially identical and "point" in opposite directions with respect to axis 53. When longitudinal vibration parallel to axis 53 are excited in piezoelectric vibrator 40, friction nubs 43 execute elliptical oscillations in the same direction (i.e. both elliptical motions are either clockwise or counterclockwise) that are 180° out of phase.

Figure 3A:
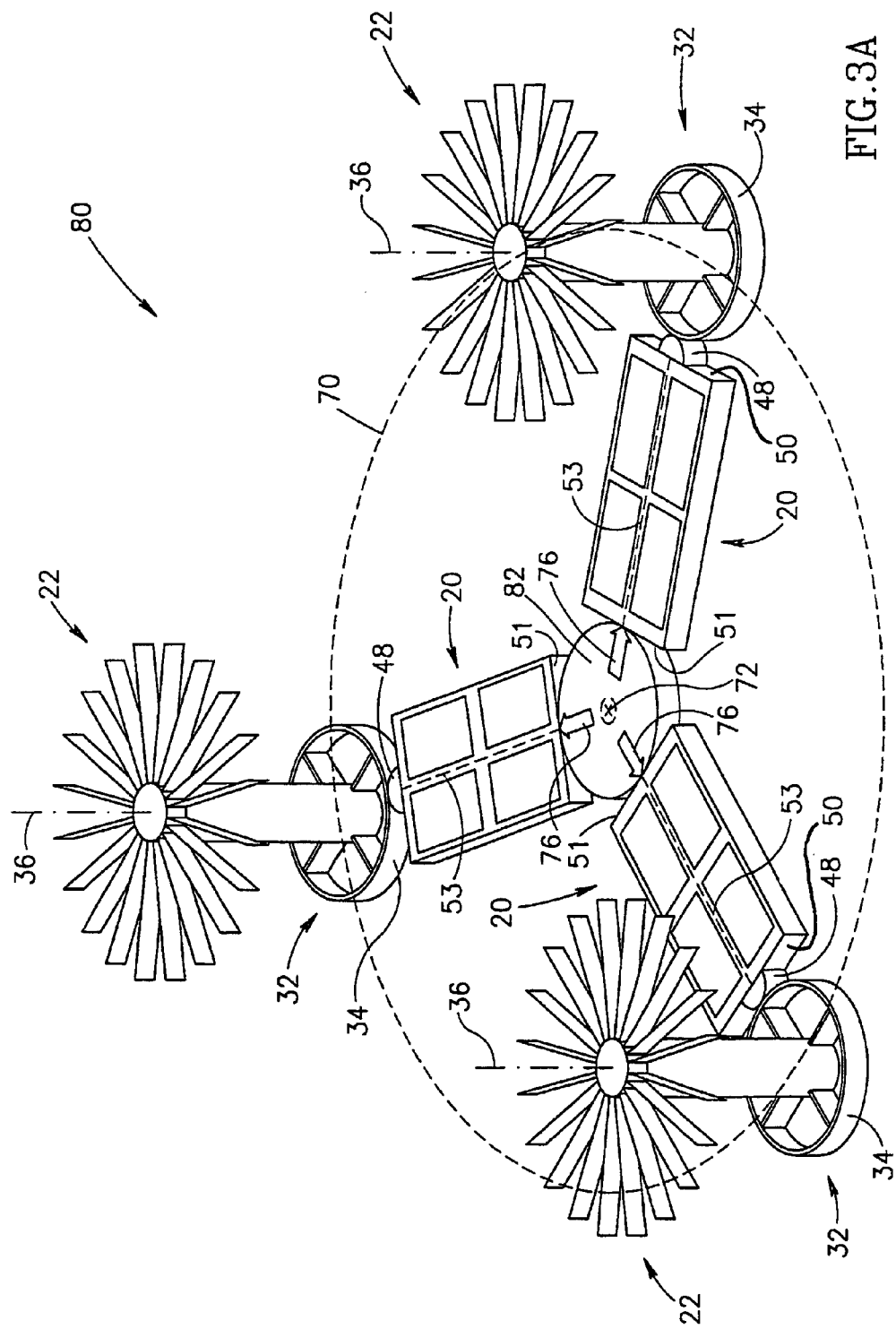
FIGS. 3A and 3B schematically show various configurations of three rotary blade heads coupled to piezoelectric motors, in accordance with embodiments of the present invention.
Figure 3B:
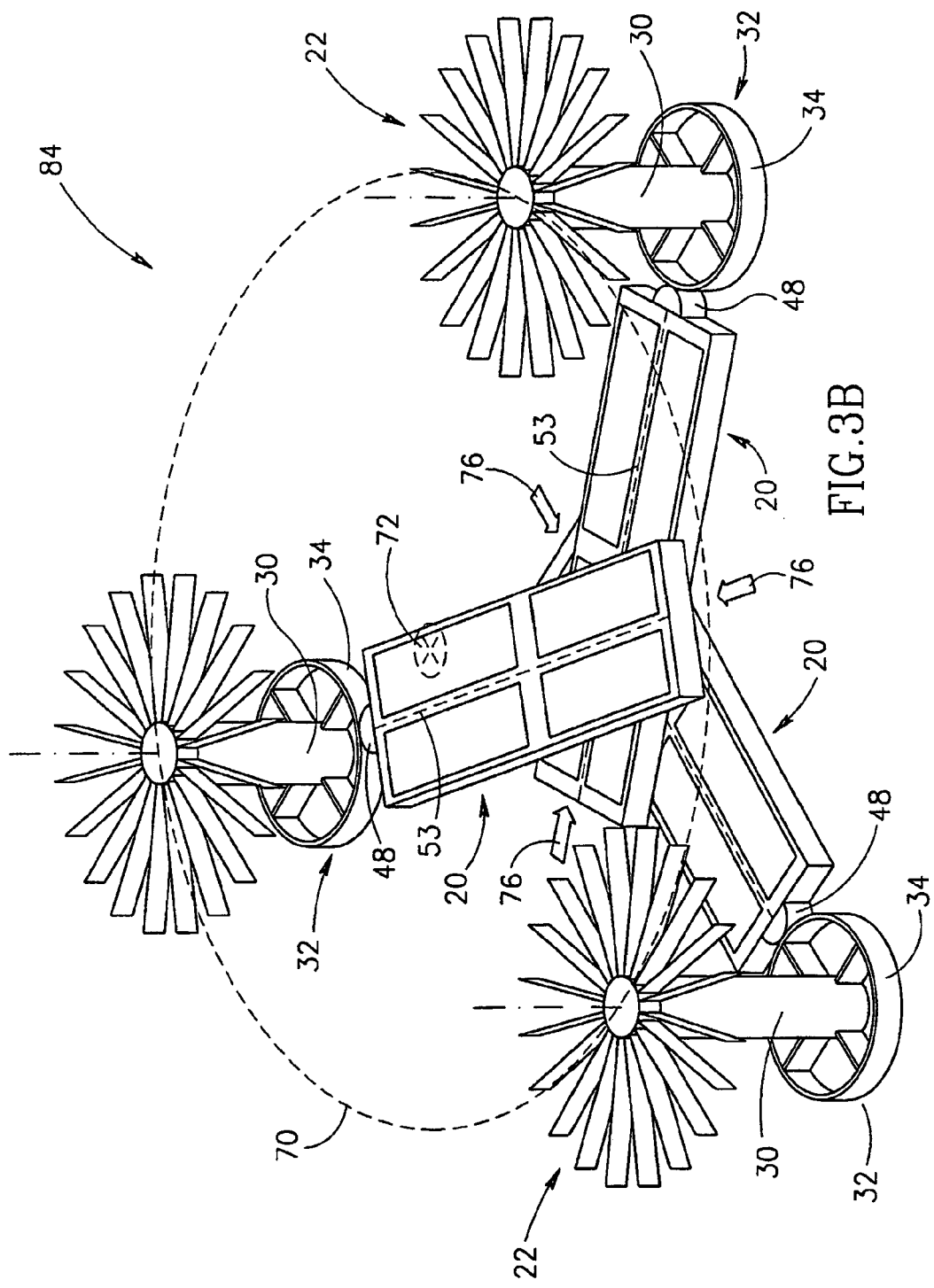

FIGS. 3A and 3B schematically show configurations of rotary blade heads as they would be mounted in a shaver in which each rotary blade is driven by its own piezoelectric motor, in accordance with embodiments of the present invention.

FIG. 3A shows a rotary blade head configuration 80 comprising three rotary blade heads 22 each of which is coupled to a different optionally identical piezoelectric motor 20 similar to a piezoelectric motor shown in FIGS. 1A–1D, variations thereof or other suitable motors known in the art. The choice of three blade heads 22 is by way of example and a configuration similar to configuration 80 can, in accordance with an embodiment of the present invention, comprise a different number of rotary blade heads 22 and such a different number can be advantageous.

Rotary blade heads 22 have axes of rotation 36 that are optionally parallel and equidistant from each other and define an equilateral triangle and a configuration circle 70. The center of configuration circle 70 is indicated by circled cross hairs 72. Each rotary blade head 22 is preferably attached to a coupling wheel 32 having a coupling surface 34. Coupling wheels 32 are optionally coplanar. Each of piezoelectric motors 20 has short edge surfaces 50 and 51, a long axis 53 and optionally, a friction nub 48.

A piezoelectric motor 20 to which a rotary blade head 22 is coupled is mounted in the shaver, using methods known in the art, so that its long axis 53 is substantially coincident with a radius (not shown) of circle 70 that intersects rotation axis 36 of the rotary blade head. Shaft 30 is preferably rigidly mounted in the shaver, using methods known in the art so that the position of shaft 30 and thereby axis 36 is substantially fixed. In some embodiments of the present invention, piezoelectric motor 20 is situated between center 72 of circle 70 and coupling wheel 32 of blade head 22. A resilient force, represented by a block arrow 76, presses against edge surface 51 of piezoelectric motor 20. Force 76 urges piezoelectric motor 20 along its long axis 53 so that friction nub 48 presses against coupling surface 34 attached to rotary blade head 22. In some embodiments of the present invention edge surface 51 is substantially rigidly held in position and resilience of shaft 30 is used to press coupling surface 34 to friction nub 48.

In some embodiments of the present invention, resilient forces 76 are generated by a circular disc 82 formed from an elastic material. Disc 82 is mounted to the shaver (not shown) using methods known in the art so that its center is substantially rigidly positioned at center 72 of configuration circle 70. Preferably, disc 82 and piezoelectric motors 20 are coplanar. Preferably, the distances of short edges 51 of all piezoelectric motors 20 from center 72 of configuration circle 70 are substantially equal. The radius of disc 82 is larger than the distances of short edges 51 of piezoelectric motors 20 from center 72. As a result disc 82 is radially compressed at points where it contacts an edge surface 51 of a piezoelectric motor 20. The compression generates resilient forces 76. In some embodiments of the present invention disc 82 is not rigidly positioned at center 72 of configuration circle 70, but disc 82 is aligned at or close to center 72 by pressure from the piezoelectric motors 20 against which disc 82 presses.

Other methods of generating forces 76 will readily occur to persons of the art. For example disc 82 can be replaced by a configuration of springs using methods known in the art.

FIG. 3B shows a configuration 84 of rotary blade heads 22 and piezoelectric motors 20, (or variations thereof or other suitable motors known in the art) in accordance with an embodiment of the present invention. Configuration 84 is similar to configuration 80, however in configuration 84 coupling wheels 32 are not coplanar. Each coupling wheel 32 is located on a different plane. (Rotary blade heads 22 are of course coplanar or substantially coplanar and are connected to their respective coupling wheels by different length shafts 30.) Piezoelectric motors 20 are not coplanar and extend past center 72 of configuration circle 70. Resilient forces 76 urge piezoelectric motors 20 along their long axes 53 to press their respective friction nubs 48 to coupling wheels 32 to which they are coupled. For a same radius configuration circle 70, piezoelectric motors 20 in configuration 84 can be larger and longer than piezoelectric motors 20 used in configuration 80 shown in FIG. 3A. Alternatively, for piezoelectric motors 20 in configurations 84 and 80 having a same length, configuration circle 70 in configuration 84 can be smaller than configuration circle 70 in configuration 80, i.e. rotary blade heads 22 can be closer together in configuration 84.

It should be noted that whereas coupling wheels 32 in FIG. 3B are not coplanar, it is possible, in accordance with embodiments of the present invention, to couple non-coplanar piezoelectric motors 20 to coplanar coupling wheels 32 by making the coupling wheels wider. It should also be noted that whereas piezoelectric motors 20 in FIGS. 3A and 3B are positioned so that their respective axes 53 are along radii of configuration circle 70, other orientations of piezoelectric motors 20, in accordance with embodiments of the present invention, are possible and can be advantageous. For example axes 53 can extend along tangents or arcs of configuration circle 70. Furthermore, whereas in FIG. 3B and preceding figures, coupling surfaces 34 are surfaces of coupling wheels 32 attached to shafts 30, coupling surfaces 34 can be a surface regions of shafts 30 in all embodiments of the present invention requiring a coupling surface 34.

Figure 4:
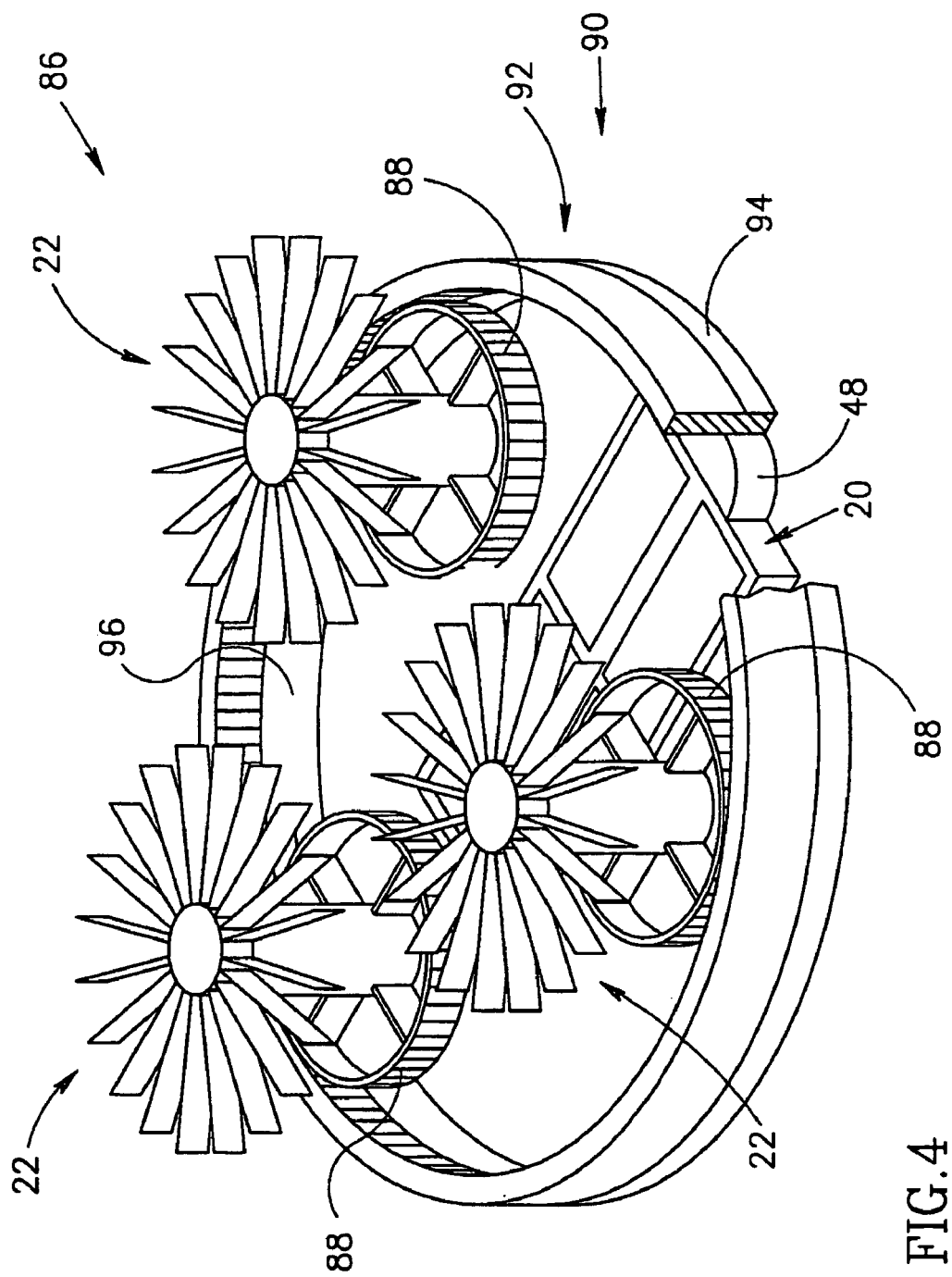
FIG. 4 schematically shows a partial cut-away illustration of three rotary blade heads coupled to a piezoelectric motor via a planetary gear transmission, in accordance with an embodiment of the present invention.

FIG. 4 schematically shows a configuration 86 of rotary blade heads 22 for a shaver that are driven by a planetary gear transmission, in accordance with an embodiment of the present invention.

Configuration 86 comprises three (by way of example) rotary blade heads 22 each one of which is connected to a different gear 88. Gears 88 are planet gears of a planetary gear transmission 90 comprising an annulus gear 92 which is coupled to planet gears 88 using methods known in the art.

In some embodiments of the present invention annulus gear 92 comprises an apron 94 having an internal surface 96 to which at least one piezoelectric motor 20 is coupled. Optionally, piezoelectric motor 20 is similar to piezoelectric motor 20 shown in FIG. 1A (or to another piezoelectric motor shown in FIGS. 1A–1C, or other suitable piezoelectric motor known in the art) and comprises a friction nub 48 which is resiliently pressed to surface 96 of apron 94. Optionally, surface 96 is covered with a layer of wear resistant material. When the shaver is in operation piezoelectric motor 20 turns annulus gear 92 and thereby planet gears 88 and rotary blade heads 22. It should be noted that annulus gear 92 can be driven by a piezoelectric motor similar to piezoelectric motor 74 (FIGS. 2A–2D) or motor 314 (FIG. 2F) having two friction nubs that engage surface 96 of apron 94 at opposite ends of a diameter of surface 96.

Whereas FIG. 4 shows a configuration comprising three rotary blade heads, configurations of rotary blade heads driven by a planetary gear transmission can, in accordance with embodiments of the present invention, comprise a different number of blade heads. Furthermore planetary transmissions in accordance with embodiments of the present invention having configurations different from that shown in FIG. 4 are possible and can be advantageous. For example, a "planetary configuration" of rotary blade heads, in accordance with an embodiment of the present invention, might by way of example comprise five rotary blade heads. Each of four of the rotary blade heads might be attached to a planet gear while a fifth rotary blade head is attached to a central sun gear that is coupled to each of the planet gears. The planetary transmission might not comprise an annulus gear to drive the gears attached to the blade heads. Instead, the planet gears might be driven by the sun gear, which is rotated by at least one piezoelectric motor.

Figure 5:
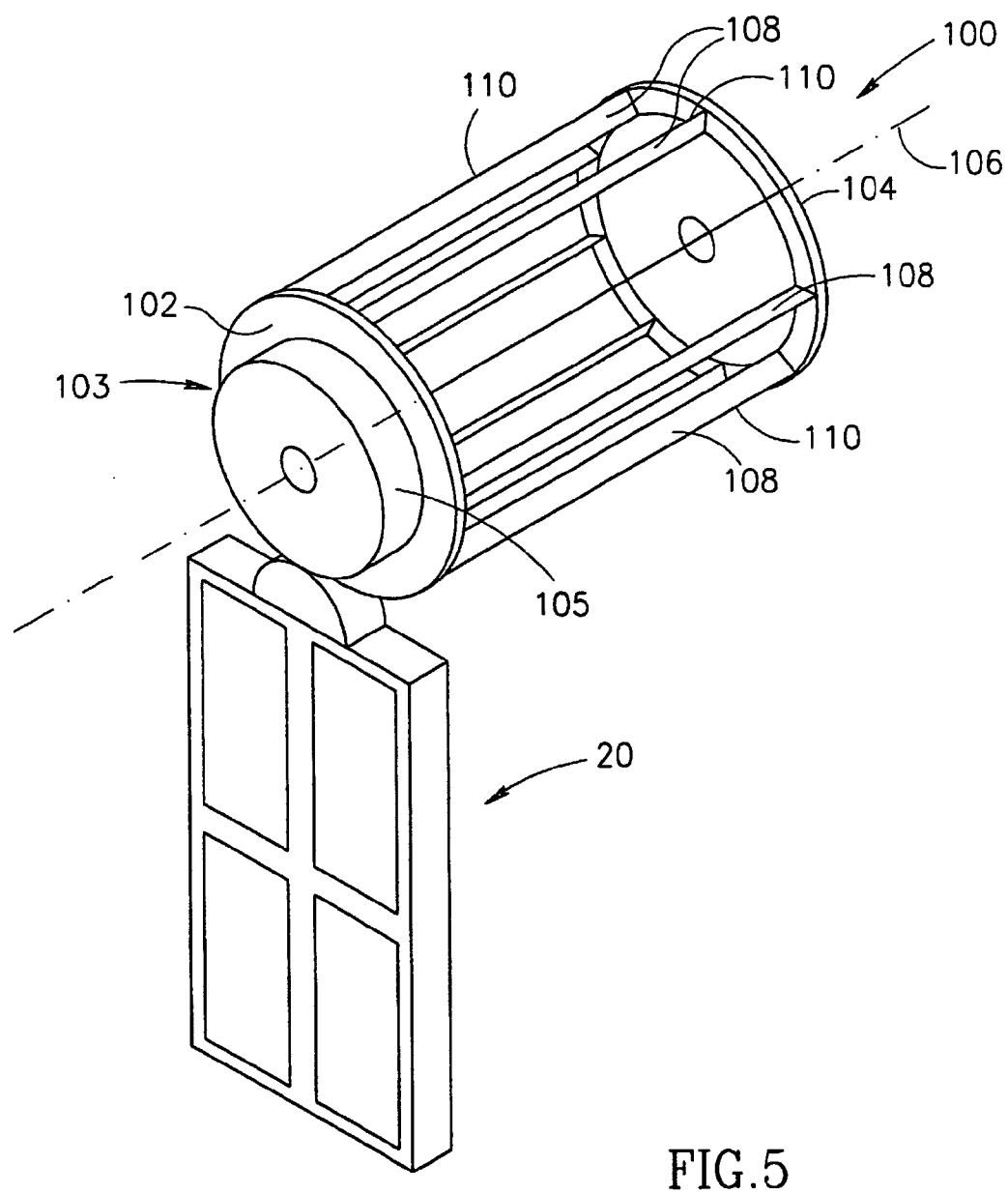
FIG. 5 schematically shows a rotary blade head, in which cutting blades are parallel to an axis of rotation of the blade head, coupled to a piezoelectric motor, in accordance with an embodiment of the present invention.

FIG. 5 schematically shows a rotary blade head 100, in which cutting blades are parallel to an axis of rotation of the blade head, coupled to a piezoelectric motor 20, in accordance with an embodiment of the present invention. Piezoelectric motor 20 shown in FIG. 5 is, by way of example, similar to piezoelectric motor 20 shown in FIG. 1A.

Rotary blade head 100 optionally comprises at least two circular parallel hubs 102 and 104 preferably having equal radii and a common axis of rotation 106. Optionally, a plurality of cutting blades 108 having cutting edges 110 extend from hub 102 to hub 104. In some embodiments of the present invention, cutting edges 110 are straight and substantially parallel to axis of rotation 106. In some embodiments of the present invention, cutting edges 110 are slightly skewed with respect to axis of rotation 106. In some embodiments of the present invention cutting edges are convex. In FIG. 5 cutting edges 110 of cutting blades 108 are straight and parallel to axis of rotation 106.

Hub 102 optionally comprises a coupling wheel 103 having a coupling surface 105 to which piezoelectric motor 20 is coupled. When piezoelectric motor 20 is activated it rotates coupling wheel 100 and thereby cutting blades 108 about axis of rotation 106.

Figure 6A:
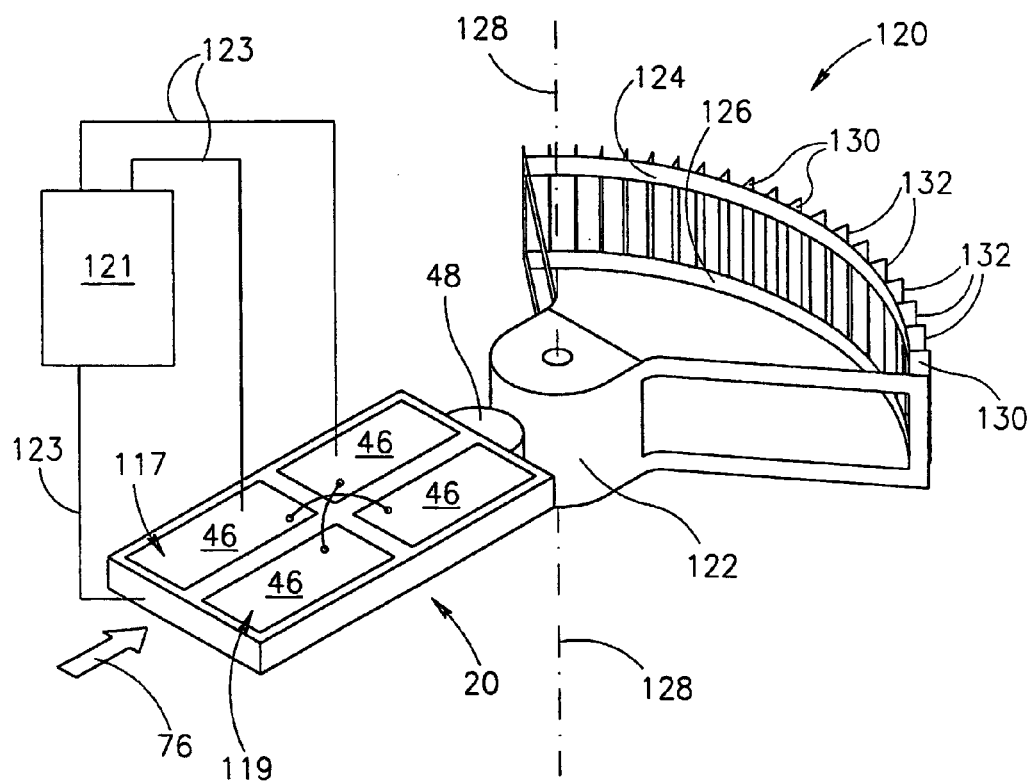
FIGS. 6A and 6B schematically show an oscillatory blade head and a variation thereof respectively, coupled to a piezoelectric motor, in accordance with an embodiment of the present invention.

FIG. 6A schematically shows an oscillatory blade head 120 for use in a shaver having cutting blades that are moved with a rotational, oscillatory motion, coupled to a piezoelectric motor 20 in accordance with an embodiment of the present invention.

In some embodiments of the present invention, oscillatory blade head 120 comprises a cylindrical arc surface 122 that functions as a coupling surface and two cylindrical "arc" struts 124 and 126, all having a common axis of rotation 128. A plurality of cutting blades 130, preferably having cutting edges 132 parallel to axis of rotation 128, are supported by cylindrical struts 124 and 126.

Piezoelectric motor 20 is optionally similar to piezoelectric motor 20 shown in FIG. 1A and comprises a large electrode (not shown), 4 quadrant electrodes 46 and a friction nub 48. A resilient force 76 operates on piezoelectric motor 20 to press friction nub 48 to coupling surface 122. Optionally, diagonally opposite quadrant electrodes 46 are electrically connected together to form first and second electrode pairs 117 and 119 respectively, of diagonally connected electrodes. A driving circuit 121 is connected to the large electrode and first and second electrode pairs 117 and 119 by power lines 123. Power from driving circuit 121 is alternately switched to first electrode pair 117 and second electrode pair 119 to alternately electrify the first and second electrode pairs with respect to the large electrode and alternately generate thereby clockwise and counterclockwise elliptical vibrations in friction nub 48. The clockwise and counterclockwise elliptical vibrations rotate coupling surface 122 and thereby cutting blades 130, with a back and forth oscillatory motion about axis of rotation 128.

In some embodiments of the present invention driving circuit 121 is a driving circuit of a type described in PCT Application PCT/IL99/00520 and switching between first and second pairs of diagonally connected electrodes 46 is, optionally, accomplished using methods described in this PCT Application. Other driving circuits and methods of electrifying electrodes known in the art may be used.

Whereas electrodes 46 are shown in FIG. 6A as being electrified in diagonal pairs, electrodes 46 may, in accordance with an embodiment of the present invention, be electrified to generate alternating direction elliptical vibrations using other combinations of electrodes. Furthermore voltage waveforms different from harmonic waveforms may be used to electrify electrodes 46. Such other combinations of electrodes 46 and voltage waveforms different from harmonic waveforms are described, as noted above, in U.S. Pat. No. 5,616,980.

Power supply 121 and methods for electrifying electrodes 46 to alternately generate clockwise and counter clockwise vibrations in friction nub 46 are suitable for use in any preferred embodiment of the present invention that requires generating motion in two opposite and parallel directions.

Figure 6B:
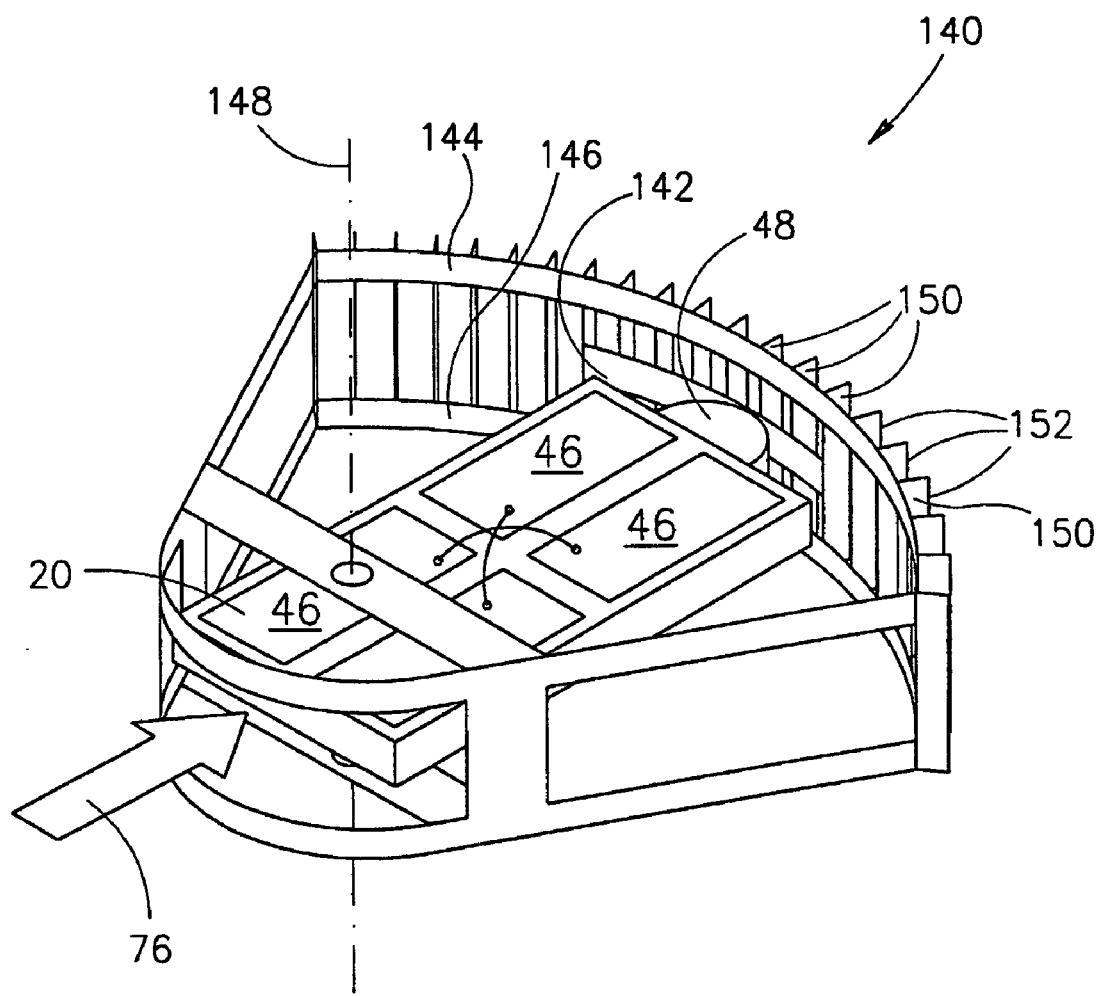

FIG. 6B schematically shows another oscillatory blade head 140 for moving cutting blades in a shaver (not shown) with a rotational oscillatory motion.

Oscillatory blade head 140 comprises an arc surface 142 that functions as a coupling surface and two parallel cylindrical arc struts 144 and 146 all having a common axis of rotation 148. A plurality of cutting blades 150 having cutting edges 152 that are optionally parallel to axis of rotation 148 are supported by cylindrical struts 144 and 146. A piezoelectric motor 20, similar to and operated in the same manner as piezoelectric motor 20 shown in FIG. 6A is urged by resilient force 76 in a direction so that its friction nub 48 presses against coupling surface 142. Pairs of diagonally connected quadrant electrodes 46 are preferably electrified with an AC voltage to rotate coupling surface 142 and thereby cutting blades 150 with a back and forth oscillatory motion about axis of rotation 148.

Figure 7:
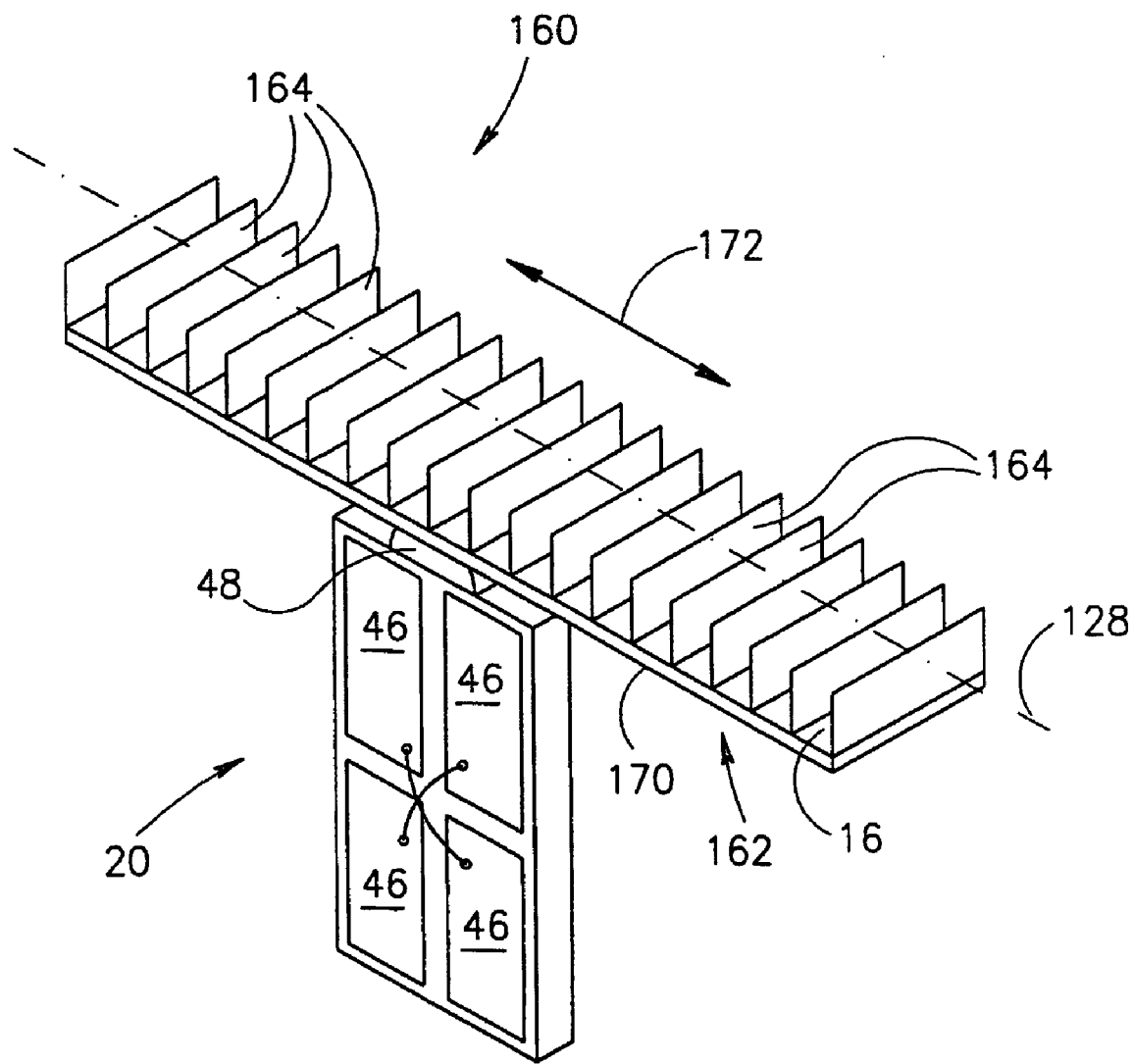
FIG. 7 schematically shows another oscillatory blade head coupled to a piezoelectric motor, in accordance with an embodiment of the present invention.

FIG. 7 schematically shows an oscillatory blade head 160 for moving cutting blades in a shaver with a linear oscillatory motion, coupled to a piezoelectric motor 20, in accordance with an embodiment of the present invention.

Oscillatory blade head 160 optionally comprises a planar support plate 162. A plurality of optionally parallel cutting blades 164 are attached in a linear array on a top surface 166 of support plate 162. The linear array has an array axis 168 shown with a dashed line.

Piezoelectric motor 20 is optionally similar to and operated in similar manner as piezoelectric motor 20 shown in FIGS. 6A and 6B. A resilient force 76 urges piezoelectric motor 20 in a direction so that its friction nub 48 presses against a surface region of a bottom surface 170 of support plate 162.

In some embodiments of the present invention pairs of diagonally connected quadrant electrodes 46 are electrified with an AC voltage to vibrate friction nub 48 alternately with clockwise and counterclockwise elliptical motion. The motion of friction nub 48 moves oscillatory blade head 160 back and forth parallel to array axis 168 with a linear oscillatory motion in directions indicated by double arrowhead line 172.

It should be noted that piezoelectric motor 20 shown in FIGS. 6A–7 is similar to piezoelectric motor 20 shown in FIG. 1A by way of example. Any friction coupled piezoelectric motor operable to rapidly oscillate a moveable body to which it is coupled can be used in place of motor 20, in accordance with an embodiment of the present invention. In some embodiments of the present invention, a piezoelectric motor used in place of piezoelectric motor 20 is similar to a piezoelectric motor shown in FIGS. 1A–1D.

Figure 8:
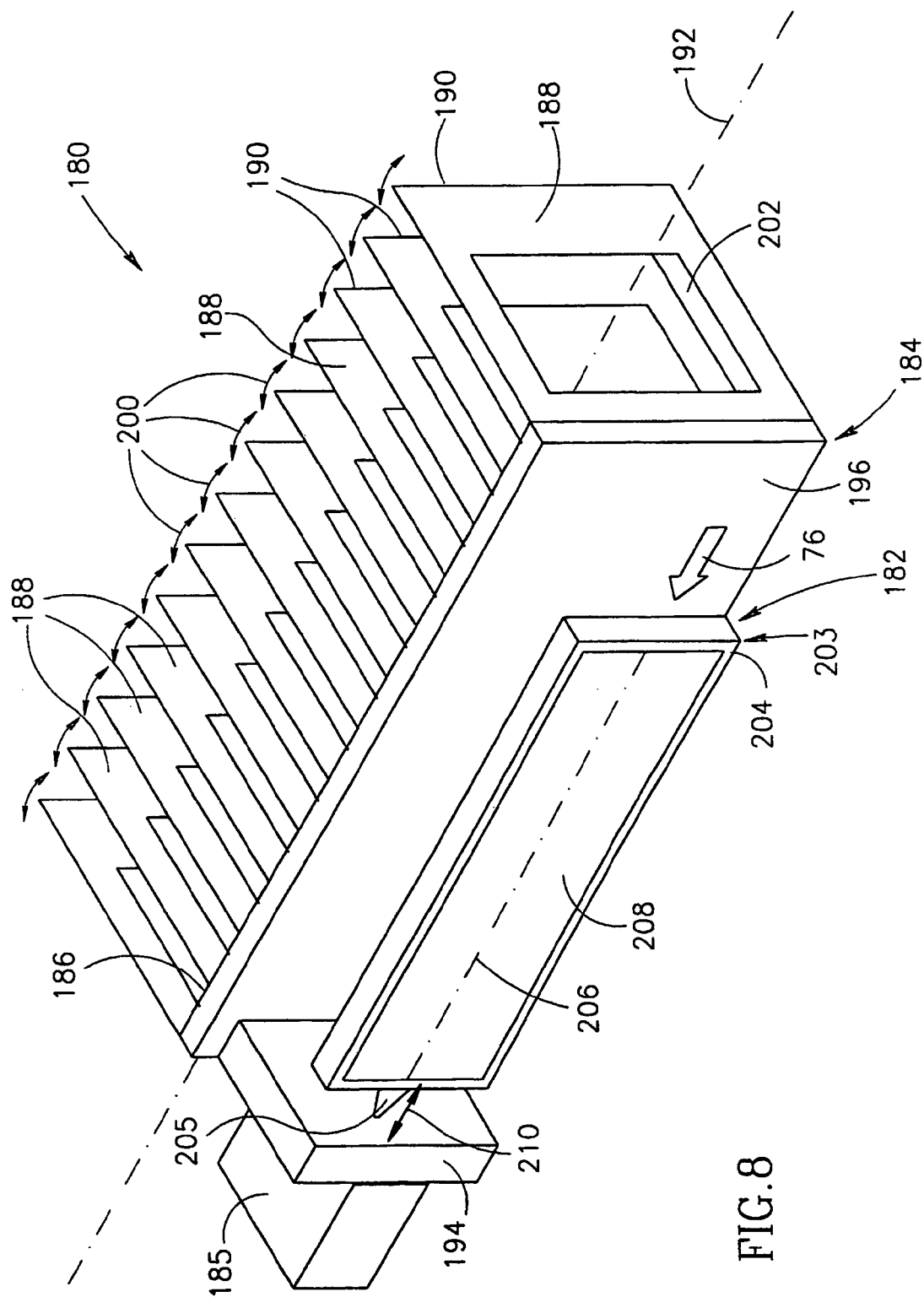
FIG. 8 schematically shows a resonant blade head coupled to a piezoelectric motor, in accordance with an embodiment of the present invention.

FIG. 8 schematically shows a resonant blade head 180 driven by a piezoelectric motor 182, for moving cutting blades in a shaver (not shown) by exciting resonant vibrations in the cutting blades, in accordance with an embodiment of the present invention. FIG. 8 shows resonant blade head 180 in a perspective side view.

Resonant blade head 180 comprises a base plate 184 having a top surface 186 to which are mounted in a linear array, a plurality of optionally parallel "resonant" cutting blades 188 having cutting edges 190. A direction of the linear array is defined by an array axis 192 perpendicular to the planes of cutting blades 188. In some embodiments of the present invention a "strike" plate 194 is mounted to a bottom surface 196 of base plate 184. The plane of strike plate 194 is preferably perpendicular to array axis 192. A resilient "backstop" block 185 mounted to the shaver using methods known in the art limits motion of base plate 184 parallel to array axis 192 in the direction of force 76.

Resonant cutting blades 188 are designed, using methods known in the art, to have a resonant vibration mode characterized by a desired frequency. When the resonant vibration mode is excited, it causes cutting edges 190 to vibrate back and forth in directions indicated by double arrowhead lines 200 at the frequency of the resonant vibration mode. The frequency of the resonant vibration mode is determined by the mass distribution of the cutting blades and the coefficient of elasticity of the material from which they are made. An amplitude of motion of cutting edges 190 is determined by the mass distribution, material elasticity, a damping factor of the resonant vibration and a rate at which energy is supplied by piezoelectric motor 182 to the resonant vibration mode. In some embodiments of the present invention, the frequency of vibration of cutting edges 190 is in a range from 50–250 Hz and the amplitude of vibration is in a range from 0.5 to 2 mm. Preferably, the elasticity of material from which backstop plate 185 is formed is such that motion of base plate 184 parallel to array axis 192 has a resonant frequency substantially equal to the resonant frequency of cutting blades 188.

In FIG. 8, cutting blades 188 are shown, in accordance with an embodiment of the present invention, formed with a window 202. For a given constant thickness of cutting blades 188 and a given elasticity of the material from which cutting blades 18 are formed, the size and shape of window 202 determines the mass distribution of cutting blades 188 and thereby the resonant frequency of cutting blades 188. Other methods for determining a resonant vibration frequency of cutting blades 188, in accordance with an embodiment of the present invention, will occur to persons of the art.

The resonant vibration mode is excited when strike plate 194 is coupled to a force that moves it back and forth along array axis 192 with a frequency close to the frequency of the resonant vibration mode of cutting blades 188. The force is provided by piezoelectric motor 182.

Piezoelectric motor 182 is optionally similar in construction to piezoelectric motors shown in previous figures and comprises a relatively thin rectangular piezoelectric vibrator 203 having two large planar face surfaces 204, only one of which is shown in FIG. 8, and a long axis 206. Optionally vibrator 203 is mounted with a cone shaped "concentrator" nub 205 formed from stainless steel or hard ceramic. Nub 205 is pressed to strike plate 194 by a resilient force 76. Optionally, piezoelectric motor 182 comprises identical large electrodes 208 on both of its planar face surfaces 204. (Only one of large electrodes 208 is shown in the perspective of FIG. 8).

When an AC voltage is applied between large electrodes 208, substantially only longitudinal vibrations parallel to long axis 206 of piezoelectric motor 182 are excited in the piezoelectric motor. The longitudinal vibrations generate vibrations in nub 205 in directions indicated by double arrowhead line 210. These vibrations in nub 205 move strike plate 194 parallel to array axis 192, to excite the resonant vibration of cutting blades 188. However, in order to couple energy efficiently into vibrations of piezoelectric motor 182 an AC voltage having a frequency close to the longitudinal resonant frequency of piezoelectric vibrator 203. The longitudinal resonant frequency of piezoelectric motor 182 is generally in a range from 10,000 to 100,000 Hz. Frequencies in this range are much higher than the frequency required to excite the resonant vibration mode of cutting blades 188. As a result, the natural vibration frequencies of piezoelectric motor 182 are not suitable for directly exciting the resonant vibration mode of cutting blades 188. Therefore, in accordance with an embodiment of the present invention, in order to generate a suitable force for exciting the resonant frequency of cutting blades 188, the applied AC voltage is modulated by an envelope function having a frequency substantially equal to the resonant frequency of cutting blades 188. As a result of the modulation, vibratory motion of nub 205 generates a force on strike plate 194 characterized by a frequency equal or close to the frequency of the resonant vibration mode of cutting blades 188. In some embodiments of the present invention the modulation function is an harmonic function or a cyclical hat function generated by turning the AC voltage on and off at the frequency of the resonant vibration mode of cutting blades 188.

Figure 9:
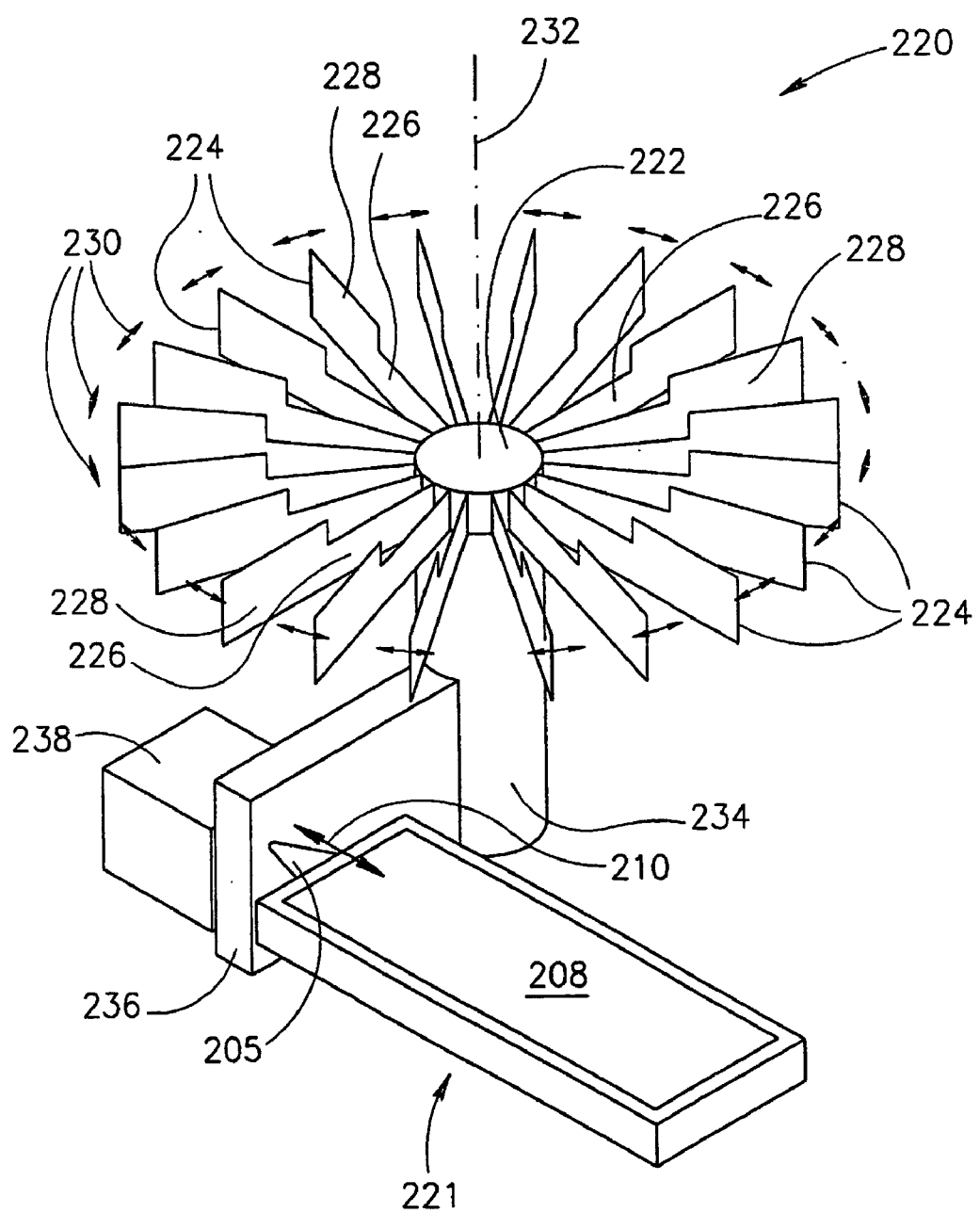
FIG. 9 schematically shows another resonant blade head coupled to a piezoelectric motor, in accordance with an embodiment of the present invention.

FIG. 9 schematically shows another resonant blade head 220 coupled to a piezoelectric motor 221, in accordance with an embodiment of the present invention.

Blade head 220 comprises a hub 222 to which are attached a plurality of cutting blades 224 that extend radially away from hub 222. In some embodiments of the present invention cutting blades 224 comprise a narrow arm section 226 and a broader head section 228 so that cutting blades 224 are more heavily weighted towards their free ends. Cutting blades 224 preferably have cutting edges 230 located on their head sections 228. Blade head 220 is optionally rotationally symmetric about an axis of rotation 232 shown with a dashed line.

A shaft 234 connects blade head 220 to a strike plate 236. A backstop block 238 limits motion of strike plate 236. Piezoelectric motor 221 is optionally similar to and operates in the same manner as piezoelectric motor 182 shown in FIG. 8. However in FIG. 9 impulses that piezoelectric motor transmits to strike plate 236 generate an intermittent torque at a resonant frequency of cutting blades 224. The torque excites a resonant vibration in cutting blades 224 that causes their cutting edges to move back and forth in directions indicated by double arrowhead lines 240. For a given magnitude of force applied to strike plate 236 the increased weighting of cutting blades 224 toward their free ends increases the amplitude of motion of the cutting edges 230.

Figure 10:
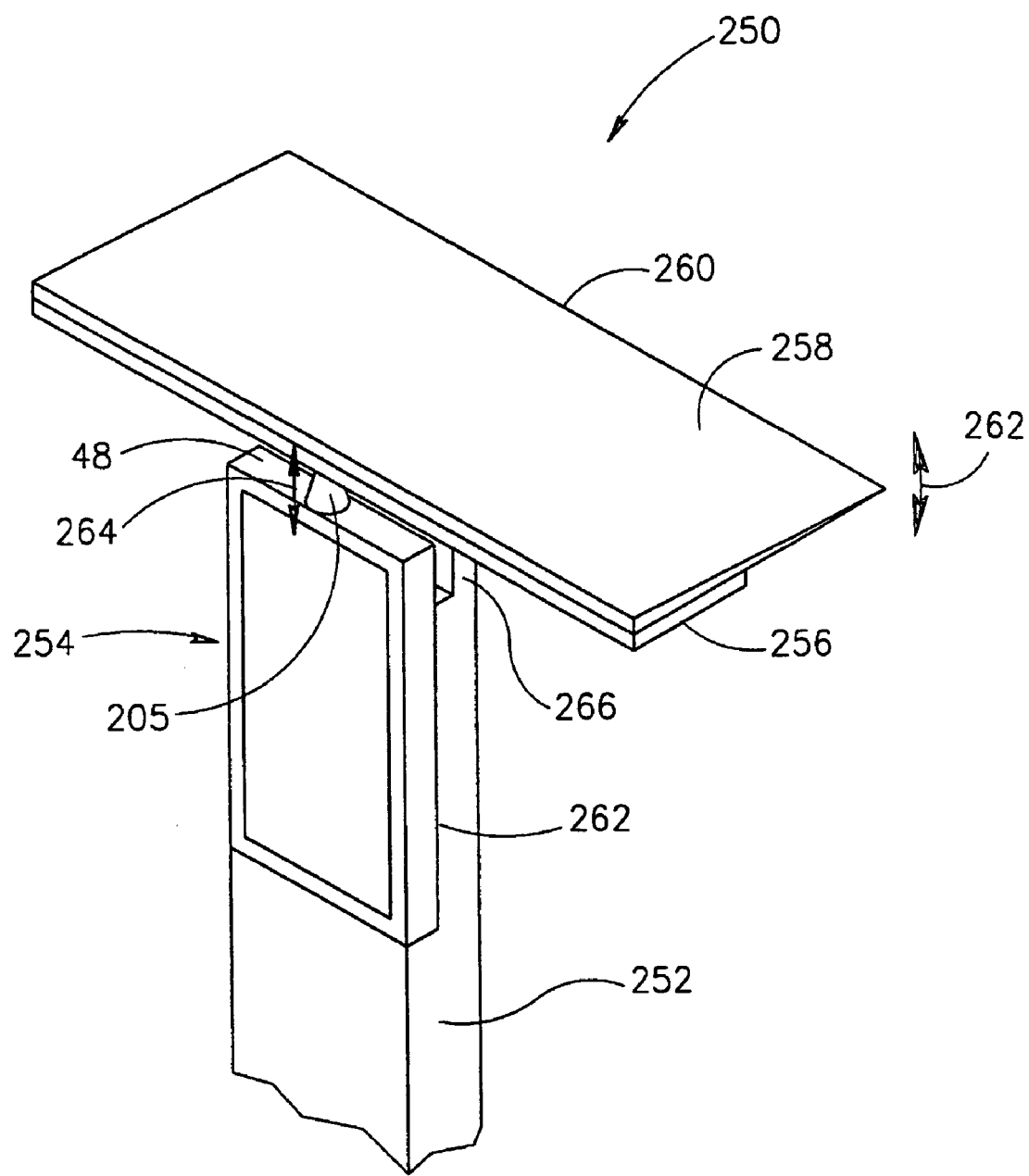
FIG. 10 schematically shows a wet shaver, in accordance with an embodiment of the present invention.

FIG. 10 schematically shows a wet shaver 250 in accordance with an embodiment of the present invention.

Wet shaver 250 optionally comprises a handle 252 a piezoelectric motor 254 and a mounting plate 256. An optionally disposable razor blade 258 having a cutting edge 260 is mounted to mounting plate 256 using methods known in the art.

Piezoelectric motor 254 is optionally mounted in a recess 262 in handle 252. In some embodiments of the present invention, piezoelectric motor 254 comprises a cone shaped nub 205 formed from steel or hard ceramic and is spring loaded using methods known in the art so that nub 205 is resiliently pressed to mounting plate 256. Piezoelectric motor 254 optionally operates in similar fashion to the way that piezoelectric motors 182 and 221 shown in FIGS. 8 and 9 respectively operate and when energized, substantially only longitudinal vibrations are excited in piezoelectric motor 254. In some embodiments of the present invention, piezoelectric motor 254 is similar to low voltage piezoelectric multilayer motors described in PCT Application PCT/IL99/00288 but, optionally, with all electrodes on layers in the motor being relatively large single electrodes that cover substantially all the area of surfaces of the layers on which they are located.

Piezoelectric motor 254 and circuits (not shown) and leads (not shown) in handle 252 that provide power to piezoelectric motor 254 are preferably waterproofed with a coating of a suitable flexible water resistant insulator. In addition or alternatively, recess 262 may be a recess in a suitable waterproof compartment of wet shaver 250 that prevents moisture from reaching piezoelectric motor 254 and its associated leads and circuits. Optionally, nub 205 is a "replaceable" friction nub similar to replaceable friction nubs described in a PCT Application entitled "Replaceable Friction Nub", filed on even date herewith in the Israel Receiving Office, the disclosure of which is incorporated herein by reference. Replaceable friction nubs described in the PCT Application are designed so that they can be easily attached and removed from a piezoelectric motor. By using a replaceable nub 205, piezoelectric motor 254 can be waterproofed first and nub 205 attached later, after waterproofing. This enables a better seal of the insulating coating to the motor and prevents the surface of nub 205 from being degraded by the coating.

The longitudinal vibrations in piezoelectric motor 254 move nub 205 back and forth with a linear vibratory motion in directions indicated by double arrowhead line 264. Mounting plate 256 is optionally attached to handle 252 by a neck 266 (only a portion of which is shown in FIG. 10) having thin rectangular cross section. The long dimension of the cross section of neck 266 is parallel to cutting edge 260 of razor blade 258. The shape of the cross section of neck 266 and the material from which neck 266 is formed are chosen so that neck 266 is elastically bendable about an axis parallel to the long dimension of the cross section and relatively inflexible and rigid in other directions. Neck 266 is therefore bendable substantially only about an axis parallel to cutting edge 260. The vibratory motion of nub 205 therefore generates rotary vibratory motion of cutting edge 260 substantially only about an axis parallel to the cutting edge. The motion of cutting edge 260 is indicated by double arrowhead line 262. Preferably, vibratory motion 262 has a frequency greater than 5,000 Hz. More preferably the vibratory motion of cutting edge 260 has a frequency greater than 10,000 Hz. Most preferably, the frequency of vibratory motion 262 is greater than 20,000. Preferably, handle 252, neck 266 and mounting plate 256 are formed as a single unit from metal or suitable plastic using methods known in the art.

Other methods known in the art for mounting razor blade 258 to handle 252 that enables the motion of cutting edge 260 represented by lines 262 are possible, in accordance with an embodiment of the present invention, and can be advantageous. For example mounting plate 256 can be attached to handle 252 by a hinge and the plate biased by a flexible force that maintains the plate pressed against nub 205.

Wet shaver 250 is used for shaving preferably with water and a shaving cream in the same manner that prior art wet shavers are used. However, as a result of the vibrations in cutting edge 260 generated by piezoelectric motor 254, wet shaver 250 provides a shave that is smoother than shaves provided by prior art shavers.

Motion of resonant cutting blades 188 and 228 shown in FIGS. 8 and 9 respectively and razor blade 258 comprised in wet shaver 250 shown in FIG. 10 is generated by a piezoelectric motor preferably comprising a concentrator nub that vibrates substantially along a single direction and impacts a strike plate. It is also possible, in accordance with preferred embodiment of the present invention, to generate motion of cutting blades 188, 288 and razor blade 228 using a piezoelectric motor 20 having a friction nub 48 and coupling methods shown in FIGS. 6A and 6B. The piezoelectric motor generates the desired motion by oscillating the resonant cutting blades or razor blade in similar manner to the way in which piezoelectric motor 20 oscillates cutting blades attached to oscillating blade heads 120 and 140 shown in FIGS. 6A and 6B.

Whereas in FIG. 10 cutting edge 260 is moved perpendicular to itself, in some embodiments of the present invention, cutting edge 260 is moved with a linear oscillatory motion back and forth parallel to itself Movement of cutting edge 260 parallel to itself is optionally accomplished by connecting mounting plate 256 to handle 252 using methods known in the art so that plate 256 is moveable in the desired directions. A piezoelectric motor oscillates mounting plate 256 back and forth parallel to cutting edge 260 in much the same way that piezoelectric motor 20 shown in FIG. 7 oscillates support plate 162.

FIGS. 11A–17 schematically show various configurations of piezoelectric star motors and star motors driving shafts, in accordance with embodiments of the present invention. To prevent clutter, only some features and elements of a plurality of identical features and elements shown in FIGS. 11A–15 that are identified by a same numeral may be labeled with the numeral.

Figure 11A:
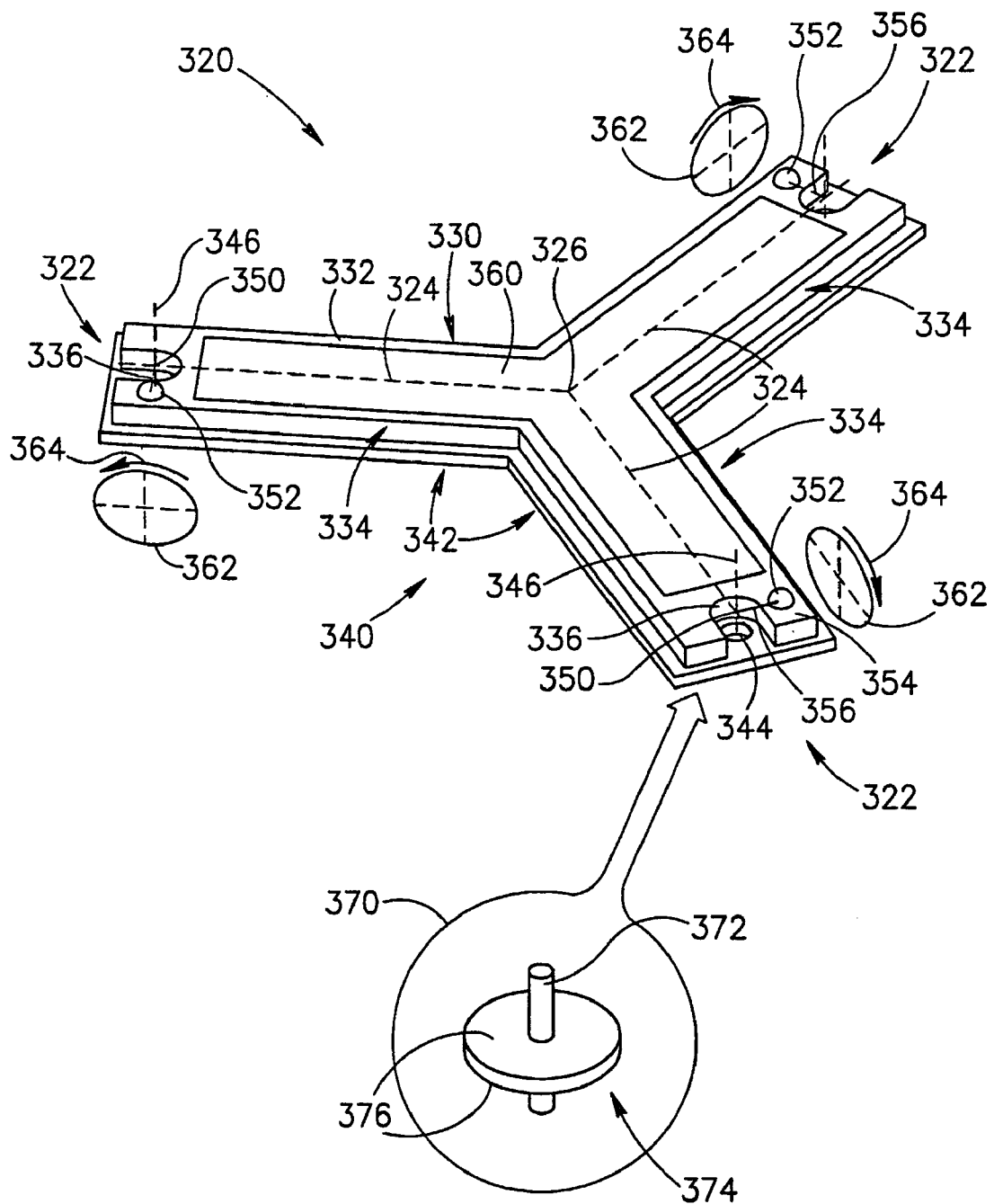
FIG. 11A schematically shows a star piezoelectric motor having three driving arms, in accordance with an embodiment of the present invention.

FIG. 11A shows a star motor 320 for driving three shafts. Star motor 320 comprises three, optionally, identical, substantially rectangular driving arms 322 that extend outwardly in radial directions indicated by dashed lines 324 from a common center 326. In some embodiments of the present invention driving arms 322 are identical and an angle between radial directions 324 of a pair of adjacent driving arms 322 is equal to an angle between radial directions 324 of any other pair of adjacent driving arms 322. Lines 324 lie along long lines of symmetry of driving arms 322 and therefore, where appropriate, will be referred to as "axes" 324 of driving arms 320.

Star motor 320 comprises a single relatively thin planar piezoelectric vibrator 330 having two large parallel planar face surfaces 332 (only one of which is shown) and three rectangular shaped arms 334 that extend outwardly along radial directions 324. Piezoelectric vibrator 330 is bonded to a similarly shaped base plate 340 having three rectangular arms 342 so that each driving arm 322 of the piezoelectric vibrator is bonded to an arm 342 of the base plate to form a driving arm 322 of motor 320. Base plate 340 is preferably formed from a non-piezoelectric high Q material. Preferably, base plate 340 is formed from a metal such as aluminum or steel.

The base plate arm 342 and piezoelectric arm 334 of each driving arm 322 are formed with a clearance hole or groove for receiving a shaft driven by star motor 320. By way of example, in star motor 320 piezoelectric arms 334 are formed with clearance grooves 336 and base plate arms 342 are formed with clearance holes 344. A dashed "centerline" 346 through the center of each clearance hole 344, perpendicular to the plane of motor 320, preferably intersects axis 324 of the driving arm 322 in which the hole is located at a point 350.

In some embodiments of the present invention, a friction nub 352 is mounted to each piezoelectric arm 334 on face surface 332 in a region of a corner 354 of the arm. In some embodiments of the present invention friction nubs 352 are bonded to face surface 332 using adhesives and methods known in the art. A line 356 (shown dashed) from the location of a friction nub 352, perpendicular to the plane defined by centerline 346 and axis 324 of the driving arm 322 on which the friction nub is located preferably intersects the centerline. For convenience of presentation, in FIG. 11A axes 324 are shown located on planar face surface 332. As a result, points 350 at which centerlines 346 and axes 324 intersect are also the points at which lines 356 intersect centerlines 346. In some embodiments of the present invention, a single large electrode 360 having a shape generally similar to that of piezoelectric vibrator 330 is located on face surface 332. When an AC voltage difference is applied between electrode 360 and base plate 340, each arm of piezoelectric vibrator 330 cyclically expands and contracts along a "longitudinal" direction parallel to its axis 324 with a frequency equal to the frequency of the driving voltage. As a result friction nub 352 of each driving arm 322 moves back and forth in directions parallel to the driving axis 324

However the material of base plate 340 does not in general exhibit significant expansion or contraction with generation of an electric field in the material. Therefore, when a piezoelectric arm 334 is caused to expand and contract by the driving voltage, mechanical forces are generated in its driving arm 322 that cause the driving arm to bend so that the piezoelectric side of the driving arm is respectively convex and concave. The bending motion causes friction nub 352 of driving arm 322 to move "up and down" in directions perpendicular to the plane of the driving arm.

The (longitudinal) vibratory motion of a friction nub 352 parallel to axis 324 of the driving arm 322 on which it is located and vibratory bending motion of the friction nub are used, in accordance with embodiments of the present invention, to impart motion to a moveable element.

It is possible to operate star motor 320, in accordance with an embodiment of the present invention, by exciting longitudinal and bending vibrations in the motor with a driving voltage at frequencies that are not close to frequencies of resonant vibration modes of the driving arms of the motor. However, preferably, the materials and dimensions of star motor 320 are chosen so that each driving arm 322 has a resonant longitudinal vibration mode at a frequency that is close to a frequency of a resonant bending vibration mode of the driving arm. Preferably, the frequency of the driving voltage is close to the frequencies of the longitudinal and bending vibration modes.

In some embodiments of the present invention, the frequency of the driving voltage is chosen so that relative phase between the longitudinal and bending vibrations excited in a driving arm 322 results in the driving arm's friction nub 352 vibrating with an elliptical motion. An ellipse 362 near friction nub 352 of each driving arm 322 schematically represents elliptical motion excited in the friction nub by longitudinal and bending vibrations in the driving arm. Each friction nub 352 moves clockwise around its ellipse 362, as seen from the position of the friction nub. A curved arrow 364 indicates the direction of motion of each friction nub 352 around its ellipse 362.

In an example of an embodiment of the present invention, piezoelectric layer 330 is formed from a high Q piezoelectric material and base plate 340 is formed from aluminum. The thickness of piezoelectric layer 330 is about 2 mm, the thickness of base plate 340 is about 1 mm and each driving arm is about 6.3 mm wide and about 12.6 mm long. For these dimensions and an appropriate high Q piezoelectric material, in some embodiments of the present invention, a first longitudinal resonant vibration mode and a third resonant bending vibration mode of each driving arm 322 are used to generate motion of friction nubs 352. In some embodiments of the present invention, the longitudinal vibration mode has a resonant frequency of about 61.4 kHz and the bending vibration mode has a frequency of about 58.94 kHz.

In some embodiments of the present invention, the motion of a friction nub 352 is used to drive a shaft 372 of a type schematically shown in inset 370 of FIG. 11A. Shaft 372 is formed with or attached to a coupling disc 374 having large surfaces 376, one of which is pressed to a friction nub 352 to couple motion of the friction nub to the disc and thereby to the shaft.

Whereas star motor 320 shown in FIG. 11A comprises a piezoelectric vibrator 330 fabricated as a one-piece "unitary" vibrator, some star motors in accordance with embodiments of the present invention comprise a composite vibrator having components formed from non-piezoelectric materials.

Figure 11B:
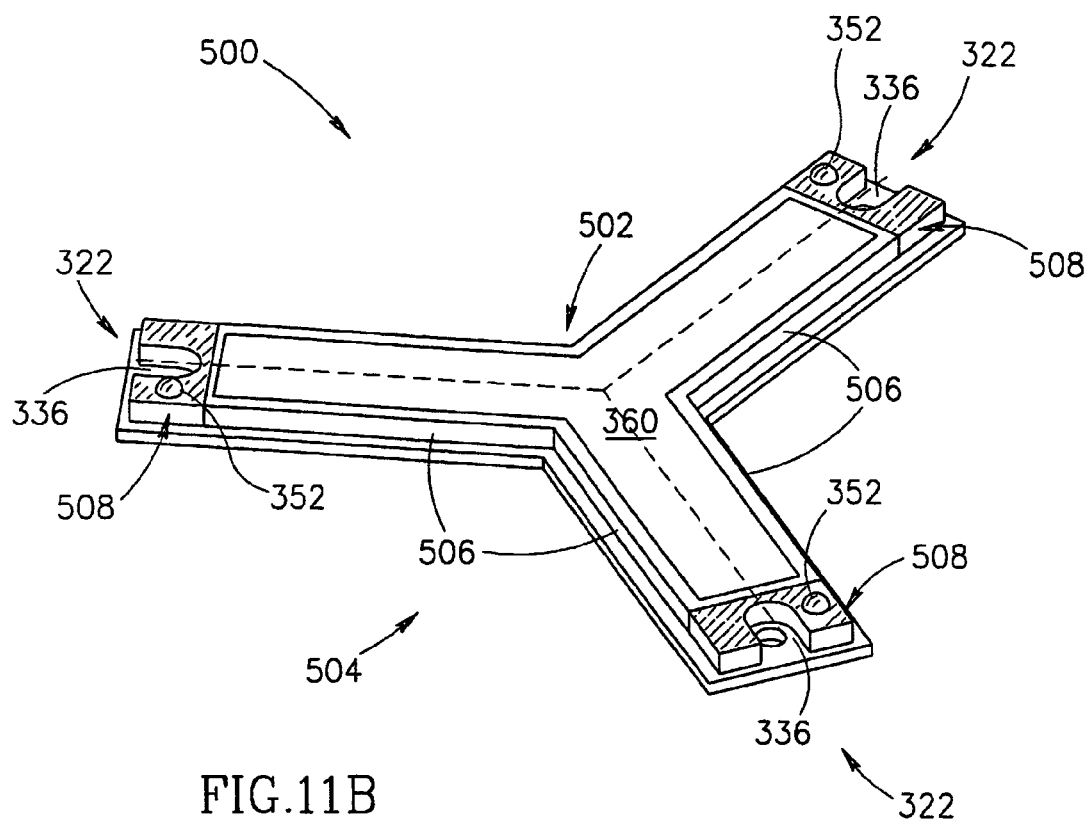
FIG. 11B schematically shows another star piezoelectric motor having three driving arms, in accordance with an embodiment of the present invention.

FIG. 11B shows a star motor 500 similar to star motor 320 that comprises a composite vibrator 502 mounted to a base plate 340 instead of a unitary vibrator 330. Composite vibrator 502 comprises a thin piezoelectric vibrator 504 having arms 506 each of which is bonded to an end piece 508, shown shaded) formed from a non-piezoelectric material. Each end piece 508 is optionally integrally formed with a friction nub 352 and a groove 336 (or hole) for receiving a shaft driven by star motor 500. End pieces 508 are preferably fabricated from a hard wear resistant material such as Alumina, steel or PEEK. As in the case of unitary vibrator 330, composite vibrator 502 is shown, by way of example, having a single large electrode 360. Whereas unitary vibrator 330 and composite vibrator 502 are similar in shape and function similarly, it can be cheaper and easier to fabricate a composite piezoelectric vibrator of a type shown in FIG. 11B for use in a star motor rather than a one piece unitary vibrator 330 of a type shown in FIG. 11A.

Figure 11C:
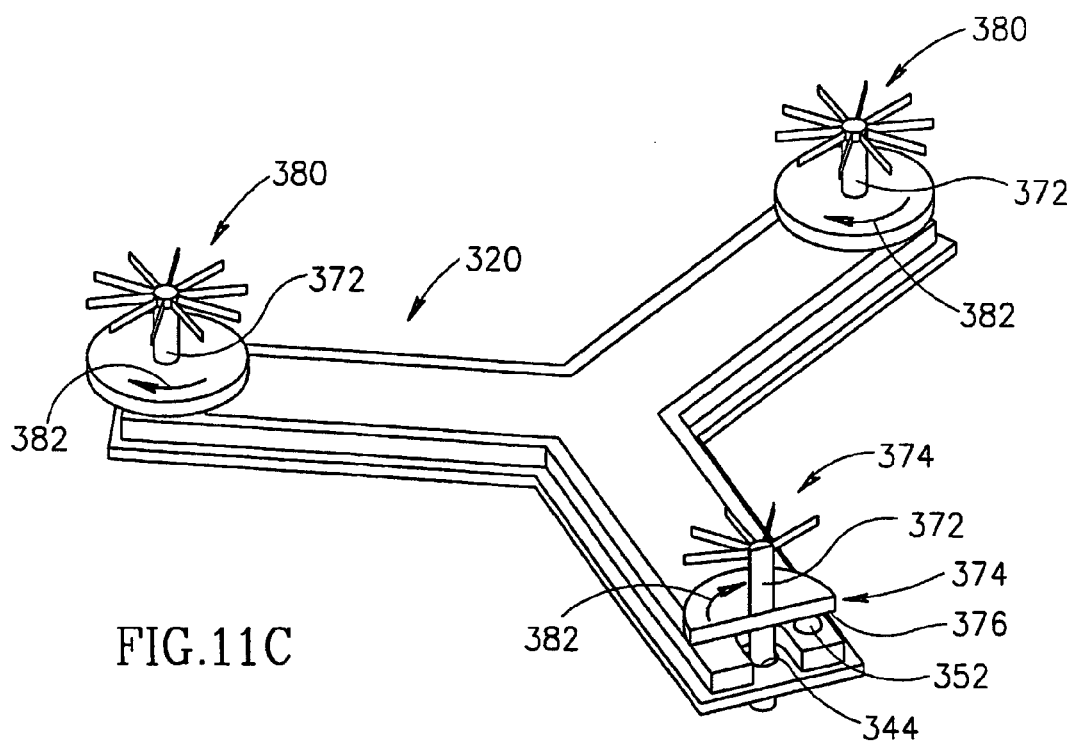
FIG. 11C schematically shows the star motor shown in FIG. 11A rotating three shaver rotary blade heads, in accordance with an embodiment of the present invention.

FIG. 11C schematically shows star motor 320 being used in a shaver (not shown), in accordance with an embodiment of the present invention, to drive three shafts 372 of a type shown in inset 370 of FIG. 11A. Each shaft 372 is mounted with a rotary blade head 380 of the shaver.

Star motor 320 and shafts 372 are mounted in an appropriate support structure (not shown) so that each shaft 372 is positioned in a hole 344 of a driving arm 322 of motor 320. The axis of the shaft 372 is coincident with centerline 346 (FIG. 11A) of the hole 344 and a large surface 376 of its disc 374 is resiliently pressed to friction nub 352 of the driving arm. Elliptical motion of friction nub 352 generates a torque that rotates coupling disc 374 and shaft 372 and thereby rotary blade head 380. Because friction nub 352 is located along line 356, (FIG. 11A) which is perpendicular to the plane formed by centerline 350 of hole 344 and axis 324, substantially all force applied by the friction nub to disc 374 is perpendicular to a radius of the disc. As a result, substantially all force applied by friction nub 352 to coupling disc 374 parallel to the plane of the disc generates a torque about the axis of shaft 372 on the disc and transmission of torque to coupling disc 374 by the driving arm 322 is relatively efficient.

Direction of rotation of shafts 372 in FIG. 11C are indicated by curved arrows 382. For the configuration of star motor 320 shown in FIG. 11A all the shafts rotate clockwise. If friction nubs 352 were located on the corners of their respective driving arms 322 opposite to corners 354 on which they are shown in FIG. 11A, shafts 372 would rotate counterclockwise.

Shaft 372 and rotary blade head 374 coupled to the foremost driving arm 322 of star motor 320 are partially cut away to show details of the position of the shaft and contact of its coupling disc 374 with the driving arm's friction nub 352.

It is to be noted that whereas holes 344 are described as clearance holes, in some embodiments of the present invention, holes 344 are not clearance holes. Instead they are formed with a suitable radius, or fitted or formed with an appropriate structure so that they can hold a shaft 372 and function as a bearing for the shaft. In some embodiments of the present invention, holes 344 are fitted with bearings to hold shafts 372.

Whereas in FIG. 11C one star motor 320 is shown driving shafts 372, in some embodiments of the present invention, two star motors of a type shown in FIGS. 11A and 11C are used to drive the shafts.

Figure 12A:
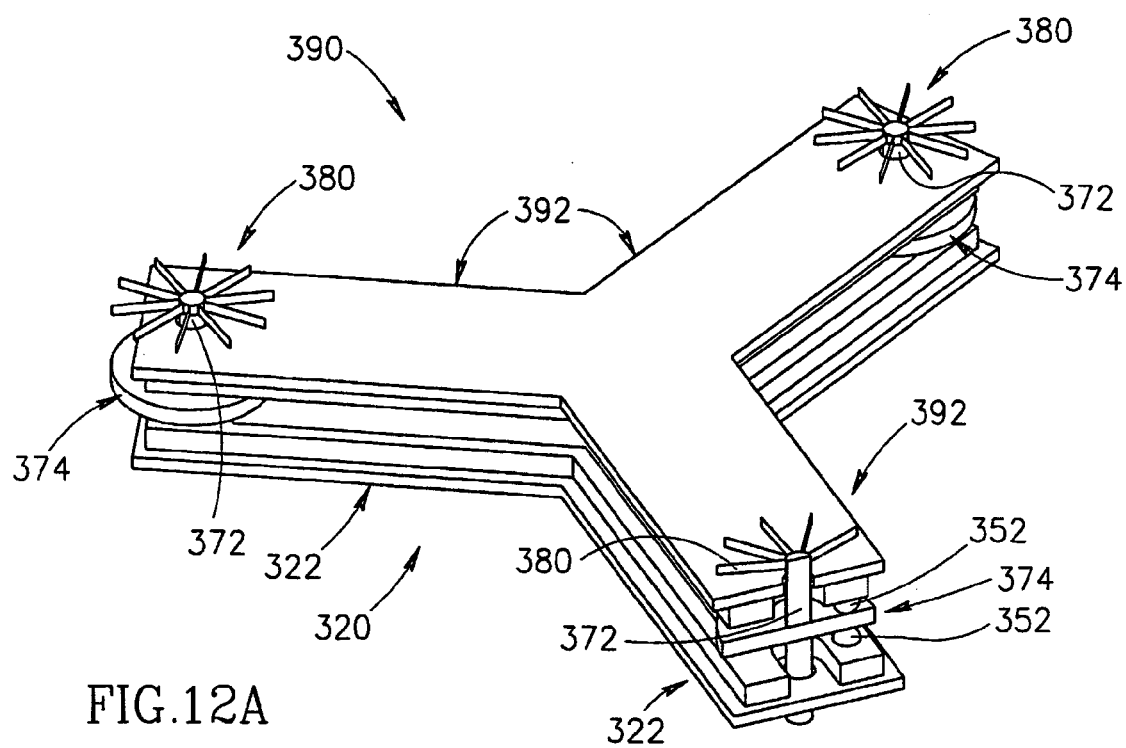
FIG. 12A schematically shows two star motors of a type shown in FIGS. 11A and 11C driving three rotary blade heads, in accordance with an embodiment of the present invention.

FIG. 12A schematically shows shafts 372 being driven by a star motor 320 such as shown in FIGS. 11A and 11C and a star motor 390 having driving arms 392, in accordance with an embodiment of the present invention. Star motor 390 is a mirror image of star motor 320 in a plane parallel to the plane of motor 320 that passes through the centers of coupling discs 374.

Coupling discs 374 are sandwiched between motor 320 and mirror image motor 390 so that a friction nub 352 of each star motor resiliently presses on each disc from opposite sides of the disc. The foremost driving arm 392 of mirror image star motor 390 and shaft 372, rotary blade head 380 and coupling disc 374 coupled to the foremost driving arm 392 of motor 390 are partially cut away to reveal details of coupling of the shaft to the two motors. The cutaway features show friction nubs 352 of star motor 320 and its mirror image star motor 390 pressing on opposite sides of coupling disc 374.

Figure 12B:
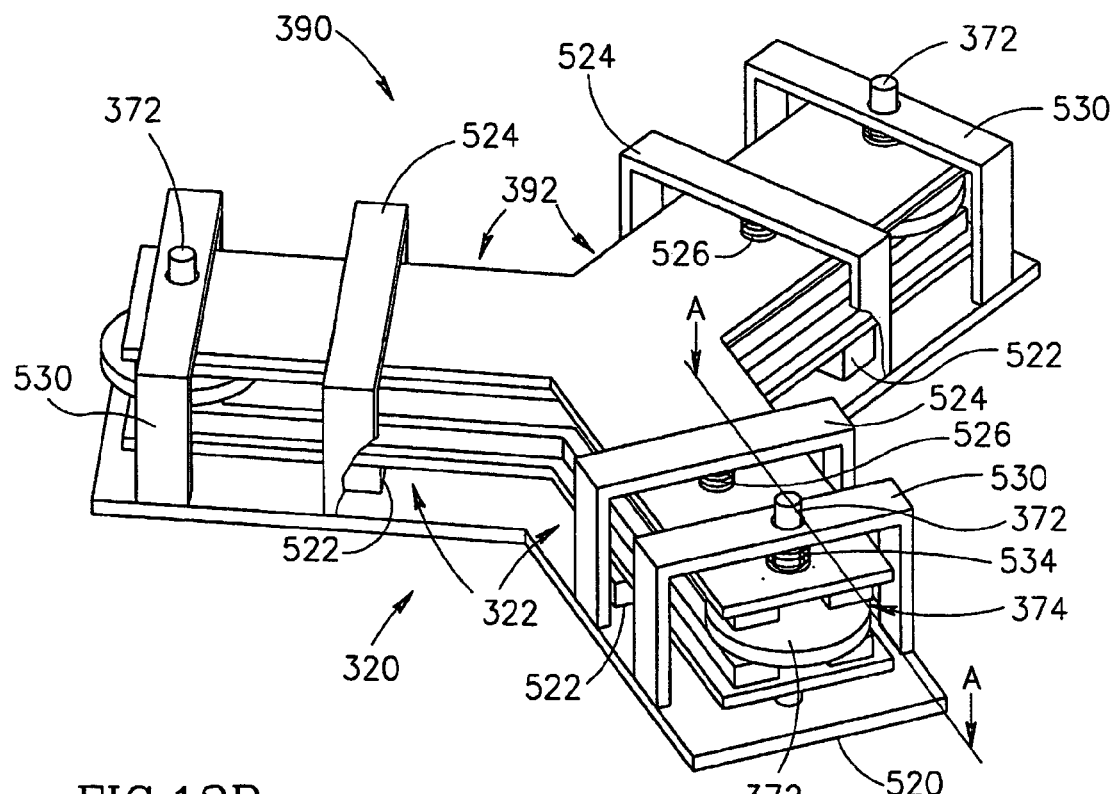
FIG. 12B schematically shows apparatus that presses star motors shown in FIG. 12A resiliently towards coupling discs of shafts that the star motors drive, in accordance with an embodiment of the present invention.

Various configurations of elastic elements and other support elements, in accordance with embodiments of the present invention are used to maintain friction nubs 352 of piezoelectric motors 320 and 390 resiliently pressed to coupling discs 374 of shafts 372. FIG. 12B schematically shows an example, in accordance with an embodiment of the present invention, of a configuration of elastic and other support elements used to resiliently press piezoelectric motor 390 to piezoelectric motor 320 and thereby friction nubs 352 to their respective coupling discs 374. In FIG. 12 B rotary blade heads 380 are not shown to prevent clutter.

In FIG. 12B, piezoelectric motor 320 is supported by a support plate 520. Each driving arm 322 of piezoelectric motor 320 rests on an, optionally rigid, pedestal 522 on support plate 520. Preferably, each pedestal 522 contacts its respective driving arm 322 at a region of the driving arm that is a nodal region for vibration modes of piezoelectric motor 320 that are used to drive shafts 372. For each driving arm 392 of piezoelectric motor 390, optionally, a bracket 524 extends from support plate 520 and loops around the driving arm. A spring 526, or other appropriate elastic element, is supported by bracket 524 so that the spring resiliently presses on the driving arm 392. Preferably, spring 526 presses on driving arm 392 at a location that is a nodal region of the driving arm. Brackets 524 are cutaway, where appropriate, to show pedestals 522 and springs 526.

In some embodiments of the present invention, a bracket 530 extends from support plate 520 and loops around each driving arm 392 of piezoelectric motor 390 at the location of the shaft 372 that is driven by the driving arm. Bracket 530 is formed with a clearance hole 532 through which shaft 372 passes. A spring 534, or other suitable elastic element, through which shaft 372 passes is supported by bracket 530 so that the spring resiliently presses on the end of the driving arm 392 in the region of the shaft.

Springs 526 and 530 function to resiliently press piezoelectric motor 390 to piezoelectric motor 320 and thereby to press friction nubs 352 of both motors to coupling discs 374. Forces applied by springs 524 and 530 that operate to press piezoelectric motors 390 to piezoelectric motor 320 also operate, via contact of friction nubs 352 with coupling discs 374 to keep piezoelectric motor 320 resiliently pressed to pedestals 522.

In some embodiments of the present invention, springs or other elastic elements, are also positioned between piezoelectric motor 390 and piezoelectric motor 320 to resiliently press piezoelectric motor 320 to pedestals 522. In some embodiments of the present invention, to press piezoelectric motor 320 to pedestals 522, a spring is positioned between each driving arm 322 of piezoelectric motor 320 and its opposite, mirror image driving arm 392 of piezoelectric motor 390.

Figure 12C:
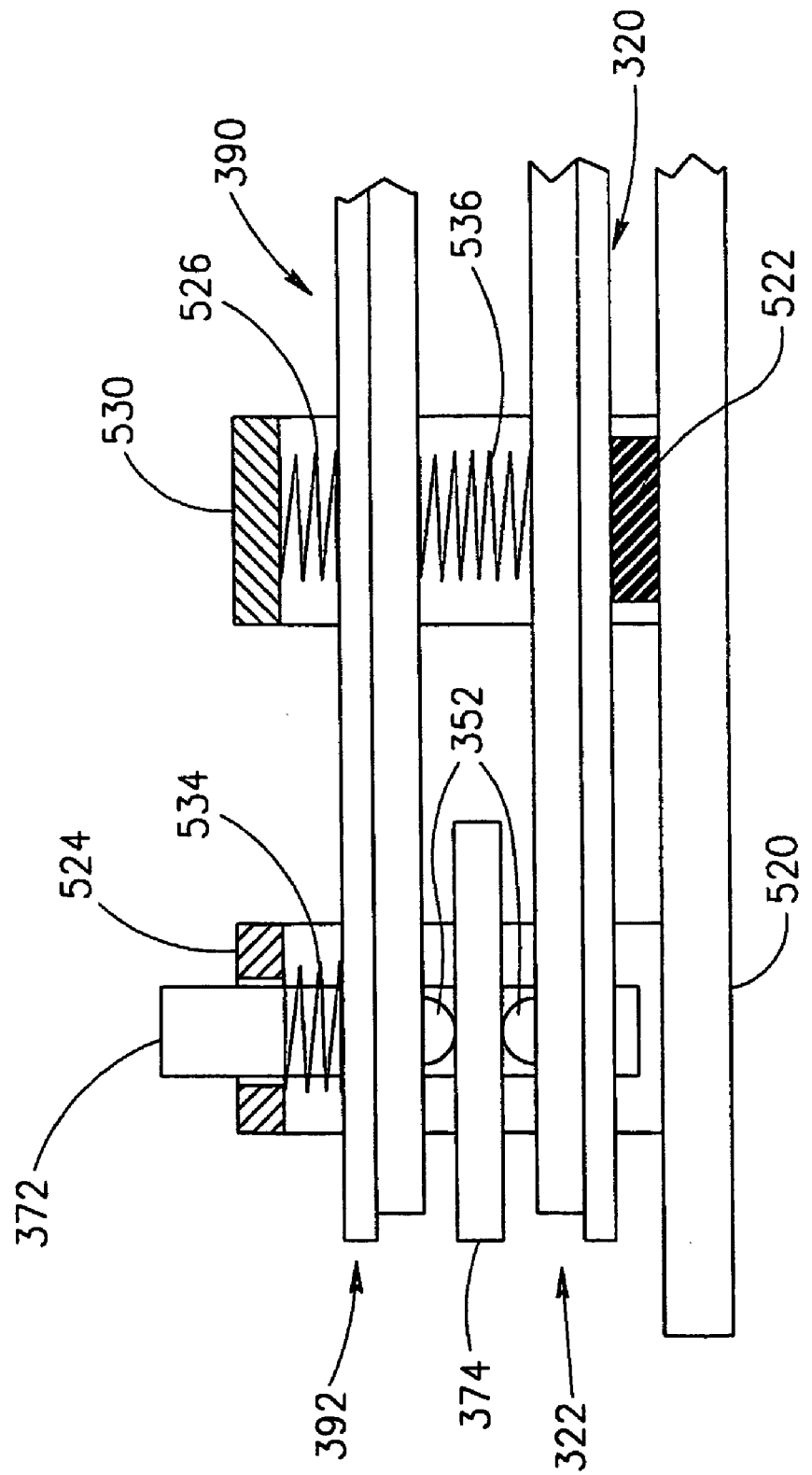
FIG. 12C schematically shows a side view of apparatus that presses star motors shown in FIG. 12A resiliently towards coupling discs of shafts that the star motors drive, in accordance with an embodiment of the present invention.

FIG. 12C shows a schematic side view along line A—A in FIG. 12B of a shaft 372 and driving arms 322 and 392 of piezoelectric motors 320 and 390 respectively that drive the shaft. The side view schematically shows springs 526 and 534 that are supported respectively by brackets 524 and 530. Springs 526 and 534 press on driving arm 392 of piezoelectric motor 390 and exert forces between driving arms 32 and 392 that resiliently press friction nubs 352 to coupling disc 374. A spring 536 between driving arms 322 and 392 that operates to press piezoelectric motor 320 to pedestal 522 is also shown. Brackets 526 and 530 are cutaway to show features that they would otherwise hide in the side view.

Whereas in FIGS. 11A–12C piezoelectric star motors 320 and 390 are shown having base plates 340 formed with holes 344 for receiving shafts (e.g. shafts 372 shown in FIGS. 11A, 11B–12C), as noted above, in some piezoelectric star motors, the base plates are formed with slots for receiving the shafts. In the case where base plates 340 are formed with slots, in some embodiments of the present invention, shafts driven by the motors are, optionally, held in place by elastic elements.

Figure 12D:
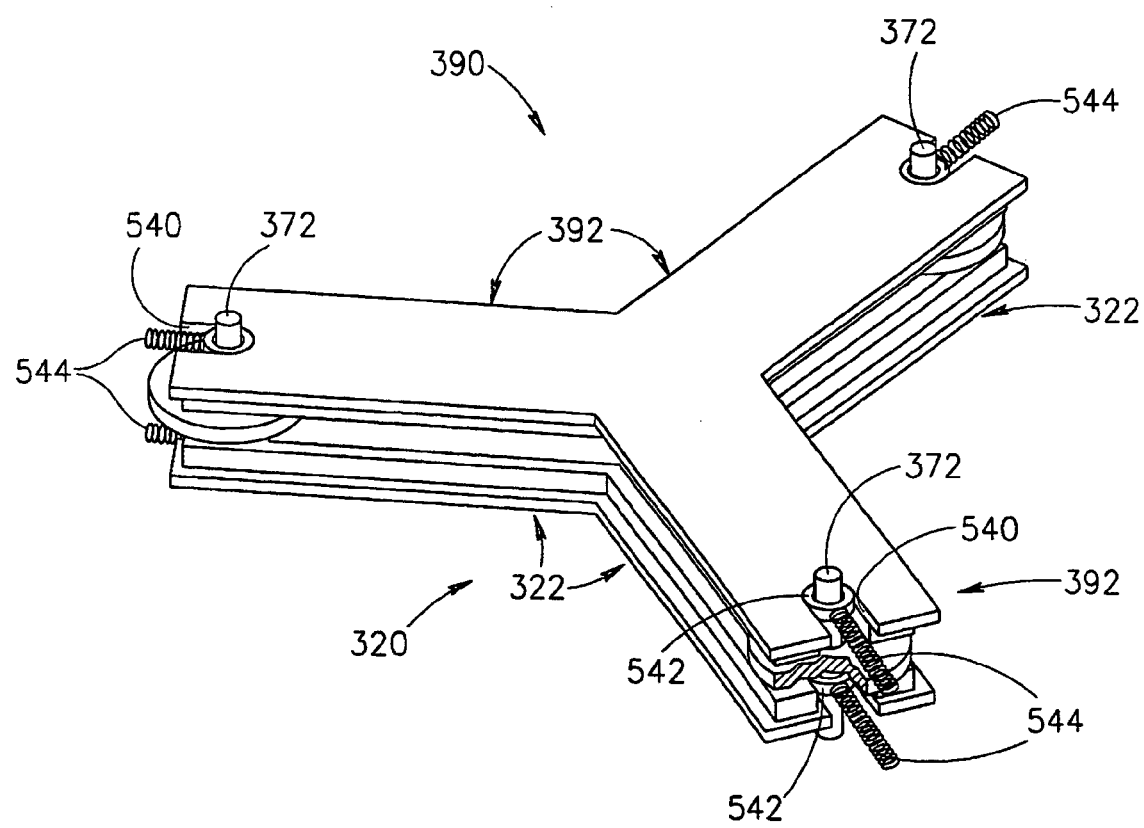
FIG. 12D schematically shows a method and apparatus for mounting shafts that are rotated by the star motors shown in FIGS. 12A–12C to the motors, in accordance with an embodiment of the present invention.

FIG. 12D schematically shows a variation of piezoelectric motors 320 and 390 shown in FIGS. 12A–12C in which base plates 340 of the motors are formed with slots 540 instead of with holes for holding shafts 372. Each shaft 372 is preferably coupled to two ring bearings 542 spaced apart along the shaft so that the shaft can be mounted to motors 320 and 390 with a bearing 542 in each of slots 540 of driving arms 322 and 392 that drive the shaft. A spring 544 or other elastic element supported by an appropriate structure (not shown), which may, for example, be a frame to which piezoelectric motors 320 and 390 are mounted, presses each of bearings 542 into position in its respective slot 540 slot.

Springs 544 also function to damp longitudinal vibrations in driving arms 392 and 322 of star motors 390 and 320 so that amplitudes of the longitudinal vibrations do not exceed desired upper limits. Whereas damping springs are shown for the variations of star motors 320 and 390 shown in FIG. 12D, damping springs are used where advantageous in other star motors, in accordance with some embodiments of the present invention. Furthermore, whereas in FIG. 12D springs 544 damp longitudinal vibrations by pressing on bearings 542, in some embodiments of the present invention, damping springs press directly on the ends of the arms of the piezoelectric vibrator and/or base plate in a star motor to damp longitudinal vibrations in the motor's driving arms.

When a shaft is driven by two piezoelectric motors, as in the examples of embodiments of the present invention shown in FIGS. 12A–12D, to transfer energy from each of the motors to the shaft efficiently, it is advantageous that both motors drive the shaft at substantially the same velocity. For the star motor configurations shown in FIGS. 12A–12D, this generally requires that friction nubs 352 of piezoelectric motors 320 and 390 that transmit torque to a coupling disc 374 contact the coupling disc at substantially a same radius. As noted above, piezoelectric motors 320 and 390 are mirror images of each other. As a result, friction nubs 352 of piezoelectric motors 320 and 390 that contact a same coupling disc 374 are opposite each other and generally contact the coupling disc at equal radii. However, as a result of wear, and/or vibrations and/or differences in dimensions and relative motion of parts determined by fabrication and assembly tolerances, friction nubs 352 contacting a same coupling disc 374 can contact the coupling disc at different radii or otherwise operate at different velocities.

Figure 12E:
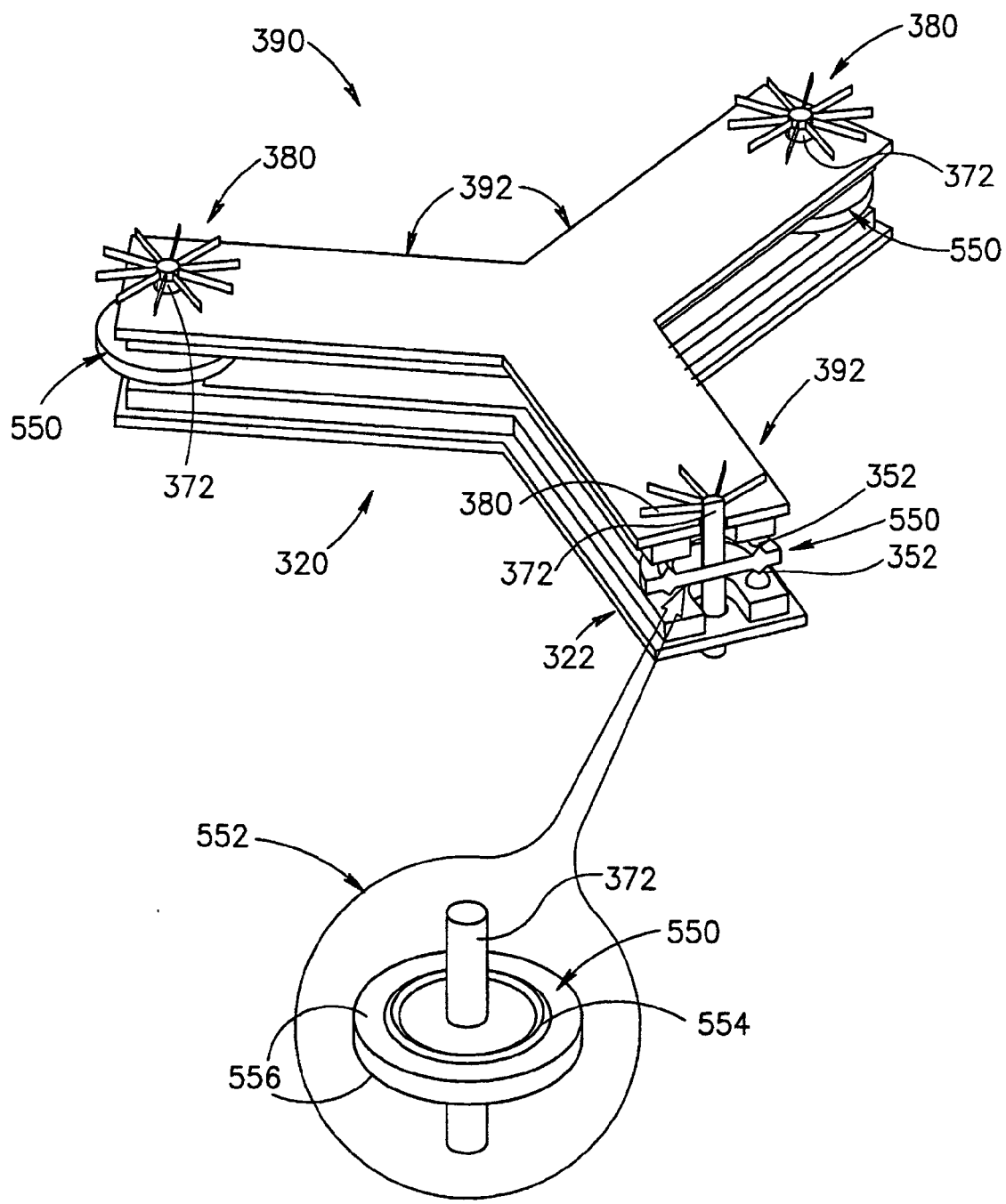
FIG. 12E schematically shows star motors shown in FIGS. 12A–12C coupled to shafts via coupling discs formed with circular ridges for coupling friction nubs of the motors to the coupling discs, in accordance with an embodiment of the present invention.

FIG. 12E schematically shows piezoelectric star motors 320 and 390 shown in FIGS. 12A–12D coupled to drive shafts 372 via coupling discs 550 that are constructed to reduce differences between radii at which friction nubs 352 of the piezoelectric motors contact a same coupling disc. As in FIG. 12A, the foremost driving arm 392 of star motor 390, shaft 372 and coupling disc 550 coupled to the foremost driving arms 392 and 322 of star motors 390 and 322 are partially cut away to reveal details of coupling of the motors to the coupling disc. Inset 552 in FIG. 12E shows a perspective view of a coupling disc 550 and a shaft 372 to which the coupling disc is connected.

Coupling discs 550 are formed with a narrow raised circular ridge 554 on each of its large surfaces 556. Ridges 554 of each coupling disc 550 have substantially a same radius and are mirror images of each other in the plane of the coupling disc 550. The radii of ridges 554 are such that friction nubs 352 of star motors 320 and 390 that rotate a same coupling disc 554 seat on the disc's ridges. The widths of ridges 554 are less than the width of friction nubs 352 of piezoelectric motors 320 and 390. Therefore, as a friction nub 352 and/or ridge 554 of the coupling disc 550 on which it seats wears, or as the friction nub moves slightly with respect to the annulus, the radius at which the friction nub contacts the coupling disc remains substantially constant. As a result, differences between radii at which friction nubs 352 of star motors 320 and 390 contact a same coupling disc 550 are substantially reduced.

In addition to having friction nubs 352 of both star motors 320 and 390 contact coupling discs that they drive at same radii it is also advantageous for efficient operation of the motors that the vibration modes at which they operate have substantially a same frequency. In some embodiments of the present invention, a controller monitors and controls driving circuits that energize star motors 320 and 390, using methods and devices known in the art, so that the driving circuits excite the motors at substantially a same frequency.

It is to be noted that an optimum resonant frequency for driving different star motors 320 and 390 can vary as a result of fabrication tolerances and wear of the motors. In some embodiments of the present invention, driving circuits that drive star motors 320 and 390 are designed, using methods and devices known in the art, to determine an optimum frequency at which to drive the motors.

In some embodiments of the present invention, a same AC driving voltage excites star motors 320 and 390. Therefore, friction nubs 352 on both sides of each coupling disc 374 transmit torque simultaneously to the coupling disc. Forces that one friction nub 352 exerts perpendicular to the plane of a coupling disc 374 are therefore canceled by forces exerted perpendicular to the plane of the coupling disc by the other friction nub 352. As a result, when two mirror image star motors are used to drive shafts 372, in accordance with an embodiment of the present invention, there is substantially no torque applied to the disc's shaft 372 in a direction perpendicular to the shaft. Wear of the disc, its shaft and bearings holding the shaft is thereby reduced.

In some embodiments of the present invention voltage applied to star motor 320 is 180° out of phase with voltage applied to star motor 390 (or polarization directions of the piezoelectric material in the star motors are reversed relative to their respective structures and a same AC voltage is applied to both motors). As a result, friction nubs 352 of star motors 320 and 390 coupled to a same coupling disc 374 alternately contact and transmit torque to the coupling disc. An advantage of alternate transmission of torque to a coupling disc 374 is that torque transmission is smoother than when torque is transmitted to the coupling disc simultaneously by both motors.

Figure 13A:
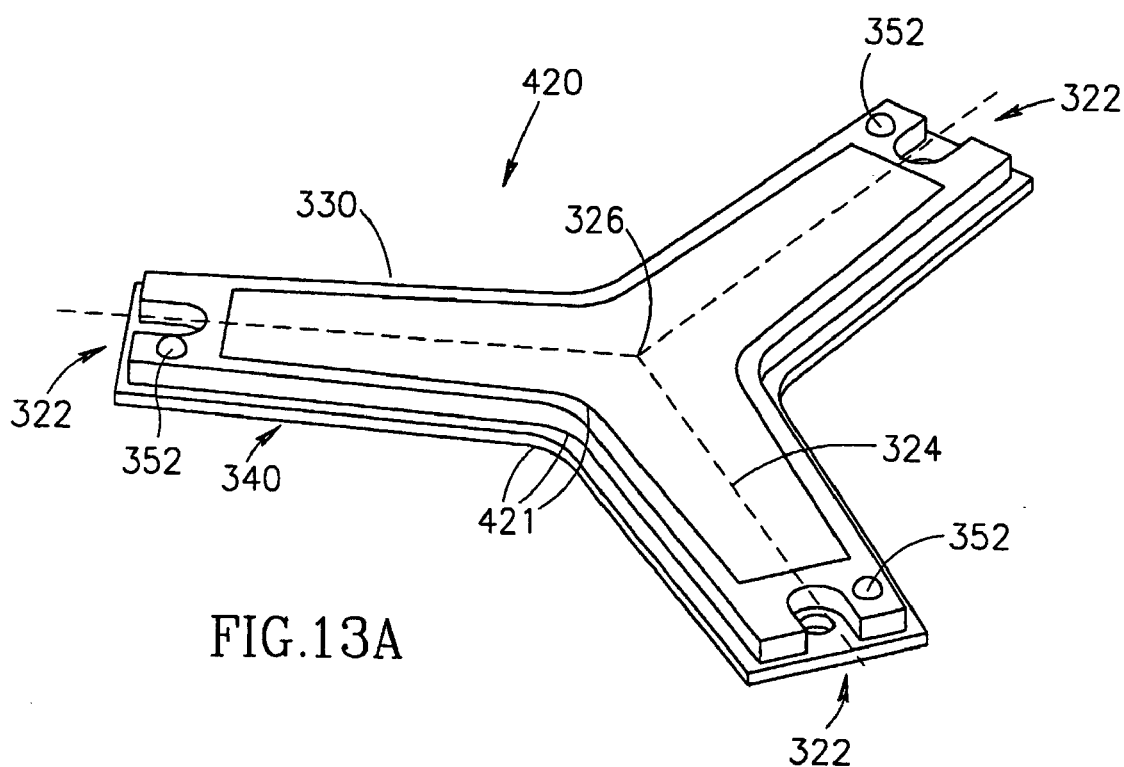
FIG. 13A schematically shows a variation of the star motor shown in FIGS. 11A–12A, in accordance with an embodiment of the present invention.

FIG. 13A schematically shows a star motor 420, which is a variation of star motor 320. In star motor 420 edges of piezoelectric vibrator 330 and base plate 340 of adjacent driving arms do not meet at sharply defined corners as they do in star motor 320 but instead meet at rounded junctions 421. Rounded junctions decrease stress in regions where adjacent driving arms 322 meet and make it easier to polish and finish piezoelectric vibrator 330.

In addition, driving arms 322 need not be rectangular but instead may taper in width along their respective axes 324. For a given AC voltage and given thickness of driving arms 322, tapering amplifies amplitudes of motion of mass points at ends of driving arms 322 of star motor 420 relative to amplitudes of corresponding mass points in driving arms 322 of star motor 320. As a result, amplitudes of motion of friction nubs 352 comprised in star motor 420 are amplified with respect to amplitudes of motion of friction nubs 352 comprised in star motor 320.

In some embodiments of the present invention thickness of piezoelectric vibrator 330 and/or base plate 340 decreases with distance from center 326 of star motor 420 along axes 324. As in the case of tapering, decrease in thickness of piezoelectric vibrator 330 and/or base plate 340 along axes 324 results in amplified motion of friction nubs 352. (It is to be noted that tapering or thinning a driving arm will generally, for a given voltage, reduce maximum force provided by the driving arm.)

In star motors 320 and 420 shown in FIGS. 11A–13A, bending vibrations of driving arms 322 are generated by mechanical stress between a layer of piezoelectric material driven to expand and contract by an electric field and a passive layer of material that is not excited by the electric field. In star motors in accordance with some embodiments of the present invention other methods are used to generate bending vibrations in driving arms of the motors.

In accordance with some embodiments of the present invention a star motor comprises a plurality of layers of piezoelectric material and bending vibrations in driving arms of the motor are generated by electrifying appropriate electrodes on layers of the motor.

Figure 13B:
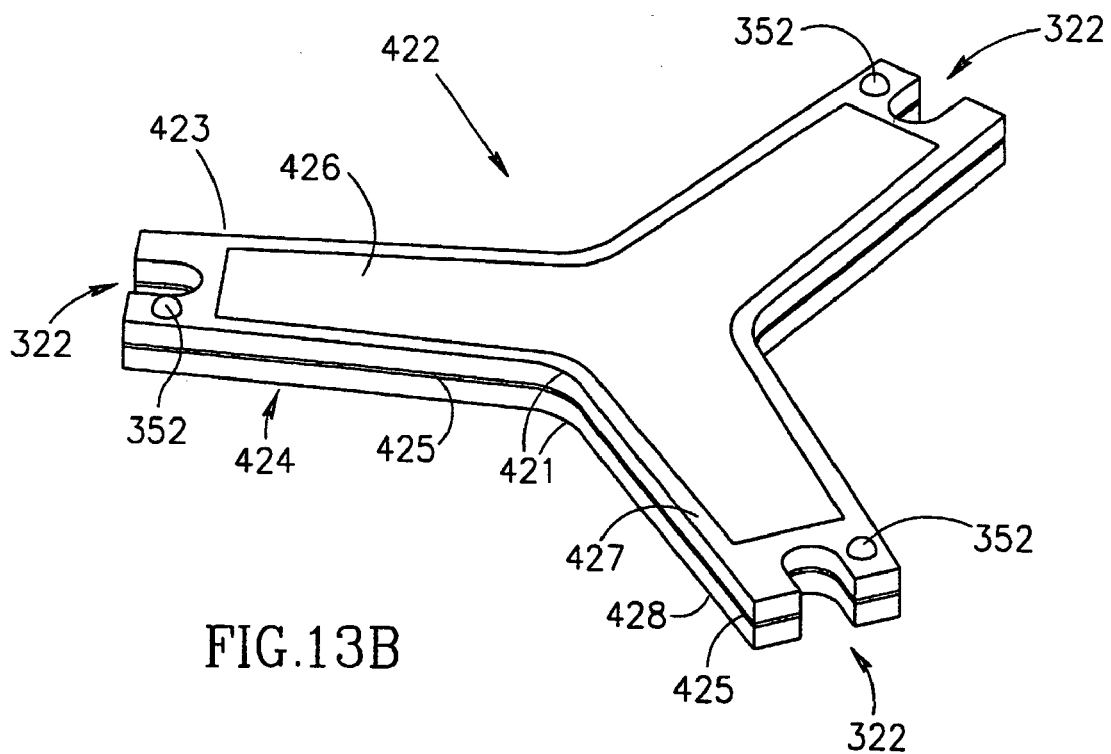
FIG. 13B schematically shows a star motor comprising two piezoelectric layers, in accordance with an embodiment of the present invention.

FIG. 13B schematically shows an example of a star motor 422, in accordance with an embodiment of the present invention, comprising two layers of piezoelectric material, a top layer 423 and a bottom layer 424. Electrodes on surface regions of the motor and sandwiched between layers 423 and 424 are electrified to generate bending vibrations in driving arms 322 of the motor.

Star motor 422, by way of example, has a shape similar to that of star motor 420 and is formed with tapering driving arms 322 and rounded junctions 421 between adjacent driving arms 322. Optionally, a single large "central" electrode 425, only an edge of which is shown in FIG. 13B, is sandwiched between top and bottom piezoelectric layers 423 and 424. In some embodiments of the present invention, bottom piezoelectric layer 424 is a mirror image in the plane of central electrode 425 of top piezoelectric layer 423. Top piezoelectric layer 423 optionally has a single large electrode 426 on a surface 427 thereof and bottom piezoelectric layer 424 has a corresponding "mirror image electrode" (not shown) on a surface 428 of the bottom piezoelectric layer. Assume, by way of example, that polarization directions of the two piezoelectric layers 423 and 424 are perpendicular to central electrode 425 and point in opposite directions (which, for perpendicular polarization directions follows from layers 423 and 424 being mirror images of each other).

In accordance with an embodiment of the present invention, to generate vibrations in friction nubs 352 of star motor 422 useful for transmitting motion to a moveable element, a first AC voltage difference is applied between central electrode 425 and electrode 426. A second voltage difference having a same frequency and phase but different amplitude as the first voltage difference is applied between central electrode 425 and the mirror image electrode on surface 428 of piezoelectric layer 424. The applied voltage differences generate longitudinal and bending vibrations in driving arms 322 that result in elliptical vibrations of friction nubs 352 suitable for transmitting motion to moveable elements.

Figure 13C:
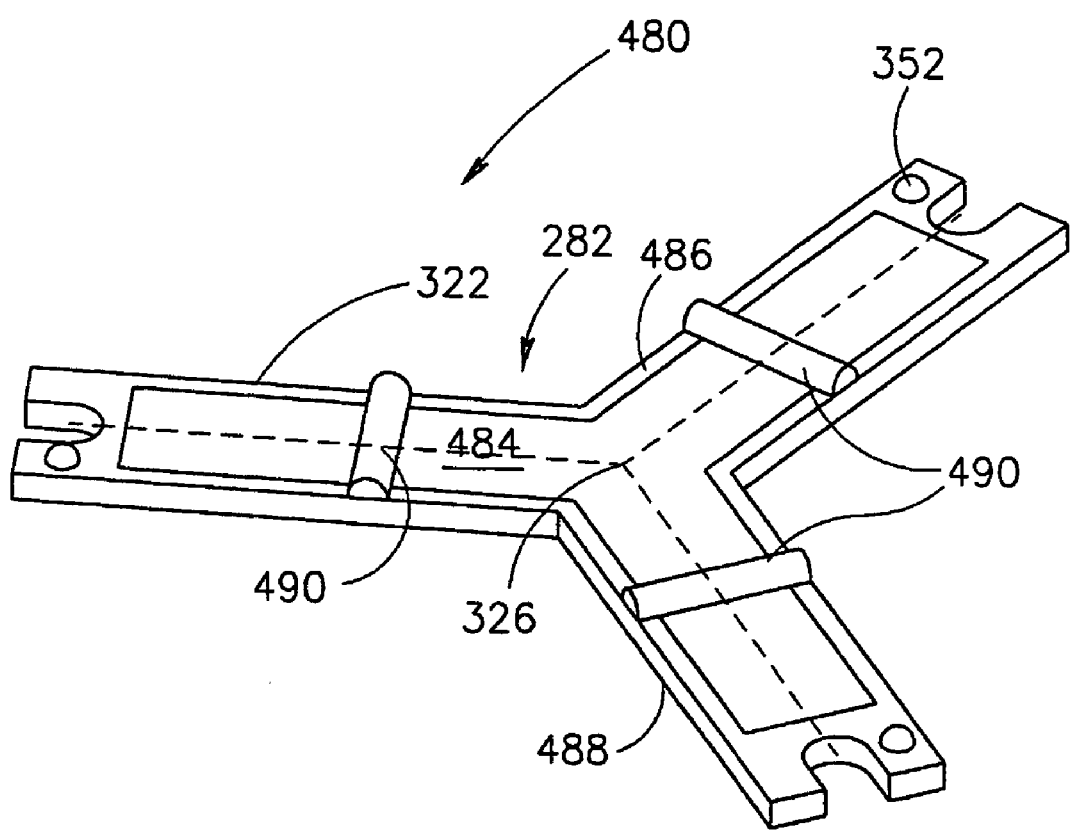
FIG. 13C schematically shows a star motor in which an asymmetrical mass distribution is used to excite bending vibrations in driving arms of the motor, in accordance with an embodiment of the present invention.

FIG. 13C schematically shows an example of a star motor 480 in accordance with an embodiment of the present invention in which asymmetries in the mass distributions of driving arms 322 generate bending vibrations in the driving arms.

Star motor 480 comprises a single piezoelectric vibrator 482 having a shape, by way of example, similar to that of piezoelectric vibrator 330 comprised in star motor 320, which is shown in FIG. 11A–12A. Star motor 480 optionally has a single large electrode 484 on a top surface 486 of the motor and optionally an identical electrode (not shown) on a bottom surface 488 of the motor. Each driving arm 322 has a mass element 490 affixed to the driving arm on face surface 486. Mass element 490 breaks symmetry of the mass distribution of the driving arm about a plane (not shown) though the center of the driving arm parallel to surface 486.

When an AC voltage is applied between electrode 484 and the electrode on surface 488 of star motor 480, a longitudinal vibration is excited in each driving arm 322 of the motor. Forces generated by the longitudinal vibration that accelerate mass element 490 of the driving arm 322 generate torque on the driving arm that excites a bending vibration mode in the driving arm. In some embodiments of the present invention, mass element 490 of each driving arm is located at an antinode of the longitudinal vibration excited in the driving arm.

In some star motors, in accordance with embodiments of the present invention, forces between friction nubs of driving arms of the motors and moveable elements that the driving arms move generate bending vibrations in the driving arms. When the friction nub of a driving arm transmits motion to a moveable element it applies a force to the element that is parallel to the plane of the driving arm. A reaction force equal and opposite to the force applied to the moveable element by the friction nub operates on the friction nub. Since the contact point between the friction nub and the moveable element is displaced from the plane of the driving arm, the reaction force generates a torque that bends the driving arm and excites a bending vibration in the driving arm.

Figure 14A:
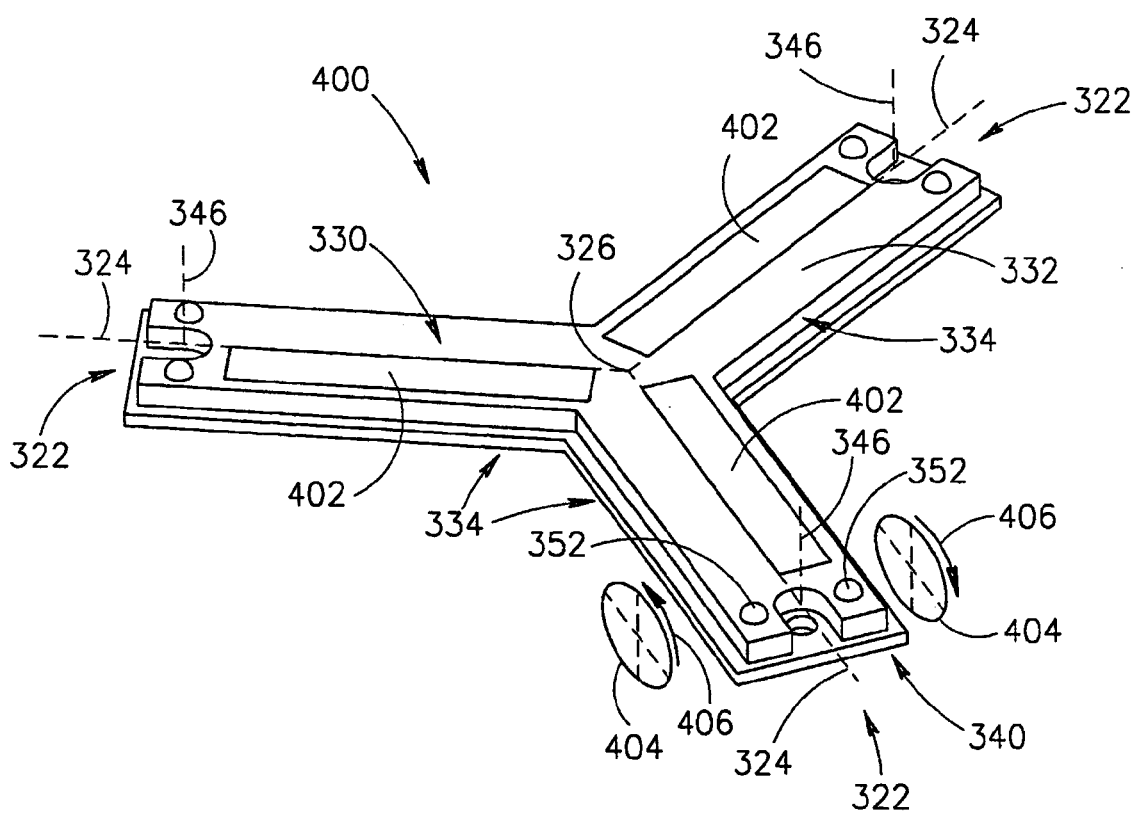
FIG. 14A schematically shows another star piezoelectric motor having three driving arms, in accordance with an embodiment of the present invention.

FIG. 14A schematically shows another star motor 400 in accordance with an embodiment of the present invention.

Star motor 400 is similar to star motor 320. However, unlike star motor 320, star motor 400 has two friction nubs 352 on each driving arm 322 and instead of a single large electrode 60 (FIGS. 11A and 11C) covering face surface 332 of piezoelectric vibrator 330 the star motor has three electrodes 402. One electrode 402 is located in a region of face surface 332 of each driving arm 322. In some embodiments of the present invention, each electrode 402 runs substantially the length of the driving arm 322 on which it is located and covers substantially one half of the surface area 332 of the arm on one side of axis 324. In some embodiments of the present invention, electrodes 402 are located on a same side of axes 324 of their respective driving arms 322. In FIG. 14A, by way of example, electrodes 402 are located on the left sides of their respective axes 324 as seen from center 326 of star motor 400.

When an AC voltage difference is applied between electrode 402 of a driving arm 322 and base plate 340, the voltage difference generates a longitudinal vibration in the arm parallel to axis 324 of the arm and a twisting vibration of the arm about the axis. The twisting vibration cyclically moves one friction nub 352 of the driving arm 322 up and down while moving the other friction nub 352 respectively down and up along directions perpendicular to the plane of the driving arm. Friction nubs 352 execute a seesaw motion with respect to each other about axis 324 of the driving arm. In some embodiments of the present invention all electrodes 402 are electrically connected.

The up and down motion of the twisting vibration and the back and forth motion of the longitudinal vibration cause each friction nub 352 to vibrate with an elliptical motion. The elliptical motion of each friction nub 352 for the foremost driving arm 322 in FIG. 14A is schematically represented by an ellipse 404 located near the friction nub. Since one friction nub 352 moves up while the other moves down, the friction nubs "move around" their respective ellipses 404 in a same sense, as seen from a point on axis 324 located between the friction nubs. In FIG. 14A both friction nubs move counterclockwise. Direction of motion of friction nubs 352 about their respective ellipses 404 are indicated by curved arrows 406. It should be noted that were electrodes 402 to be located on the right sides of their respective driving arms 322, they would move clockwise around their ellipses 404.

Star motor 400 is coupled to shafts of the type shown in FIGS. 11A–12A similarly to the manner in which star motor 320 is coupled to the shafts. A shaft 372 is positioned to pass through a clearance hole 344 of a driving arm 322 of motor 400 so that the shaft's coupling disc 374 is resiliently pressed to both friction nubs 352 of the driving arm. When the driving arm 322 is excited to vibrate by an AC voltage, during each vibration cycle of the driving arm each friction nub 352 alternately contacts coupling disc 374 and transmits torque to the disc. For the configuration of electrodes 402 shown in FIG. 14A, driving arms 322 of star motor 400 drive shafts 372 counterclockwise.

Figure 14B:
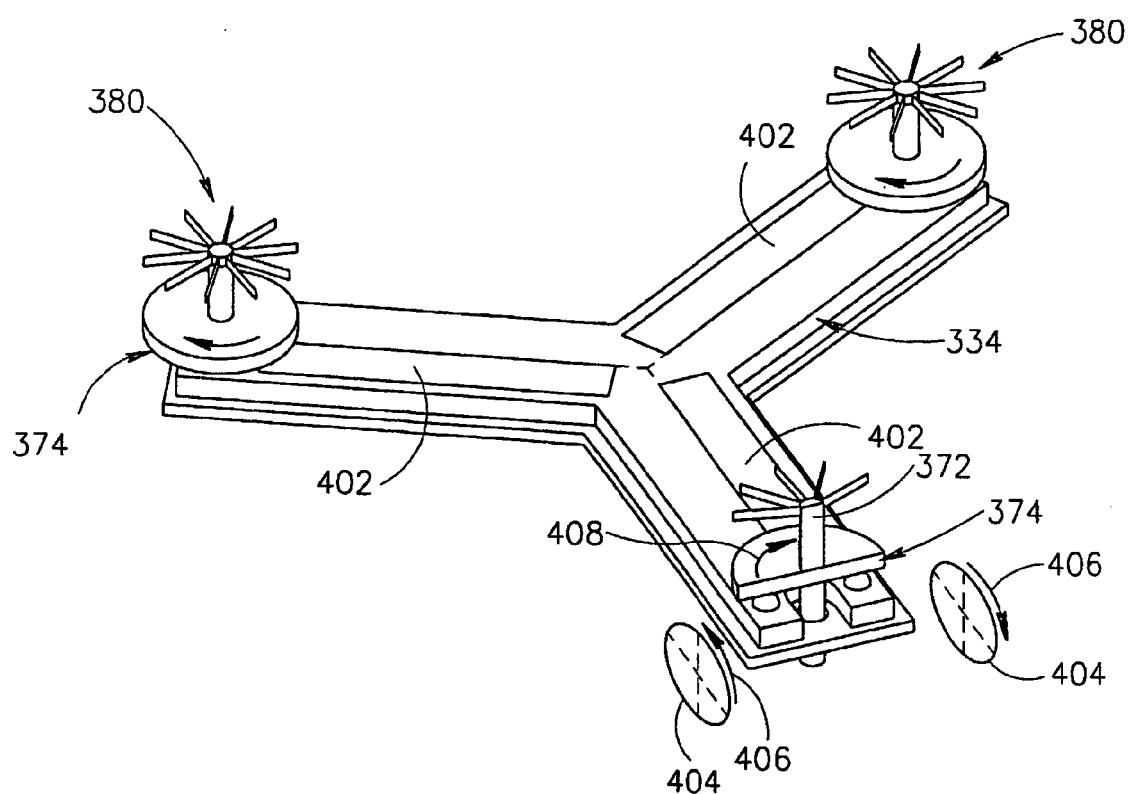
FIG. 14B schematically shows the star motor shown in FIG. 14A rotating three rotary blade heads, in accordance with an embodiment of the present invention.

As in the case of star motor 320, one or two star motors 400, in accordance with embodiments of the present invention, are used to drive three shafts 372. FIG. 14B schematically shows a single star motor 400 coupled to drive three shafts 372 connected to rotary shaver blade heads 380, in accordance with an embodiment of the present invention. Direction of rotation of shafts 372 and rotary blade heads 380 are shown by curved arrows 408. It is to be noted that were electrodes 402 located on sides of their respective driving arms opposite to the sides on which they are shown in FIGS. 14A and 14B shafts 372 would be driven clockwise.

In some configurations of star motor 400, dimensions and material of the motor are chosen so that a frequency of a resonant bending vibration mode of driving arms 322 of the motor is close to a frequency of a resonant transverse vibration mode of the driving arms. The bending and transverse vibration modes generate motion of friction nubs 352 that are useful for rotating a moveable element.

The bending mode of a driving arm 322 is a bending mode perpendicular to the plane of the driving arm, i.e a bending mode similar to bending modes described above. The transverse mode is an "in-plane" vibration mode that causes bending of the driving arm 322 in the plane of the driving arm. The bending mode and transverse mode are both excited when the longitudinal vibration mode is excited. The bending mode moves both friction nubs 352 of the driving arm 322 up and down perpendicular to the plane of the driving arm together so that both friction nubs simultaneously contact a surface of a moveable element being moved by the driving arm. However, the transverse mode moves friction nubs 352 back and forth in opposite directions about centerline 346 of hole 344 of the driving arm, i.e. friction nubs 352 "seesaw" about centerline 346 rather than axis 324. Therefore, when the two friction nubs contact the element being moved they generate a torque couple on the element that operates to rotate the element about centerline 346.

Figure 14C:
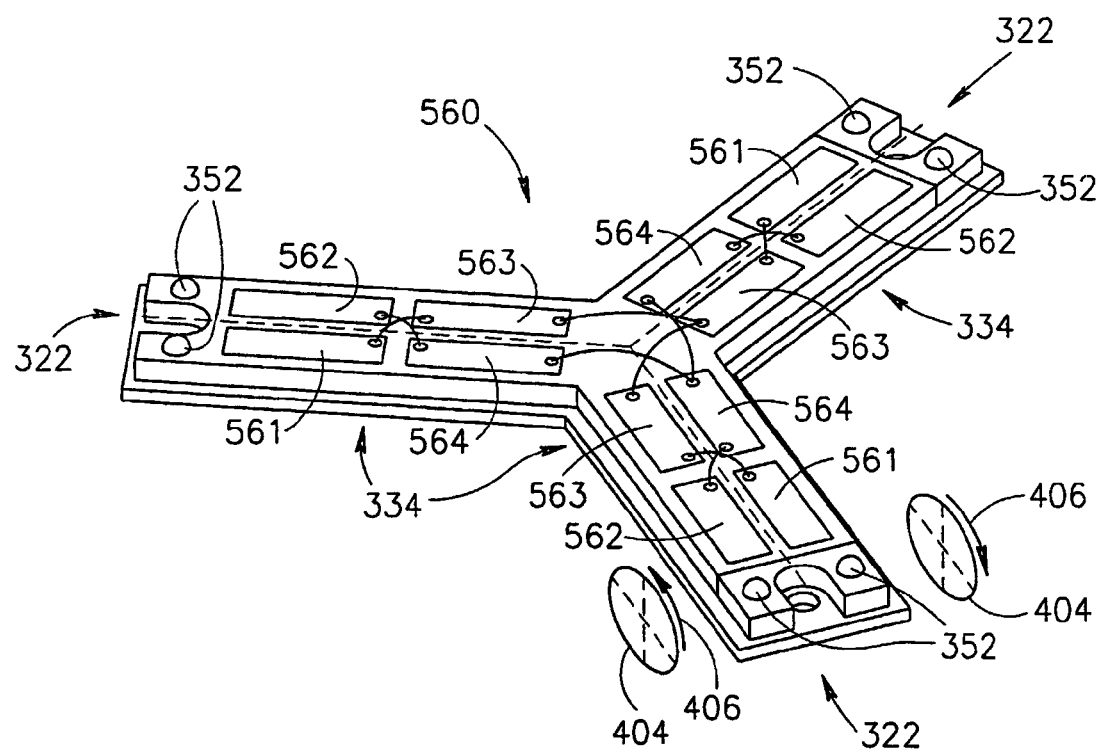
FIG. 14C schematically shows another star motor, which is similar to the star motor shown in FIGS. 14A and 14B, in accordance with an embodiment of the present invention.
Figure 15A:
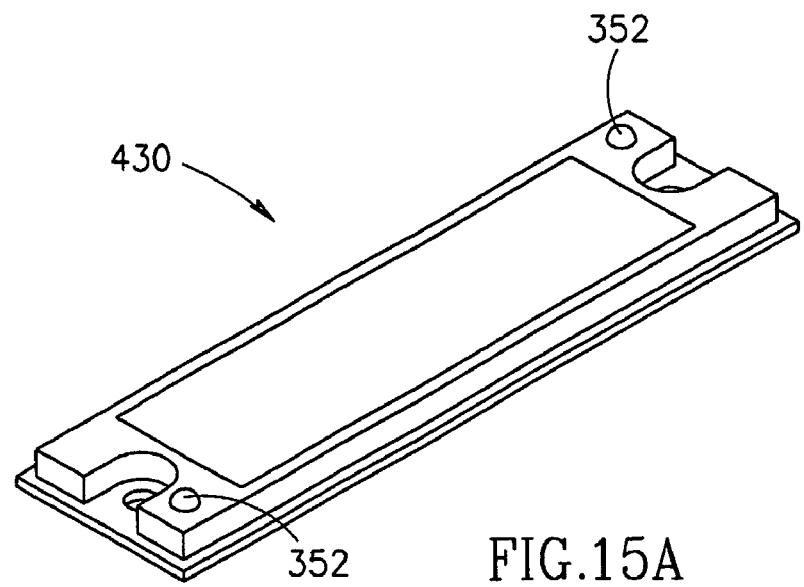
FIGS. 15A and 15B schematically show star motors having two and four driving arms respectively, in accordance with embodiments of the present invention.
Figure 15B:
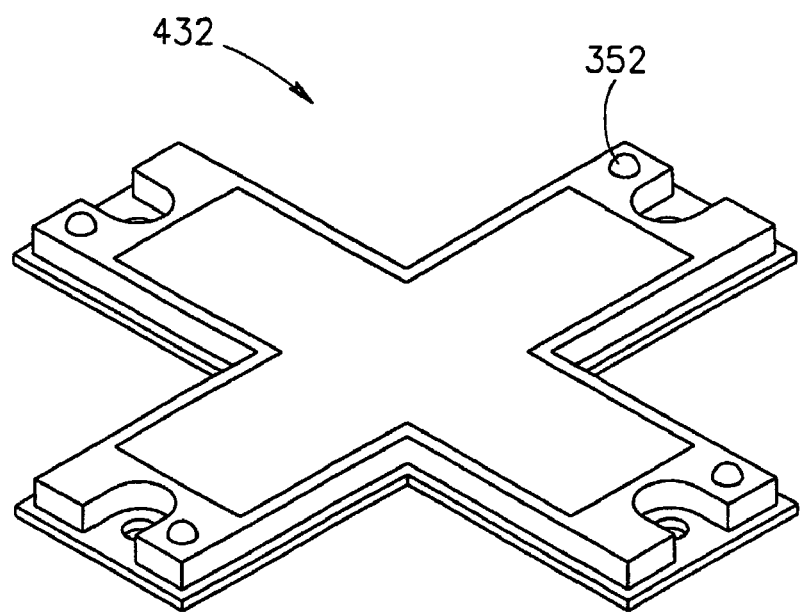
Figure 16:
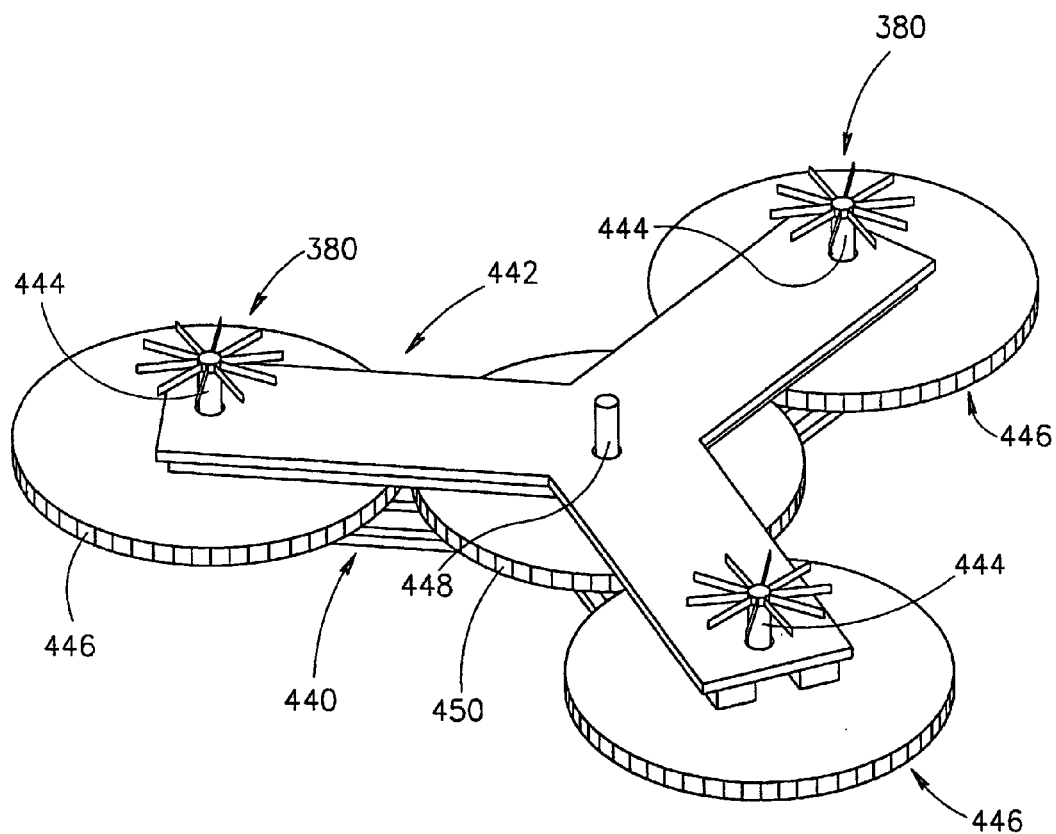
FIG. 16 schematically shows a star motor comprising three driving arms rotating four rotary blade heads, in accordance with an embodiment of the present invention.

FIG. 14C schematically shows another star motor 560, in accordance with an embodiment of the present invention. Star motor 560 is similar to star motor 400 except that instead of a single rectangular electrode 402 on a region of face surface 330 of each driving arm 322, each driving arm has four quadrant electrodes 561, 562, 563 and 564. All even numbered electrodes 562 and 564 are connected together and all odd numbered electrodes 561 and 563 are connected together. When even numbered electrodes 562 and 564 are grounded or floating and odd numbered electrodes 561 and 563 are electrified with an appropriate AC excitation voltage, friction nubs 352 vibrate with elliptical motions indicated by ellipses 404. Friction nubs 352 "move around" their respective ellipses 404 in directions indicated by arrows 406. As a result, when odd numbered electrodes 562 and 564 are excited by the AC excitation voltage, shafts (not shown) coupled to driving arms 322 by appropriate coupling discs are rotated clockwise (as in FIG. 14B). When odd numbered electrodes 561 and 563 are grounded or floating, and even numbered electrodes 562 and 564 are excited by the AC voltage, friction nubs 352 execute vibratory motion indicated by the same ellipses 404. However, in this case the friction nubs move around their respective ellipses in directions opposite to directions indicated by arrows 406. As a result, when odd numbered electrodes 561 and 563 are excited, shafts driven by star motor 560 are rotated counterclockwise by the star motor. It is to be noted that whereas FIGS. 11A–14B show star piezoelectric motors having three driving arms, star motors, in accordance with embodiments of the present invention can have other than three driving arms. FIGS. 15A and 15B schematically show, by way of example, star motors 430 and 432 having respectively two and four driving arms 322. Motors 430 and 432 and variations of the motors similar to variations of motors shown in FIGS. 11A–13 are operated to rotate two and four shafts respectively similarly to the way in which the three armed motors are operated to drive three shafts. FIG. 16 schematically shows, a configuration in which two "mirror image" star motors, 440 and 442 of a type show in preceding figures, each comprising three driving arms, are used to drive three rotary shaver blade heads 380. Each of the three blade heads 380 is coupled to a shaft 444 that is mounted to coupling discs 446 which are also gears. Shafts 444 and their respective coupling discs 446 are coupled to friction nubs (not shown) of star motors 440 and 442 in a manner described above and are directly driven by vibrations in driving arms 322 of the motors. Disc-gears 446 are coupled to a common gear 450 mounted to a shaft 448 that passes through the centers of star motors 440 and 442. As a result of coupling disc-gears 446 to a same gear 450 motion of the disc-gears is synchronized and substantially a same amount of power from motors 440 and 442 is coupled to all shafts 444 and their corresponding rotary blade heads 380.

Figure 17:
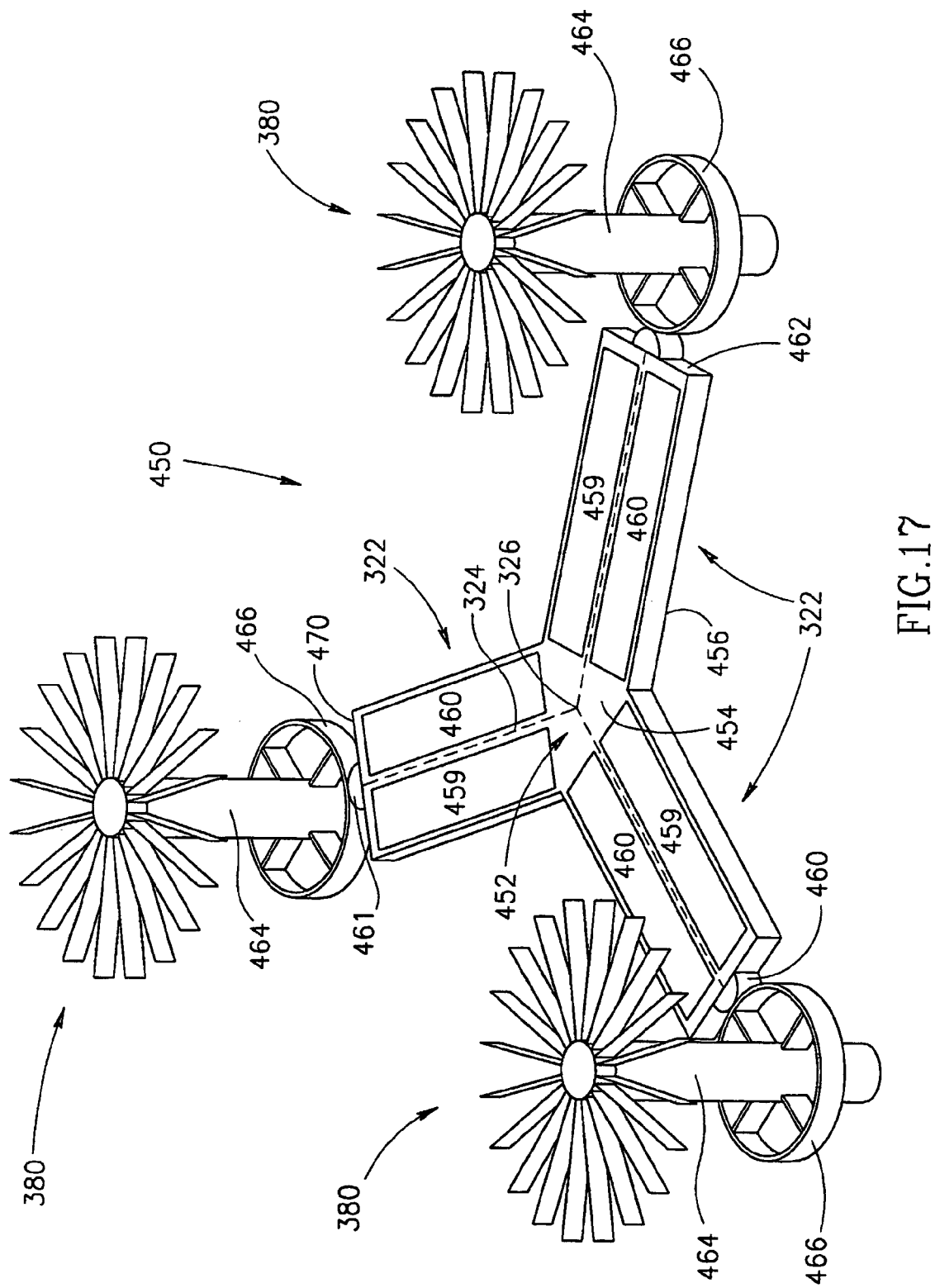
FIG. 17 schematically shows another star motor, in accordance with an embodiment of the present invention.

FIG. 17 schematically shows an example of another star motor 452, in accordance with an embodiment of the present invention, which is formed from a single relatively thin layer 452 of piezoelectric material having a top face surface 454 and a bottom face surface 456. Piezoelectric layer 452 is formed, by way of example, with three rectangular driving arms 322. In some embodiments of the present invention, two electrodes, 459 and 460, are located on a region of top face surface 454 of each driving arm 322. Electrode 459 of a driving arm 322 optimally covers substantially half of surface 454 in the region of the driving arm to the left of axis 324 of the driving arm as seen from center 326 of star motor 450. Electrode 460 covers substantially a left half of the region of surface 454 in the region of the driving arm. A single large electrode (not shown) covers substantially all the surface area of face surface 456. A friction nub 460 is located on an "end" edge surface 462 of each driving arm 458.

In some embodiments of the present invention all "right-hand" electrodes 460 are electrified simultaneously with respect to the large electrode on face surface 456 with a same AC voltage. All left-hand electrodes 459 are simultaneously electrified with respect to the large electrode with an AC voltage 180° out of phase with the AC voltage that electrifies the right hand electrodes 460. The applied voltages generate longitudinal and transverse vibration modes in each driving arm 322 that generate elliptical vibrations in friction nub 460 of the driving arm.

In some embodiments of the present invention, the elliptical vibrations are used to rotate a shaft. In FIG. 17 star motor 450 is shown coupled to three rotary blade heads 380, each of which is mounted on a shaft 464 having a coupling wheel 466. A friction nub 460 of each driving arm 322 is resiliently pressed to a coupling wheel 466 of a shaft 464 and elliptical vibrations of the friction nub rotate the coupling wheel.

It should be noted that whereas each driving arm 322 of star motor 450 has two electrodes located on its region of surface 454 other configurations of electrodes for driving arms 322 can be used. For example, in some embodiments of the present invention each driving arm 322 has an electrode configuration of four quadrant electrodes similar to that shown for piezoelectric motor 20 shown in FIG. 1A or an electrode configuration similar to that of piezoelectric motor 56 also shown in FIG. 1A.

It should also be noted that frequencies of resonant vibration modes of driving arms of star motors, in accordance with embodiments of the present invention, can be adjusted by forming holes or grooves in the piezoelectric layer of the driving arms. The use of holes and grooves to adjust resonant frequencies of piezoelectric motors is described in PCT application PCT/IL00/00116, the disclosure of which is incorporated herein by reference. The use of holes and grooves for adjusting resonant frequencies of a motor similar to motor 20 is discussed above, for example in the discussions that reference FIGS. 1A and 1C In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

What is claimed is:

1. A piezoelectric motor comprising:
   a layer of piezoelectric material having narrow edge surfaces and first and second large face surfaces, formed with at least three arms, each extending radially outward from a common central region and terminating in an end;
   at least one electrode on the first surface and at least one electrode on the second face surface; and
   an AC voltage source connected to the at least one electrode on the first surface and at least one electrode on the second surface that electrifies the electrodes and generates thereby vibratory motion in mass points in a neighborhood of the end of each arm that has at least a component of vibration perpendicular to the plane of the arm.

2. A piezoelectric motor according to claim 1 wherein each arm has a bilateral axis of symmetry that extends from the central region.

3. A piezoelectric motor according to claim 2 wherein each of the arms of the piezoelectric layer is substantially rectangular.

4. A piezoelectric motor according to claim 2 wherein each of the arms is substantially trapezoidal with its width decreasing with distance from the central region.

5. A piezoelectric motor according to claim 3 wherein the thickness of each piezoelectric arm decreases with distance from the central region.

6. A piezoelectric motor according to claim 3 wherein junctions of an arm with the central region are curved.

7. A piezoelectric motor according to claim 1 and comprising a mass element affixed to each arm on the first surface at a distance from the central region and wherein when longitudinal vibrations are excited in the arm the mass generates a torque that excites bending vibrations in the arm.

8. A piezoelectric motor according to claim 2 and comprising a thin plate having two large face surfaces and at least three arms, said plate being substantially similar in shape to the piezoelectric layer, wherein the first face surface of the piezoelectric layer is aligned with and bonded to one of the face surfaces of the plate.

9. A piezoelectric motor according to claim 8 wherein the thin plate is formed from a non-piezoelectric material.

10. A piezoelectric motor according to claim 9 wherein the material is non-conductive.

11. A piezoelectric motor according to claim 10 wherein the at least one electrode on the first face surface of the piezoelectric layer comprises a single large electrode covering substantially the entire first surface.

12. A piezoelectric motor according to claim 9 wherein the material is a conductor.

13. A piezoelectric motor according to claim 8 and comprising a mass element affixed to each arm on the first surface at a distance from the central region and wherein when longitudinal vibrations are excited in the arm the mass generates a torque that excites bending vibrations in the arm.

14. A piezoelectric motor according to claim 7 wherein the at least one electrode on the second face surface of the piezoelectric layer comprises a single large electrode covering substantially the entire second surface.

15. A piezoelectric motor according to claim 8 wherein the at least one electrode on the second face surface comprises a single electrode on each arm that covers substantially all the area of the second surface on one side of the arm's axis of symmetry and substantially none of the area on the other side.

16. A piezoelectric motor according to claim 15 wherein the single electrode on any one arm is homologous with the single electrode on any of the other arms.

17. A piezoelectric motor according to claim 16 wherein the electrodes on the second face surface are electrically connected.

18. A piezoelectric motor according to claim 8 wherein the at least one electrode on the second face surface comprises first and second separate electrodes on each arm that are located on opposite sides of the arm's bilateral axis of symmetry and together cover substantially all the area of the second surface in the region of the sum.

19. A piezoelectric motor according to claim 18 wherein the first and second electrodes on any one arm are homologous respectively with the first and second electrodes on any of the other arms and all the first electrodes are connected to form a first set of electrodes and all the second electrodes are connected to form a second set of electrodes.

20. A piezoelectric motor according to claim 19 wherein the source of voltage electrifies the first and second electrodes with respect to at least one electrode on the first surface with first and second AC voltages respectively that are 180° out of phase so that mass points near opposite corners of the end of each arm execute same sense elliptical vibratory motion as seen from a point on the bilateral axis of symmetry of the arm.

21. A piezoelectric motor according to claim 8 wherein the at least one electrode on the second face surface of the piezoelectric layer comprises four electrodes one each arm that are arranged in a checkerboard pattern with each electrode located in a different quadrant of the second surface in the region of the arm.

22. A piezoelectric motor according to claim 21 wherein diagonally opposite electrodes on each arm are electrically connected to form a first and second pair of diagonally connected electrodes on each arm and wherein first and second pairs of diagonal electrodes on each arm are homologous respectively with the first and second diagonal pairs of electrodes on any of the other arms of the motor.

23. A piezoelectric motor according to claim 22 wherein all the first diagonal pairs of electrodes are electrically connected to form a first set of diagonal electrodes and all the second pairs of diagonal electrodes are electrically connected to form a second set of diagonal electrodes.

24. A piezoelectric motor according to claim 23 wherein the AC electrifies the first set of diagonal electrodes with resect to the at least one electrode on the first surface while the second set of diagonal electrodes is grounded or floating, so that mass points in opposite corners of the end of each arm execute clockwise elliptical vibratory motion perpendicular to the plane of the motor as seen from a point on the bilateral axis of symmetry of the arm.

25. A piezoelectric motor according to claim 23 wherein the AC voltage source electrifies the second set of diagonal electrodes with respect to the at least one electrode on the first surface while the first set of diagonal electrodes is grounded or floating, so that mass points in opposite corners of the end of each arm execute counterclockwise elliptical vibratory motion perpendicular to the plane of the motor as seen from a point on the bilateral axis of symmetry of the arm.

26. A piezoelectric motor according to claim 14 wherein the at least one electrode on the first face surface comprises a single large electrode covering substantially the entire first face surface.

27. A piezoelectric motor according to claim 2 wherein the at least one electrode on the first surface is a first electrode covering substantially all the area of the first surface and the at least one electrode on the second surface is a second electrode covering substantially all the area of the second surface and comprising:
  an additional layer of piezoelectric material having first and second large face surfaces having a shape substantially the same as the shape of the first surface of the piezoelectric layer located between the first and second electrodes and wherein the first surface of the additional layer is bonded to the first surface of the piezoelectric layer located between the first and second electrodes; and
  a third electrode covering substantially all of the second surface of the additional layer.

28. A piezoelectric motor according to claim 27 wherein the additional layer is a mirror image of the piezoelectric layer.

29. A piezoelectric motor according to claim 28 wherein the source of AC voltage connected to the first, second and third electrodes electrifies the first and third electrodes with respect to the second electrode with AC voltages having a same frequency and phase but different amplitudes.

30. A piezoelectric motor according to claim 27 wherein the piezoelectric layer between the first and second electrodes and the additional layer have different thicknesses.

31. A piezoelectric motor according to claim 30 wherein the source of AC voltage electrifies first and third electrodes with respect to the second electrode with a same AC voltage.

32. A piezoelectric motor according to claim 1 and comprising a friction nub located on the edge surface of the end of each piezoelectric arm.

33. A piezoelectric motor according to claim 2 and comprising a friction nub located on the second surface of the piezoelectric layer near a corner of the end of each piezoelectric arm.

34. A piezoelectric motor according to claim 8 and comprising on the surface of the thin plate that is not bonded to the piezoelectric layer a friction nub located near a corner of the end of each arm of the plate.

35. A piezoelectric motor according to claim 2 and comprising an extension for each arm formed from a non-piezoelectric material that is bonded to the end of the arm, which extension comprises a friction nub located on a surface of the extension that is parallel to the plane of the arm and displaced from the bilateral axis of symmetry.

36. A piezoelectric motor according to claim 2 and comprising two substantially identical friction nubs located on the second surface in opposite corners of the end of each piezoelectric arm and wherein a straight line connecting the friction nubs is substantially perpendicular to the bilateral axis of symmetry of the arm.

37. A piezoelectric motor according to claim 8 and comprising, on the surface of the plate not bonded to the piezoelectric layer, two substantially identical friction nubs located near corners of the end of each arm of the plate and wherein a straight line connecting the friction nubs is substantially perpendicular to the bilateral axis of symmetry of the arm.

38. A piezoelectric motor according to claim 8 and comprising an extension for each arm formed from a non-piezoelectric material that is bonded to the end of the arm, which extension comprises a friction nub on each side of the bilateral axis of symmetry of the arm and wherein a straight line connecting the friction nubs is substantially perpendicular to the bilateral axis of symmetry.

39. A piezoelectric motor according to claim 33 and comprising a disc, having an axis of rotation perpendicular to surfaces thereof, mounted to the friction nub of each arm, wherein the axis of rotation is perpendicular to the plane of the arm and the friction nub contacts a disc surface at a point on the disc surface for which a line from the point perpendicular to the axis of rotation is substantially perpendicular to the bilateral axis of the arm.

40. A piezoelectric motor according to claim 39 wherein the axis of rotation intersects the bilateral axis of the symmetry of the arm.

41. A piezoelectric motor according to claim 36 and comprising a disc, having an axis of rotation perpendicular to surfaces thereof, for each arm, wherein a surface of the disc is resiliently pressed to both friction nubs of the arm and the disc's axis of rotation is perpendicular to and passes through the arm's bilateral axis of symmetry and the line connecting the friction nubs.

42. A motor according to claim 1 wherein the piezoelectric motor has a rotational symmetry of order equal to the number of arms in the motor.

43. A compound piezoelectric motor comprising:
first and second mirror image piezoelectric motors according to claim 33 having the axes of symmetry of their respective arms parallel and friction nubs facing each other;
a disc, having an axis of rotation perpendicular to surfaces thereof positioned between each arm of the first piezoelectric motor and its mirror image arm in the second piezoelectric motor, wherein the disc's axis of rotation is perpendicular to the bilateral axes of symmetry of the mirror image arms and each of the friction nubs of the arms is in contact with one of the disc surfaces; and
at least one elastic element that resiliently presses the first and second piezoelectric motors towards each other so that each of the friction nubs of the motors is resiliently pressed to the disc surface that it contacts.

44. A compound piezoelectric motor according to claim 39 wherein the disc surface is formed with a thin circular ridge having a center located on the axis of revolution of the disc and wherein the friction nub contacts the surface contacts the ridge.

45. A piezoelectric motor according to claim 39 wherein the discs are formed as gears and the motor comprises a gear mounted to the central region of the motor which meshes with all the discs.

46. A piezoelectric motor according to claim 39 wherein each of the discs is formed with an edge surface and the motor comprises an additional disc having an edge surface which is mounted to the central region of the motor so that the edge surface of the additional disc is in frictional contact with the edge surface of each of the other discs.

47. A piezoelectric motor according to claim 39 wherein each disc is mounted with a shaft having an axis of rotation coincident with the disc's axis of rotation.

48. A piezoelectric motor according to claim 39 wherein the discs are mounted integrally to the body of the motor.

49. A shaver comprising a motor according to claim 48 wherein each shaft is mounted with a blade head having an axis of rotation coincident with the axis of the shaft and at least one cutting blade having a cutting edge for cutting hair that extends substantially radially away from the blade head's axis of rotation.

50. A compound piezoelectric motor comprising:
first and second mirror image piezoelectric motors according to claim 36 having the axes of symmetry of their respective arms parallel and friction nubs facing each other;
a disc, having an axis of rotation perpendicular to surfaces thereof positioned between each arm of the first piezoelectric motor and its mirror image arm in the second piezoelectric motor, wherein the disc's axis of rotation is perpendicular to the bilateral axes of symmetry of the mirror image arms and each of the friction nubs of the arms is in contact with one of the disc surfaces; and
at least one elastic element that resiliently presses the first and second piezoelectric motors towards each other so that each of the friction nubs of the motors is resiliently pressed to the disc surface that it contacts.

51. A compound piezoelectric motor according to claim 50 wherein each disc surface is formed with a thin circular ridge having a center located on the axis of revolution of the disc and wherein each of the friction nubs of the piezoelectric motor that contacts the surface contacts the ridge.

* * * * *